US009853029B2

(12) United States Patent
You et al.

(10) Patent No.: US 9,853,029 B2
(45) Date of Patent: Dec. 26, 2017

(54) INTEGRATED CIRCUIT DEVICE AND METHOD OF MANUFACTURING THE SAME

(71) Applicants: Jung-gun You, Ansan-si (KR); Gi-gwan Park, Suwon-si (KR)

(72) Inventors: Jung-gun You, Ansan-si (KR); Gi-gwan Park, Suwon-si (KR)

(73) Assignee: Samsung Electronics Co., ltd. (KR)

( * ) Notice: Subject to any disclaimer, the term of this patent is extended or adjusted under 35 U.S.C. 154(b) by 0 days.

(21) Appl. No.: 15/058,696

(22) Filed: Mar. 2, 2016

(65) Prior Publication Data

US 2016/0379982 A1 Dec. 29, 2016

(30) Foreign Application Priority Data

Jun. 23, 2015 (KR) ........................ 10-2015-0089094

(51) Int. Cl.
| | | |
|---|---|---|
| H01L 21/70 | (2006.01) | |
| H01L 27/092 | (2006.01) | |
| H01L 29/06 | (2006.01) | |
| H01L 29/417 | (2006.01) | |
| H01L 21/8238 | (2006.01) | |
| H01L 21/84 | (2006.01) | |
| H01L 29/66 | (2006.01) | |
| H01L 21/28 | (2006.01) | |
| H01L 27/12 | (2006.01) | |

(52) U.S. Cl.
CPC .. *H01L 27/0924* (2013.01); *H01L 21/823807* (2013.01); *H01L 21/823821* (2013.01); *H01L 29/0657* (2013.01); *H01L 29/41791* (2013.01); *H01L 21/28008* (2013.01); *H01L 21/845* (2013.01); *H01L 27/1211* (2013.01); *H01L 29/66795* (2013.01)

(58) Field of Classification Search
CPC ........... H01L 29/0657; H01L 29/41791; H01L 21/823821; H01L 21/823807; H01L 27/0924; H01L 21/845; H01L 27/1211; H01L 29/66795; H01L 21/823431; H01L 21/28008
USPC ........ 257/368, 369, 400, 401, 412, E21.703; 438/526, 703
See application file for complete search history.

(56) References Cited

U.S. PATENT DOCUMENTS

| | | |
|---|---|---|
| 7,388,259 B2 | 6/2008 | Doris et al. |
| 7,719,043 B2 | 5/2010 | Yamagami et al. |
| 8,053,292 B2 | 11/2011 | Kaneko et al. |
| 8,617,996 B1 | 12/2013 | Chi et al. |
| 8,629,039 B2 | 1/2014 | Rachmady et al. |
| 8,860,148 B2 | 10/2014 | Hu et al. |

(Continued)

*Primary Examiner* — Thinh T Nguyen
(74) *Attorney, Agent, or Firm* — Myers Bigel, P.A.

(57) ABSTRACT

An integrated circuit (IC) device includes a first-fin-type active region, a second-fin-type active region, and an inter-region stepped portion. The first-fin-type active region protrudes from a substrate in a first region of the substrate and has a first width in a first direction. The second-fin-type active region protrudes from the substrate in a second region of the substrate and has a second width in the first direction. The second width is less than the first width. The inter-region stepped portion is formed at an interface between the first region and the second region on a bottom surface, which is a portion of the substrate between the first-fin-type active region and the second-fin-type active region.

19 Claims, 52 Drawing Sheets

(56) References Cited

U.S. PATENT DOCUMENTS

| | | |
|---|---|---|
| 8,866,206 B2 | 10/2014 | Sudo |
| 8,946,038 B2 | 2/2015 | Hu et al. |
| 8,987,100 B2 | 3/2015 | Oh et al. |
| 8,987,836 B2 | 3/2015 | Kim et al. |
| 2011/0068407 A1 | 3/2011 | Yeh et al. |
| 2011/0147848 A1 | 6/2011 | Kuhn et al. |
| 2013/0062672 A1* | 3/2013 | Zhu .................... H01L 27/1211 257/288 |
| 2013/0175611 A1 | 7/2013 | Shinohara et al. |
| 2013/0244392 A1* | 9/2013 | Oh .................... H01L 29/66477 438/299 |
| 2013/0270652 A1 | 10/2013 | Liaw |
| 2015/0041899 A1 | 2/2015 | Yang et al. |
| 2015/0069474 A1 | 3/2015 | Ching et al. |
| 2015/0069528 A1 | 3/2015 | Chiang et al. |
| 2015/0076558 A1 | 3/2015 | Lee et al. |
| 2015/0102385 A1 | 4/2015 | Fung |
| 2015/0102386 A1 | 4/2015 | Chen et al. |
| 2015/0102411 A1 | 4/2015 | Ching et al. |
| 2015/0108581 A1 | 4/2015 | Chen et al. |
| 2015/0108582 A1 | 4/2015 | Chen et al. |
| 2015/0120980 A1* | 4/2015 | Kim .................... G06F 1/1632 710/303 |
| 2015/0129980 A1* | 5/2015 | Wang ................ H01L 29/66795 257/401 |

\* cited by examiner

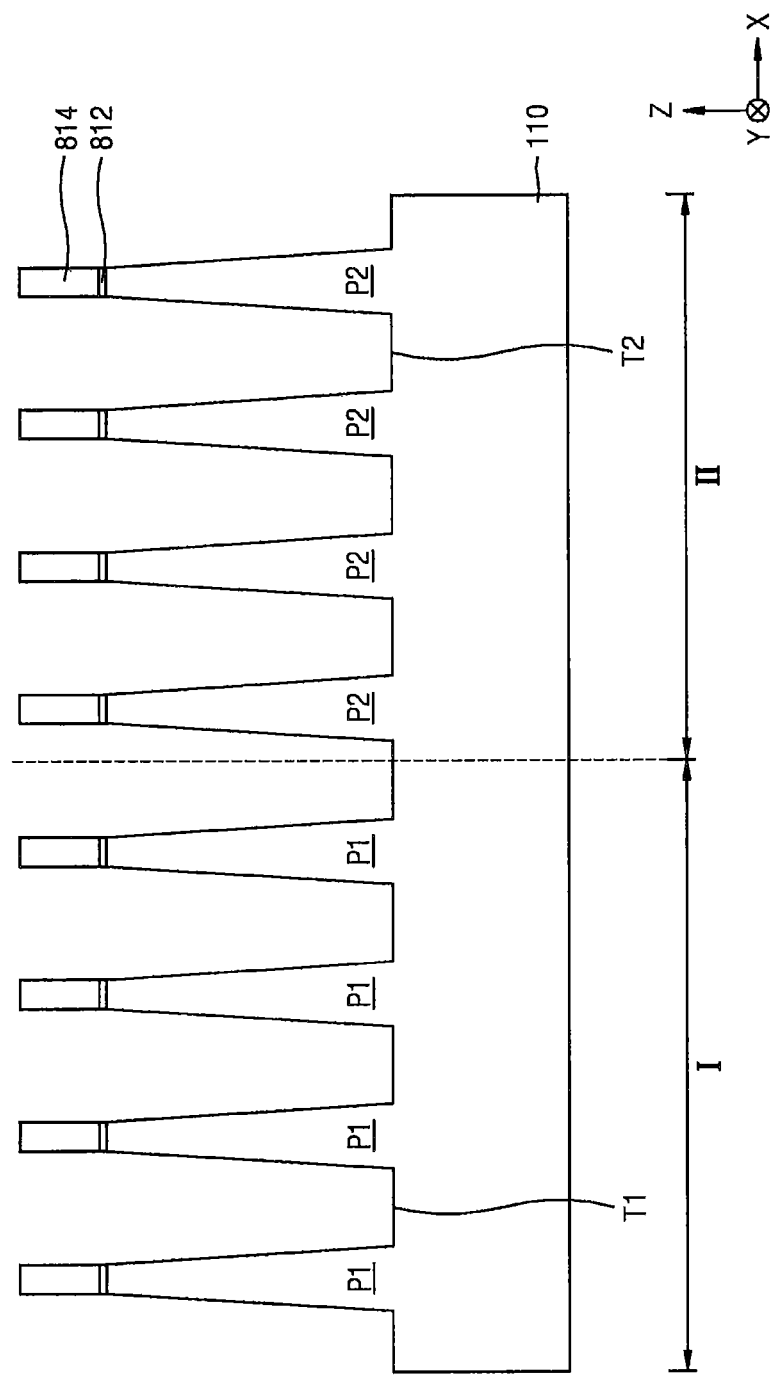

INTEGRATED CIRCUIT DEVICE AND METHOD OF MANUFACTURING THE SAME

CROSS-REFERENCE TO RELATED APPLICATION

This application claims the benefit of Korean Patent Application No. 10-2015-0089094, filed on Jun. 23, 2015, in the Korean Intellectual Property Office, the disclosure of which is incorporated herein in its entirety by reference.

BACKGROUND

The inventive concepts relates to an integrated circuit (IC) device and methods of manufacturing the same, and more particularly, to IC devices including fin effect field transistors (FinFETs) and methods of manufacturing the same.

The development of electronic technology has led to rapid downscaling of semiconductor devices. In recent years, since semiconductor devices may require not only rapid operating speed but also accuracy of operations, research has been conducted into improving or optimizing the structures of transistors included in semiconductor devices.

SUMMARY

The inventive concepts provide an integrated circuit (IC) device capable of independently improving the performance of transistors according to a conductivity type of a channel region in transistors in which channel regions have different conductivity types.

Also, the inventive concepts provide a method of manufacturing an IC device, which may independently improve the performance of transistors according to a conductivity type of a channel region in transistors in which channel regions have different conductivity types.

According to some embodiments of the inventive concepts, an integrated circuit device includes first and second fin-type active regions protruding from adjacent first and second surfaces of a substrate, respectively. The first and second fin-type active regions differ in width. The first and second surfaces of the substrate are non-coplanar and define an inter-region stepped portion in the substrate at an interface between the first surface and the second surface.

In some embodiments, the inter-region stepped portion in the substrate may extend between the first and second fin-type active regions, and the second fin-type active region may be closer to the inter-region stepped portion than the first fin-type active region.

In some embodiments, the first and second fin-type active regions may have different conductivity types and/or may include different materials.

In some embodiments, first and second device isolation layers may be provided on the first and second surfaces of the substrate, respectively. An interface between the first and second device isolation layers may be aligned with the inter-region stepped portion in the substrate to define a shallow trench isolation (STI) region between the first and second fin-type active regions.

In some embodiments, the first device isolation layer may include a first stressor liner on the first fin-type active region that imparts a tensile stress thereon, and the second device isolation layer may include a second stressor liner on the second-fin type active region that imparts a compressive stress thereon. An interface between the first and second stressor liners may be aligned with the inter-region stepped portion in the substrate.

In some embodiments, the first and second fin-type active regions may extend parallel to the inter-region stepped portion. A first gate line structure may extend on the first fin-type active region, and a second gate line structure different from the first gate line structure may extend on the second fin-type active region. An interface between the first and second gate line structures may be aligned with the inter-region stepped portion of the substrate.

In some embodiments, the first and second fin-type active regions may be aligned and may extend perpendicular to the inter-region stepped portion. A first gate line structure may extend on the first fin-type active region parallel to the inter-region stepped portion, and a second gate line structure different from the first gate line structure may extend on the second fin-type active region parallel to the inter-region stepped portion. The inter-region stepped portion may extend between the first and second gate line structures.

In some embodiments, a fin isolation region may extend on the first and second surfaces of the substrate across the inter-region stepped portion and intersecting the first and second fin-type active regions.

In some embodiments, a dummy gate line structure may extend in the fin isolation region.

In some embodiments, a plurality of the first fin-type active regions may protrude from and extend in parallel along the first surface of the substrate, and a plurality of the second fin-type active regions may protrude from and extend in parallel along the second surface of the substrate.

According to an aspect of the inventive concepts, there is provided an IC device including a first-fin-type active region protruding from a substrate in a first region of the substrate. The first-fin-type active region has a first width in a first direction. A second-fin-type active region protrudes from the substrate in a second region of the substrate. The second-fin-type active region has a second width in the first direction. The second width is less than the first width. An inter-region stepped portion is formed at an interfacial portion (or "interface") between the first region and the second region on a bottom surface, which is a portion of the substrate between the first-fin-type active region and the second-fin-type active region.

The first-fin-type active region may have a channel region of a different conductivity type from a channel region of the second-fin-type active region.

The first region may include an NMOS transistor region, and the second region may include a PMOS transistor region.

The inter-region stepped portion, the first-fin-type active region, and the second-fin-type active region may extend parallel to one another.

The bottom surface may include a first bottom unit disposed at a first level in the first region on the substrate and a second bottom unit disposed at a second level in the second region on the substrate. The second level is different from the first level. The inter-region stepped portion may extend along an interfacial portion between the first bottom unit and the second bottom unit.

A first distance from the inter-region stepped portion to the first-fin-type active region in the first direction may be different from a second distance from the inter-region stepped portion to the second-fin-type active region in the first direction.

The first region may include an NMOS transistor region, and the second region may include a PMOS transistor region. A first distance from the inter-region stepped portion to the first-fin-type active region in the first direction may be greater than a second distance from the inter-region stepped portion to the second-fin-type active region.

A lowest portion of the second-fin-type active region may be located at a lower level than a lowest portion of the first-fin-type active region on the substrate.

A second tip portion of the second-fin-type active region, which is farthest from the substrate, may be at a same level as or a lower level than a first tip portion of the first-fin-type active region, which is farthest from the substrate.

Each of the first-fin-type active region and the second-fin-type active region may protrude from the substrate in a third direction. A height of the first-fin-type active region may be greater than a height of the second-fin-type active region in the third direction.

The first-fin-type active region may include a first insertion layer including a different material from a material forming the remaining portion of the first-fin-type active region. The second-fin-type active region may include a second insertion layer including a different material from a material forming the remaining portion of the second-fin-type active region. In some embodiments, the first insertion layer of the first-fin-type active region may include germanium (Ge), and the remaining portion of the first-fin-type active region except for the first insertion layer may include silicon (Si). The second insertion layer of the second-fin-type active region may include germanium, and the remaining portion of the second-fin-type active region excepting the second insertion layer may include silicon.

The IC device may further include a device isolation layer filling a space between the first-fin-type active region and the second-fin-type active region. The device isolation layer may include a first stressor liner covering a first sidewall of the first-fin-type active region and applying first stress to the first-fin-type active region, and a second stressor liner covering a second sidewall of the second-fin-type active region, the second sidewall facing the first sidewall of the first-fin-type active region, and applying second stress to the second-fin-type active region, wherein the second stress is different from the first stress. The first region may include an NMOS transistor region, and the second region may include a PMOS transistor region. The first stress may be tensile stress, and the second stress may be compressive stress. Each of the first-fin-type active region and the second-fin-type active region may protrude from the substrate in a third direction. An interfacial portion between the first stressor liner and the second stressor liner may be aligned with the inter-region stepped portion in the third direction.

The IC device may further include a gate line extending on the first-fin-type active region and the second-fin-type active region in a direction that intersects an extension direction of the first-fin-type active region and the second-fin-type active region. The gate line includes a first gate line covering the first-fin-type active region in the first region and having a first conductive layer stack structure, and a second gate line covering the second-fin-type active region in the second region and having a second conductive layer stack structure. The first conductive layer stack structure may be different from the second conductive layer stack structure. Each of the first-fin-type active region and the second-fin-type active region may protrude from the substrate in a third direction. An interfacial portion between the first gate line and the second gate line may be aligned with the inter-region stepped portion in the third direction.

The IC device may further include a device isolation layer including a first stressor liner and a second stressor liner. The first stressor liner may extend on or cover a first sidewall of the first-fin-type active region and apply first stress to the first-fin-type active region. The second stressor liner may extend on or cover a second sidewall of the second-fin-type active region, which faces the first sidewall of the first-fin-type active region, and apply second stress to the second-fin-type active region. The second stress may be different from the first stress. The inter-region stepped portion, an interfacial portion between the first stressor liner and the second stressor liner, and an interfacial portion between the first gate line and the second gate line may be arranged in a straight line.

According to another aspect of the inventive concepts, there is provided an IC device including a substrate having a first region and a second region adjacent to each other. A plurality of first-fin-type active regions protrude from the substrate in the first region and extend parallel to one another. A plurality of second-fin-type active regions protrude from the substrate in the second region and extend parallel to one another. Each of the second-fin-type active regions has a smaller width than a width of any one of the plurality of first-fin-type active regions in a first direction. An inter-region isolation region has an inter-region stepped portion formed at an interfacial portion between the first region and the second region in a bottom surface of the substrate that is between the plurality of first-fin-type active regions and the plurality of second-fin-type active regions.

The plurality of first-fin-type active regions and the plurality of second-fin-type active regions may extend parallel to one another such that the inter-region stepped portion is between the plurality of first-fin-type active regions and the plurality of second-fin-type active regions. The plurality of first-fin-type active regions and the plurality of second-fin-type active regions may be disposed at a uniform pitch in the first direction.

The plurality of first-fin-type active regions and the plurality of second-fin-type active regions may extend parallel to one another such that the inter-region stepped portion is between the plurality of first-fin-type active regions and the plurality of second-fin-type active regions. A width of the inter-region isolation region may be greater than a first space between the plurality of first-fin-type active regions and greater than a second space between the plurality of second-fin-type active regions in the first direction.

A first distance from the inter-region stepped portion to the plurality of first-fin-type active regions may be greater than a second distance from the inter-region stepped portion to the plurality of second-fin-type active regions.

The bottom surface may include a first bottom unit disposed at a first level in the first region of the substrate and a second bottom unit disposed at a second level in the second region of the substrate. The second level may be different from the first level. The plurality of first-fin-type active regions may protrude from the first bottom unit by as much a first height. The plurality of second-fin-type active regions may protrude from the second bottom unit by as much as a second height. The second height may be greater than the first height.

The IC device may further include a first device isolation layer covering both sidewalls of each of the plurality of first-fin-type active regions in the first region, and a second device isolation layer covering both sidewalls of each of the plurality of second-fin-type active regions in the second region. An interfacial portion between the first device isolation layer and the second device isolation layer may vertically overlap the inter-region stepped portion. A deep trench may be formed in the first region of the substrate and spaced apart from the inter-region stepped portion such that the plurality of first-fin-type active regions are between the deep trench and the inter-region stepped portion. The deep trench may have a first bottom surface extending at a first level that is lower than a bottom surface of the first device isolation layer. A bottom surface of the second device isolation layer may have a second bottom surface extending at a second level, which is equal to or lower than the first level, in the second region.

The IC device may further include a normal gate line extending in a direction that intersects an extension direction of the plurality of first-fin-type active regions and the plurality of second-fin-type active regions on the plurality of first-fin-type active regions and the plurality of second-fin-type active regions. The normal gate line includes a first gate line covering the plurality of first-fin-type active regions in the first region and having a first conductive layer stack structure, and a second gate line covering the plurality of second-fin-type active regions in the second region and having a second conductive layer stack structure that is different from the first conductive layer stack structure. An interfacial portion between the first gate line and the second gate line may vertically overlap the inter-region stepped portion.

The IC device may further include a fin isolation insulating layer having a sidewall that faces one end of each of the plurality of first-fin-type active regions and the plurality of second-fin-type active regions. The fin isolation insulating layer extends parallel to the normal gate line in the first region and the second region. The fin isolation insulating layer covers the inter-region stepped portion.

The IC device may further include a fin isolation insulating layer having a sidewall that faces one end of each of the plurality of first-fin-type active regions and the plurality of second-fin-type active regions, and a dummy gate line extending parallel to the normal gate line on the fin isolation insulating layer. The fin isolation insulating layer and the dummy gate line may extend on or cover the inter-region stepped portion.

The IC device of may further include first source and drain regions formed in at least one of the plurality of first-fin-type active regions, second source and drain regions formed in at least one of the plurality of second-fin-type active regions, a contact plug extending to be connected to the first source and drain regions and the second source and drain regions. The contact plug may vertically overlap the inter-region stepped portion.

The IC device may further include an air gap formed between the substrate and the contact plug. The air gap may vertically overlap the inter-region stepped portion.

The first source and drain regions may include a first semiconductor layer having a top surface disposed at a higher level than a top surface of each of the plurality of first-fin-type active regions. The second source and drain regions may include a second semiconductor layer having a top surface disposed at a higher level than a top surface of each of the plurality of second-fin-type active regions.

According to another aspect of the inventive concepts, there is provided an IC device including a first-fin-type active region protruding from a substrate in a first region of the substrate and extending in a first direction. A second-fin-type active region protrudes from the substrate in a second region of the substrate and extends in the first direction. The second-fin-type active region is disposed in a straight line with the first-fin-type active region and has a smaller width than the first-fin-type active region. A fin isolation region includes an inter-region stepped portion formed at an interfacial portion between the first region and the second region in a bottom surface of the substrate between the first-fin-type active region and the second-fin-type active region.

The inter-region stepped portion may extend in a direction that intersects an extension direction of the first-fin-type active region and the second-fin-type active region.

A lowest portion of the first-fin-type active region may be at a higher level than a lowest portion of the second-fin-type active region on the substrate.

A first height of the first-fin-type active region may be less than a second height of the second-fin-type active region.

The IC device may further include a fin isolation insulating layer configured to fill the fin isolation region between the first-fin-type active region and the second-fin-type active region. The fin isolation insulating layer may extend parallel to the inter-region stepped portion.

According to another aspect of the inventive concepts, there is provided a method of manufacturing an IC device. The method includes forming a first preliminary fin-type active region in a first region of a substrate and forming a second preliminary fin-type active region in a second region of the substrate. A first insulating layer is formed to extend on or cover the first preliminary fin-type active region and the second preliminary fin-type active region. The first insulating layer is formed from only the second region, out of the first region and the second region. A portion of the second preliminary fin-type active region and a portion of the substrate are removed to form an inter-region stepped portion in a bottom surface of the substrate between the first preliminary fin-type active region and the second preliminary fin-type active region. Simultaneously, a second preliminary fin-type active region having a reduced width is formed. A second insulating layer is formed in the second region to extend on or cover the second preliminary fin-type active region having the reduced width. Partial upper portions of the first insulating layer and the second insulating layer are removed to expose each of the first preliminary fin-type active region and the second preliminary fin-type active region having the reduced width in the first region and the second region. A first-fin-type active region having a first-conductivity-type channel region having a first width is formed in the first region. A second-fin-type active region having a second-conductivity-type channel region having a second width is formed in the second region. The second width is smaller than the first width.

During the forming of the second preliminary fin-type active region having the reduced width, a lowest portion of the second preliminary fin-type active region having the reduced width may be formed at a lower level than a lowest portion of the first preliminary fin-type active region by as much as a first height.

During the forming of the second preliminary fin-type active region having the reduced width, a first bottom unit may be formed at a first level in the first region of the substrate around the first preliminary fin-type active region, and a second bottom unit may be formed at a second level in the second region of the substrate around the second preliminary fin-type active region having the reduced width. The second level may be lower than the first level.

BRIEF DESCRIPTION OF THE DRAWINGS

Example embodiments of the inventive concepts will be more clearly understood from the following detailed description taken in conjunction with the accompanying drawings in which:

FIGS. 16A to 16K are cross-sectional views of process operations of a method of manufacturing an IC device according to example embodiments;

DETAILED DESCRIPTION OF THE EMBODIMENTS

Figure 1A:
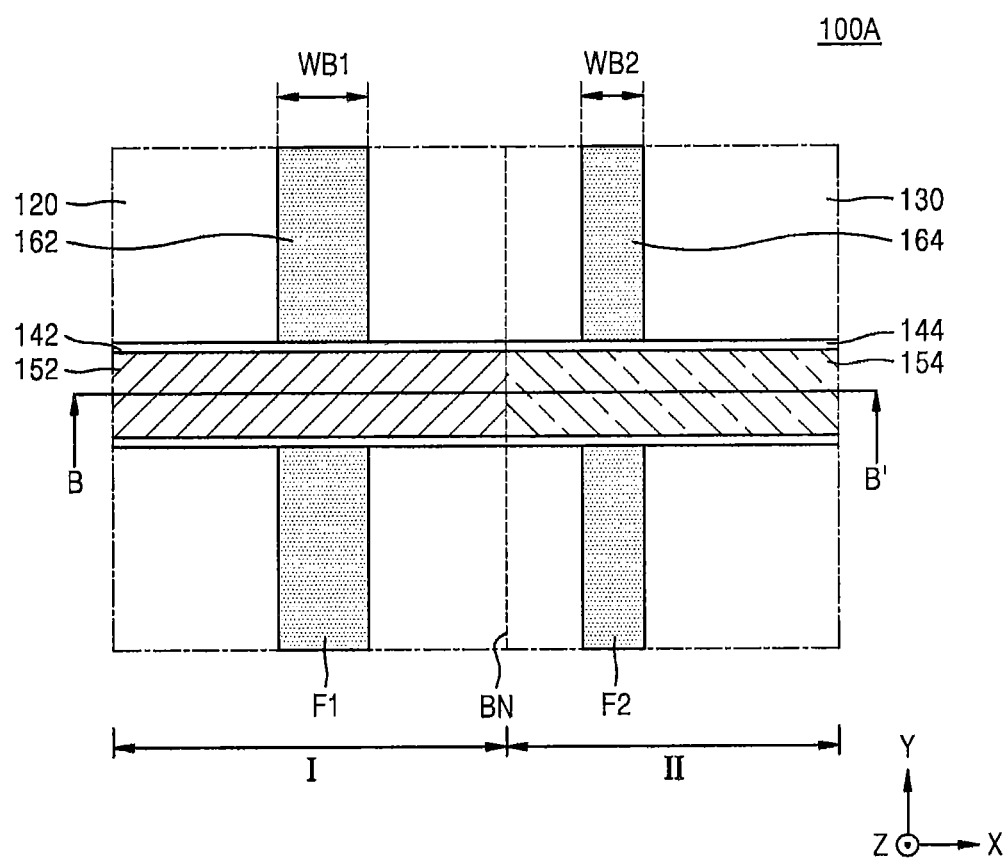
FIG. 1A is a plan layout diagram of some elements of an IC device according to example embodiments.

The inventive concepts will now be described more fully hereinafter with reference to the accompanying drawings, in which example embodiments of the inventive concepts are shown. In the drawings, the same reference numerals are used to denote the same elements, and detailed descriptions thereof are omitted. The inventive concepts may, however, be embodied in different forms and should not be construed as limited to the embodiments set forth herein. Rather, these embodiments are provided so that this disclosure is thorough and complete and fully conveys the scope of the inventive concepts to one skilled in the art.

As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

It will be understood that when an element is referred to as being "coupled," "connected," or "responsive" to another element, it can be directly coupled, connected, or responsive to the other element, or intervening elements may also be present. In contrast, when an element is referred to as being "directly coupled," "directly connected," or "directly responsive" to another element, there are no intervening elements present.

Spatially relative terms, such as "above," "below," "upper," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly. Well-known functions or constructions may not be described in detail for brevity and/or clarity.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and this specification and will not be interpreted in an idealized or overly formal sense unless explicitly so defined herein.

When some embodiments may be embodied otherwise, respective process steps described herein may be performed otherwise. For example, two process steps described in a sequential order may be performed substantially the same time or in reverse order.

Embodiments of the inventive concepts are described herein with reference to cross-section illustrations that are schematic illustrations of idealized embodiments of the inventive concepts. As such, variations from the shapes of the illustrations as a result, for example, of manufacturing techniques and/or tolerances, are to be expected. When a term "substrate" is used herein, it should be understood as either the substrate itself or both the substrate and a stack structure including a predetermined layer or film formed on the substrate. Also, when an expression "surface of the substrate" is used herein, it should be understood as either as an exposed surface of the substrate itself or an outer surface of a predetermined layer or film formed on the substrate.

Figure 1B:
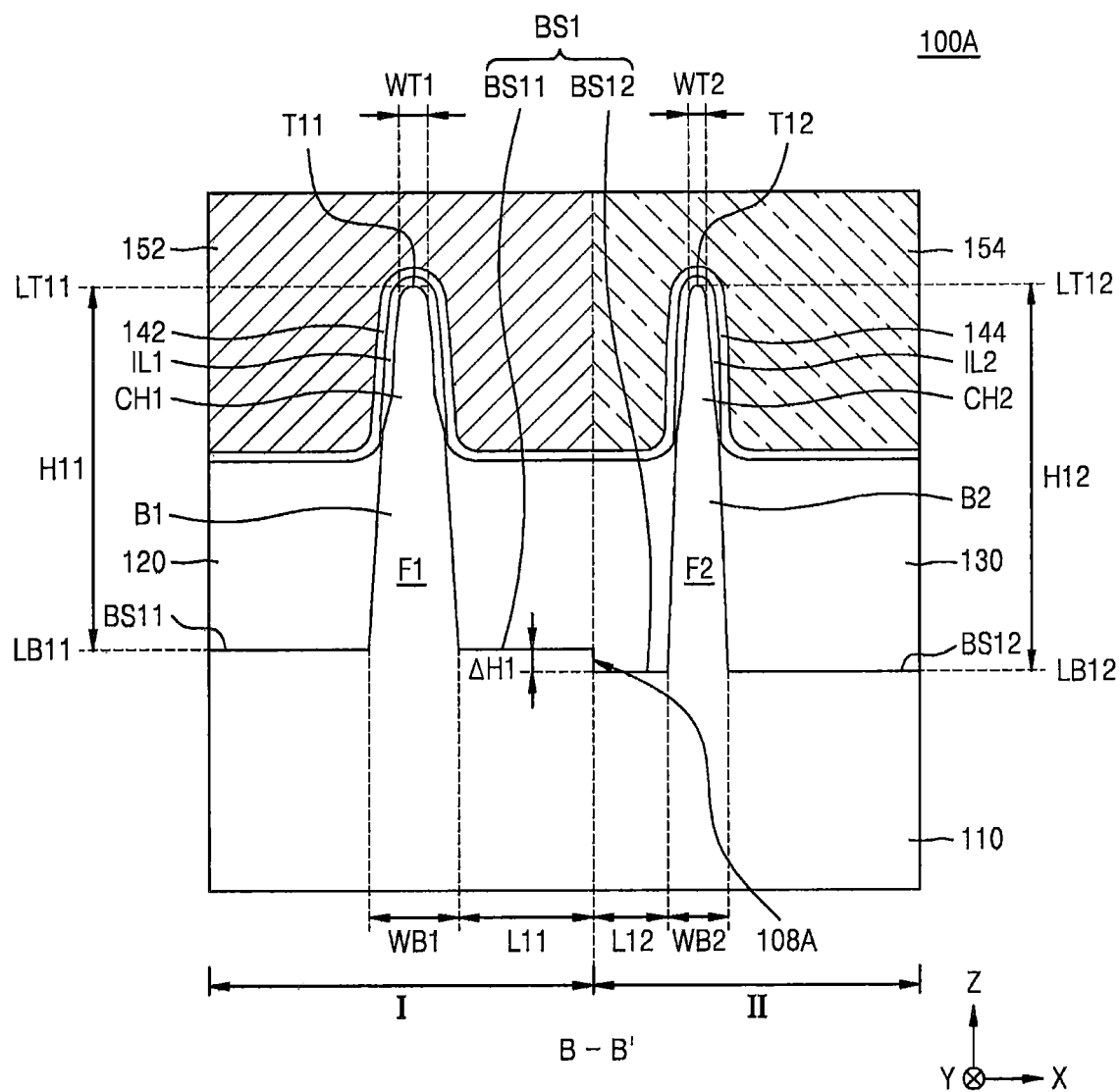
FIG. 1B is a cross-sectional view taken along a line B-B' of FIG. 1A.

FIG. 1A is a plan layout diagram of some elements of an integrated circuit (IC) device 100A according to example embodiments, and FIG. 1B is a cross-sectional view taken along a line B-B' of FIG. 1A.

Referring to FIGS. 1A and 1B, the IC device 100A may include a substrate 110 having a first region I and a second region II.

The substrate 110 may include a semiconductor (e.g., silicon (Si) or germanium (Ge)) or a compound semiconductor (e.g., silicon germanium (SiGe), silicon carbide (SiC), gallium arsenide (GaAs), indium arsenide (InAs), or indium phosphide (InP)). In some embodiments, the substrate 110 may include at least one of a Group III-V material and a Group IV material. The Group III-V material may be a binary compound, a ternary compound, or a quarternary compound including at least one Group III element and at least one Group V element. The Group material may be a compound including at least one Group III element selected out of indium (In), gallium (Ga), and aluminum (Al) and at least one Group V element selected out of arsenic (As), phosphorus (P), and antimony (Sb). For example, the Group III-V material may be selected out of InP, $In_zGa_{1-z}As$ ($0 \le z \le 1$), and $Al_zGa_{1-z}As$ ($0 \le z \le 1$). The binary compound may be, for example, any one of InP, GaAs, InAs, InSb, and GaSb. The ternary compound may be any one of InGaP, InGaAs, AlInAs, InGaSb, GaAsSb, and GaAsP. The Group IV material may be silicon or germanium. However, the Group III-V material and the Group IV element that may be applied to an IC device according to an example embodiment are not limited to the above-described examples. The Group III-V material and the Group IV material (e.g., germanium) may be used as channel materials for forming low-power high-speed transistors. A highly efficient complementary metal-oxide-semiconductor (CMOS) transistor may be formed by using a semiconductor substrate including a Group III-V material (e.g., GaAs) having a higher electron mobility than a silicon substrate and a semiconductor substrate including a semiconductor material (e.g., germanium) having a higher hole mobility than a silicon substrate. In some embodiments, when an NMOS transistor is formed on the substrate 110, the substrate 110 may include any one of Group III-V materials described above. In some other embodiments, when a PMOS transistor is formed on the substrate 110, at least a portion of the substrate 110 may include germanium. In another example, the substrate 110 may have a silicon-on-insulator (SOI) structure. The substrate 110 may include a conductive region, for example, a doped well or a doped structure.

The first region I and the second region II of the substrate 110 may refer to different regions of the substrate 110. The first region I and the second region II may be regions that require different threshold voltages. For example, the first region I may be an NMOS region, and the second region II may be a PMOS region.

In the first region I, a first-fin-type active region F1 may protrude from a first surface of the substrate 110 in a direction (Z direction) perpendicular to a main surface of the substrate 110. The first-fin-type active region F1 may have a first-conductivity-type channel region CH1. Both sidewalls of the first-fin-type active region F1 may be covered with a first device isolation layer 120 under the first-conductivity-type channel region CH1.

The first-fin-type active region F1 may linearly extend on the substrate 110 in a lengthwise direction (Y direction) and have a first base unit B1 having a first base width WB1 in a widthwise direction (X direction). The first-conductivity-type channel region CH1 of the first-fin-type active region F1, which may protrude from the first device isolation layer 120, may have a first upper width WT1 that is less than the first base width WB1.

In the second region II, a second-fin-type active region F2 may protrude from a second surface of the substrate 110 in a direction (Z direction) perpendicular to the main surface of the substrate 110. The second-fin-type active region F2 may have a second-conductivity-type channel region CH2. Both sidewalls of the second-fin-type active region F2 may be covered with a second device isolation layer 130 under the second-conductivity-type channel region CH2. The first and second surfaces of the substrate 110 in the first and second regions I and II may be non-coplanar.

The second-fin-type active region F2 may linearly extend on the substrate 110 in the lengthwise direction (Y direction) and have a second base width WB2 that is less than the first base width WB1 in the widthwise direction (X direction). The second-conductivity-type channel region CH2 of the second-fin-type active region F2, which may protrude from the second device isolation layer 130, may have a second upper width WT2 that is less than the second base width WB2 and less than the first upper width WT1.

In some embodiments, the first-conductivity-type channel region CH1 of the first-fin-type active region F1 may include a homogeneous material. For example, the entire first-fin-type active region F1 including the first-conductivity-type channel region CH1 may include silicon. In contrast, at least a portion of the second-conductivity-type channel region CH2 of the second-fin-type active region F2 may include a different material from the remaining portion of the second-conductivity-type channel region CH2. For example, a selected partial region of the second-conductivity-type channel region CH2 of the second-fin-type active region F2 may include germanium, and the remaining region of the second-fin-type active region F2 may include silicon.

FIGS. 1A and 1B illustrate an example in which one first-fin-type active region F1 is formed in the first region I and one second-fin-type active region F2 are formed in the second region II, but the inventive concepts are not limited thereto. For example, a plurality of first-fin-type active regions F1 may be formed in the first region I, and a plurality of second-fin-type active regions F2 may be formed in the second region II.

FIG. 1B illustrates an example in which both sidewalls of each of the first-fin-type active region F1 and the second-fin-type active region F2 have approximately symmetrical profiles with respect to a central line extending in a direction (Z direction) perpendicular to a main surface of the substrate 110. However, the inventive concepts are not limited thereto and the both sidewalls of each of the first-fin-type active region F1 and the second-fin-type active region F2 may have asymmetrical profiles with respect to the central line. Alternatively, the first-fin-type active region F1 and the second-fin-type active region F2 may have various shapes within the scope of the inventive concepts.

The substrate 110 of the IC device 100A may have a plurality of bottom surfaces (refer to BS1 in FIG. 1B) respectively disposed on both sides of the first-fin-type active region F1 and the second-fin-type active region F2. The plurality of bottom surfaces BS1 may extend at different levels in the first region I and the second region II. An inter-region stepped portion 108A may be formed on one of the plurality of bottom surfaces BS1, which is between the first-fin-type active region F1 and the second-fin-type active region F2.

As shown in FIG. 1B, the bottom surface BS1 may include a first bottom unit BS11, which extends at a height of a first base level LB11 in the first region I, and a second bottom unit BS12, which extends at a height of a second base level LB12 lower than the first base level LB11 in the second region II. The inter-region stepped portion 108A may be formed due to a height difference ΔH1 between the first base level LB11 and the second base level LB12.

The inter-region stepped portion 108A may extend in a lengthwise direction (Y direction) of the first-fin-type active region F1 and the second-fin-type active region F2. The inter-region stepped portion 108A may extend along an interfacial portion (also referred to herein as an "interface") BN between the first region I and the second region II, which is illustrated with a dashed line in FIG. 1A. The inter-region stepped portion 108A may extend along an interfacial portion between the first bottom unit BS11 and the second bottom unit BS12. A lowest portion of the first-fin-type active region F1, which is adjacent to the bottom surface BS1, may be located at a higher level than a lowest portion of the second-fin-type active region F2, which is adjacent to the bottom surface BS1.

A first tip portion T11 of the first-fin-type active region F1, which is farthest from the substrate 110, may be located at a first tip level LT11. A second tip portion T12 of the second-fin-type active region F2, which is farthest from the substrate 110, may be located at a second tip level LT12. In some embodiments, the first tip level LT11 may be the same level as the second tip level LT12. In some other embodiments, the second tip level LT12 may be a lower level than the first tip level LT11.

Since the second base level LB12 of the second bottom unit BS12 is lower than the first base level LB11 of the first bottom unit BS11, a height H12 of the second-fin-type active region F2 may be greater than a height H11 of the first-fin-type active region F1.

A shortest distance L11 from the inter-region stepped portion 108A to the first-fin-type active region F1 may be greater than a shortest distance L12 from the inter-region stepped portion 108A to the second-fin-type active region F2. A difference between the shortest distances L11 and L12 may be appropriately selected based on the inter-region stepped portion 108A so that the performance of transistors formed in the first region I and the second region II may be improved or optimized.

The first device isolation layer 120 may be formed on the first bottom unit BS11 of the substrate 110 in the first region I and extend on or cover both sidewalls of the first base unit B1 of the first-fin-type active region F1. The second device isolation layer 130 may be formed on the second bottom unit BS12 of the substrate 110 in the second region II and extend on or cover both sidewalls of the second base unit B2 of the second-fin-type active region F2.

The first device isolation layer 120 and the second device isolation layer 130 may include the same material or different materials. In some embodiments, each of the first device isolation layer 120 and the second device isolation layer 130 may include a silicon-containing insulating layer, such as a silicon oxide layer, a silicon nitride layer, a silicon oxynitride layer, or a silicon carbonitride layer, poly-Si, or a combination thereof.

An interfacial portion between the first device isolation layer 120 and the second device isolation layer 130 may be aligned with the inter-region stepped portion 108A in a straight line in a height direction (Z direction) of the first- and second-fin-type active regions F1 and F2.

In the first region I of the substrate 110, a first interface layer IL1, a first gate insulating layer 142, and a first gate line 152 may be formed on the first-fin-type active region F1 and the second device isolation layer 120 to extend on or cover both sidewalls and a top surface of the first-fin-type active region F1. The first gate insulating layer 142 and the first gate line 152 may extend in a direction (X direction) that intersects an extension direction (Y direction) of the first-fin-type active region F1.

In the second region II of the substrate 110, a second interface layer IL2, a second gate insulating layer 144, and a second gate line 154 may be formed on the second-fin-type active region F2 and the second device isolation layer 130 to extend on or cover both sidewalls and a top surface of the second-fin-type active region F2. The second gate insulating layer 144 may extend in the direction (X direction) that intersects the extension direction (Y direction) of the second gate line 154.

The first interface layer IL1 and the second interface layer IL2 may be obtained by oxidizing surfaces of the first-fin-type active region F1 and the second-fin-type active region F2, respectively. The first interface layer IL1 may be in contact with the first-fin-type active region F1, while the second interface layer IL2 may be in contact with the second-fin-type active region F2. The first interface layer IL1 may serve to cure interfacial defects between the first-fin-type active region F1 and the first gate insulating layer 142. The second interface layer IL2 may serve to cure interfacial defects between the second-fin-type active region F2 and the second gate insulating layer 144.

In some embodiments, each of the first interface layer IL1 and the second interface layer IL2 may include a low-k material layer having a dielectric constant of about 9 or lower, for example, a silicon oxide layer, silicon oxynitride layer, or a combination thereof. In some other embodiments, each of the first interface layer IL1 and the second interface layer IL2 may include silicate, a combination of silicate and a silicon oxide layer, or a combination of silicate and a silicon oxynitride layer. In some embodiments, each of the first interface layer IL1 and the second interface layer IL2 may have a thickness of about 5 Å to about 20 Å, but the inventive concepts are not limited thereto.

In some embodiments, the first interface layer IL1 and the second interface layer IL2 may be omitted.

The first and second gate insulating layer 142 and 144 may be formed to extend on or cover bottom surfaces and both sidewalls of the first and second gate lines 152 and 154.

Each of the first and second gate insulating layers 142 and 144 may include a silicon oxide layer, a high-k dielectric layer, or a combination thereof. The high-k dielectric layer may include a material having a higher dielectric constant than a silicon oxide layer. For instance, the first and second gate insulating layers 142 and 144 may have a dielectric constant of about 10 to about 25. The high-k dielectric layer may include a material selected from the group consisting of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, and a combination thereof, but a material forming the high-k dielectric layer is not limited to the examples. The first and second gate insulating layers 142 and 144 may be formed by using an atomic layer deposition (ALD) process, a chemical vapor deposition (CVD) process, or a physical vapor deposition (PVD) process. In some embodiments, the first gate insulating layer 142 may have the same structure as the second gate insulating layer 144. In some other embodiments, the first gate insulating layer 142 may have a different structure from the second gate insulating layer 144.

Each of the first and second gate lines 152 and 154 may include a metal-containing layer for controlling a work function and a gap-fill metal-containing layer for filling a space formed in an upper portion of the metal-containing layer for controlling the work function. In some embodiments, each of the first and second gate lines 152 and 154 may have a structure in which a metal nitride layer, a metal layer, a conductive capping layer, and a gap-fill metal layer are sequentially stacked. Each of the metal nitride layer and the metal layer may include at least one metal selected from the group consisting of titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). Each of the metal nitride layer and the metal layer may be formed by using an ALD process, a metal organic ALD (MOALD) process, or a metal organic CVD (MOCVD) process. The conductive capping layer may serve as a protection layer configured to prevent oxidation of a surface of the metal layer. Also, the conductive capping layer may serve as a wetting layer configured to facilitate deposition of another conductive layer on the metal layer. The conductive capping layer may include a metal nitride, for example, TiN, TaN, or a combination thereof, but the inventive concepts are not limited thereto. The gap-fill metal layer may extend on the conductive capping layer. The gap-fill metal layer may include a tungsten (W) layer. The gap-fill metal layer may be formed by using an ALD process, a CVD process, or a PVD process. The gap-fill metal layer may fill a recess space, which is formed by an inter-region stepped portion formed in a top surface of the conductive capping layer, without voids. In some embodiments, the first gate line 152 may have a different configuration from the second gate line 154. In some embodiments, the first gate line 152 may include a stack structure of TiAlC/TiN/W or a stack structure of TiN/TaN/TiAlC/TiN/W, and the second gate line 154 may include a stack structure of TiN/TaN/TiN/TiAlC/TiN/W. A TiAlC layer of the first gate line 152 may serve as a metal-containing layer for controlling a work function, and a TiN layer of the second gate line 154 may serve as a metal-containing layer for controlling a work function.

An interfacial portion between the first gate line 152 and the second gate line 154 may be aligned with the inter-region stepped portion 108A in a straight line in a height direction (Z direction) of the first and second-fin-type active regions F1 and F2.

First source and drain regions 162 may be formed in the first-fin-type active region F1 on both sides of the first gate line 152 in the first region I of the substrate 110. Second source and drain regions 164 may be formed in the second-fin-type active region F2 on both sides of the second gate line 154 in the second region II of the substrate 110.

Although not shown, the first and second source and drain regions 162 and 164 may include semiconductor layers that are epitaxially grown from the first- and second-fin-type active regions F1 and F2, respectively. Each of the first and second source and drain regions 162 and 164 may have an embedded SiGe structure including a plurality of epitaxially grown SiGe layers, an epitaxially grown silicon layer, or an epitaxially grown SiC layer. The first source and drain regions 162 may have different configurations from the second source and drain regions 164.

In the IC device 100A described with reference to FIGS. 1A and 1B, the bottom surfaces BS1 of the substrate 110 may be disposed at different levels, and the first-fin-type active region F1 formed in the first region I may have a different width from the second-fin-type active region F2 formed in the second region II. Accordingly, the bottom surfaces BS1 of the substrate 110 may be formed at different levels in the first region I and the second region II and fin-type active regions may be formed to have different widths in the first region I and the second region II according to a structure and characteristics of each of the devices formed in the first region I and the second region II. Thus, a leakage current may be controlled in a highly scaled FinFET, and the performance of transistors may be improved. Also, multi-gate transistors capable of different functions may be formed in the first region I and the second region II.

Figure 2A:
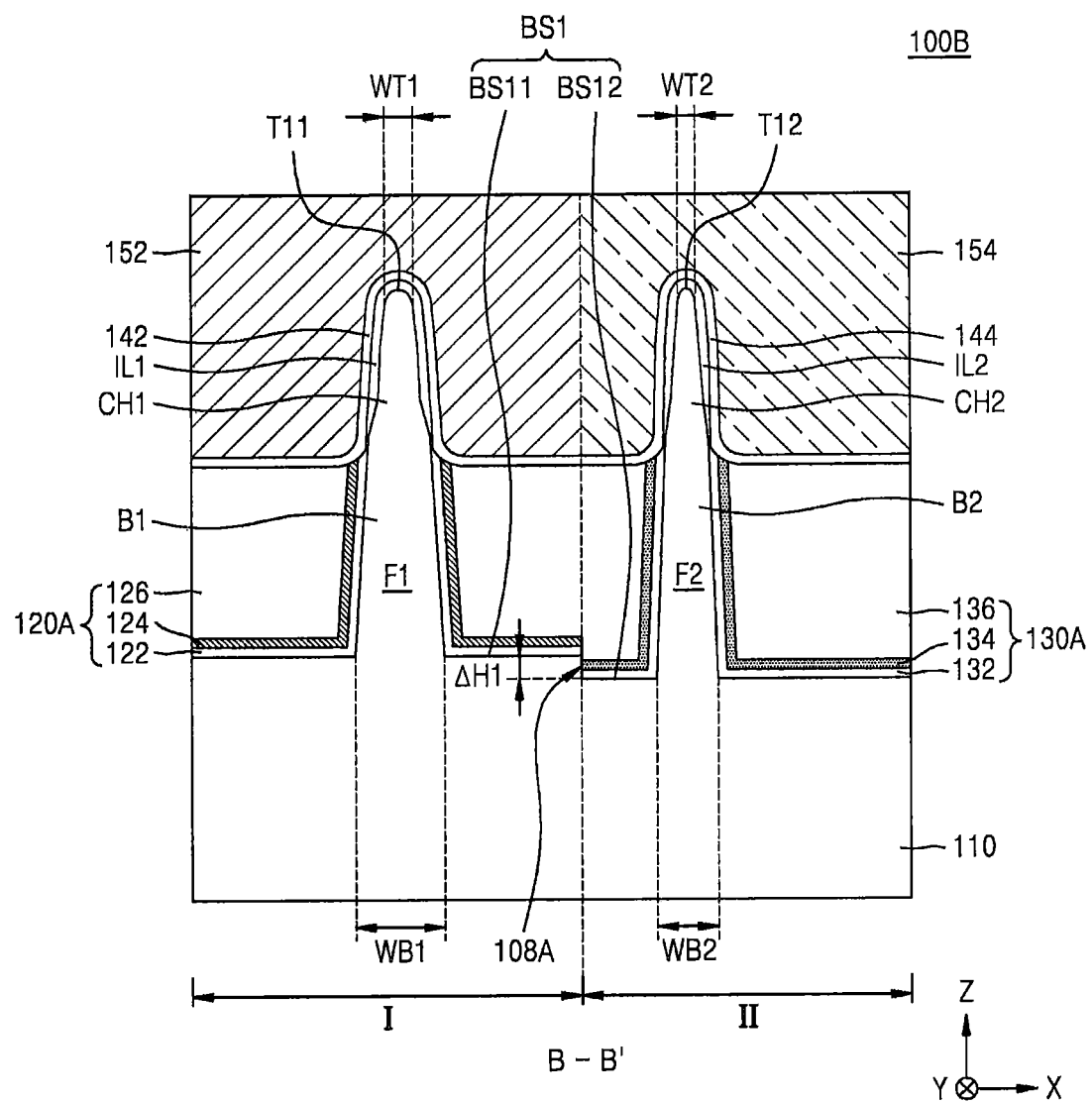
FIGS. 2A to 2C are cross-sectional views of an IC device according to other example embodiments.
Figure 2B:
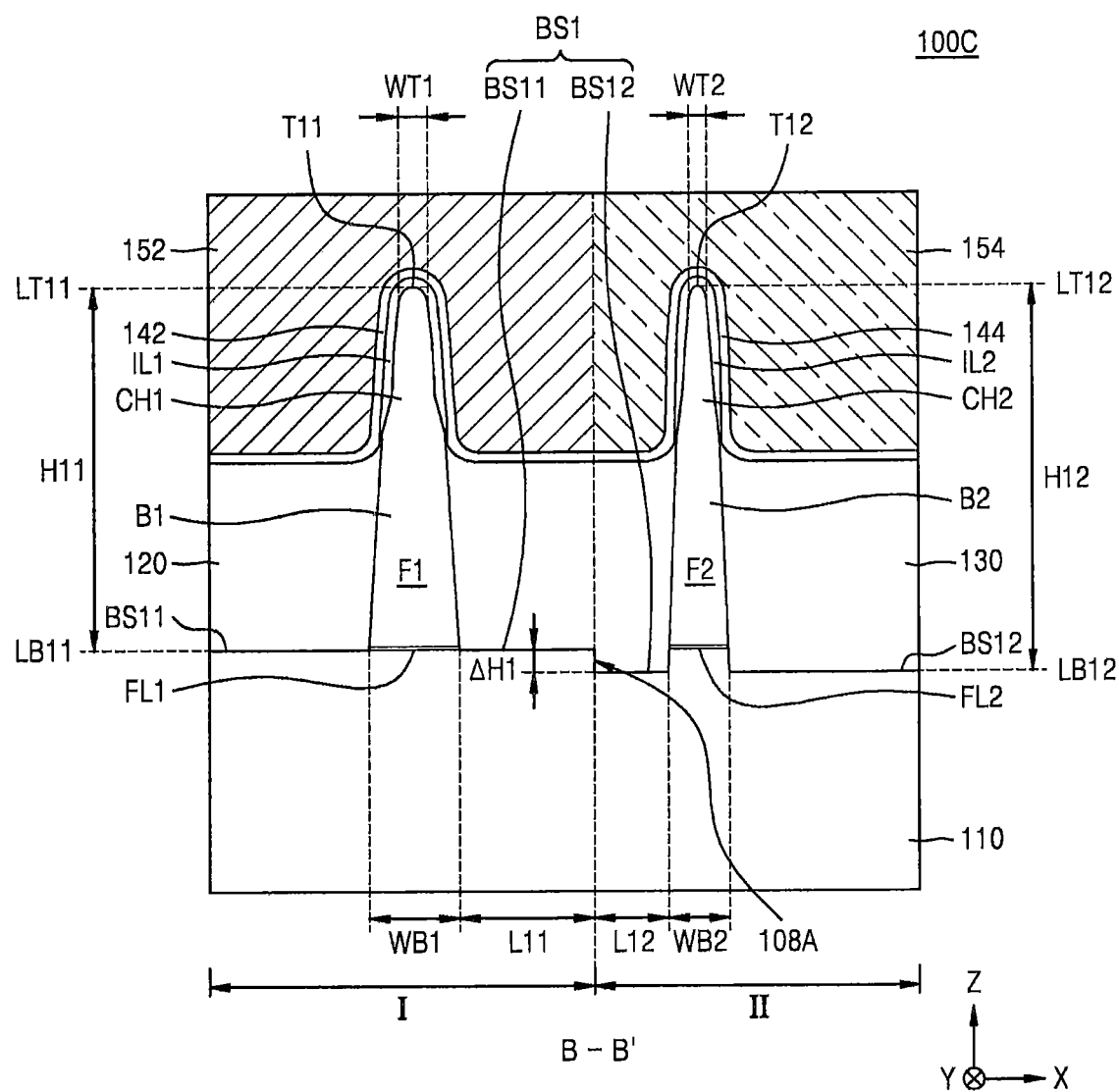
Figure 2C:
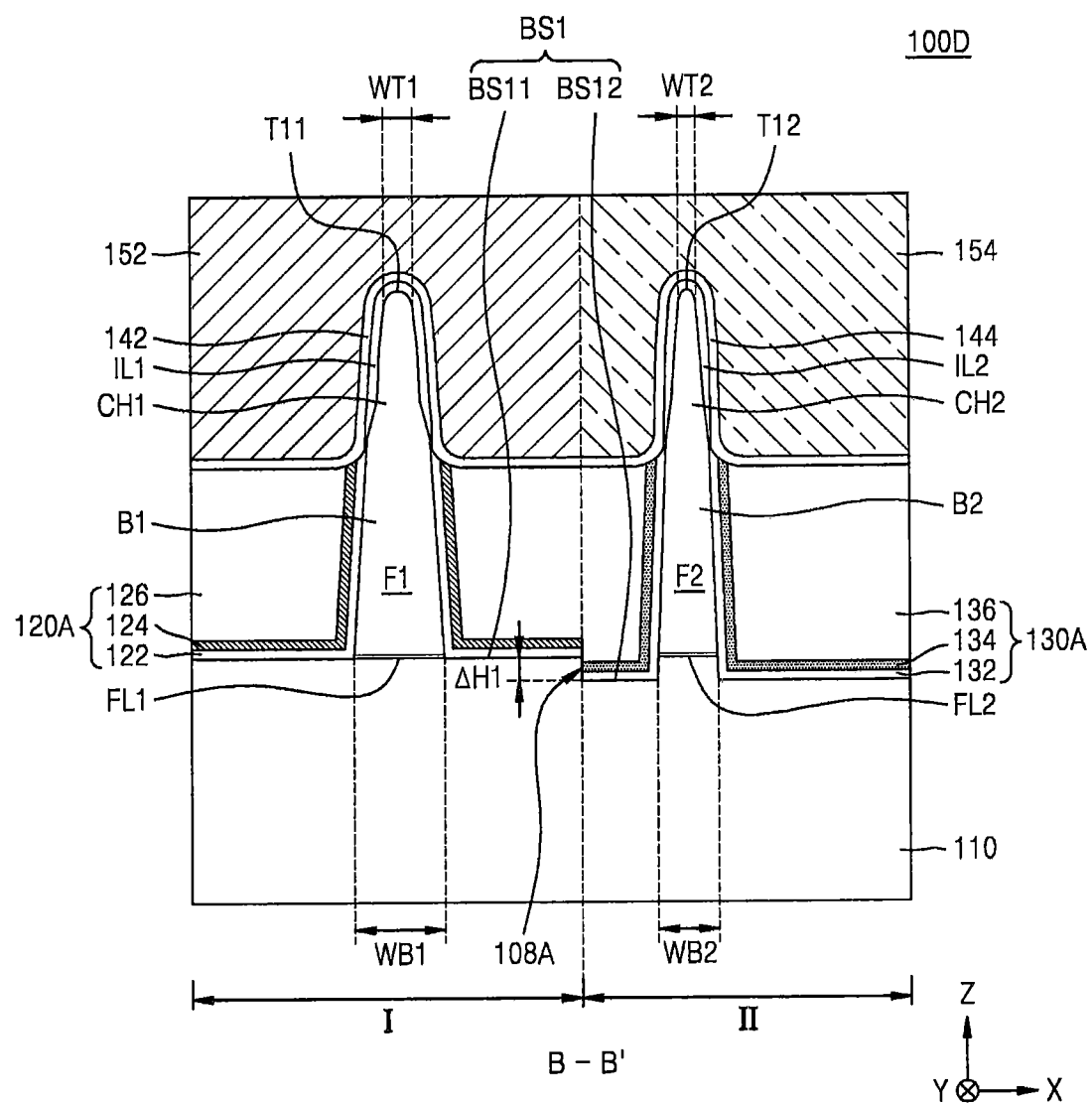

FIGS. 2A to 2C are cross-sectional views of IC devices 100B, 100C, and 100D according to other example embodiments, which correspond to the line B-B' of FIG. 1A. In FIGS. 2A to 2C, the same reference numerals are used to denote the same elements as in FIGS. 1A and 1B, and detailed descriptions thereof are omitted.

The IC device 100B shown in FIG. 2A may have generally the same configuration as the IC device 100A shown in FIGS. 1A and 1B except that the IC device 100B includes a first device isolation layer 120A and a second device isolation layer 130A instead of the first device isolation layer 120 and the second device isolation layer 130.

In the IC device 100B shown in FIG. 2A, the first device isolation layer 120A may have a different stack structure from the second device isolation layer 130A.

The first device isolation layer 120A may be formed on the periphery of a first-fin-type active region F1 to extend on or cover a first bottom unit BS11 and a first base unit B1 of the first-fin-type active region F1. The first device isolation layer 120A may include a first insulating liner 122, a first stressor liner 124, and a first buried insulating layer 126, which may be sequentially stacked on the first bottom unit BS11 and the first base unit B1. The first insulating liner 122 may be formed to be in contact with both sidewalls of the first base unit B1 of the first-fin-type active region F1. The first stressor liner 124 may extend along both sidewalls of the first base unit B1 of the first-fin-type active region F1 such that the first insulating liner 122 is between the first stressor liner 124 and the both sidewalls of the first base unit B1 of the first-fin-type active region F1. The first buried insulating layer 126 may be formed on the first stressor liner 124 to extend on or cover the first bottom unit BS11 and the first base unit B1.

The first insulating liner 122 may include a first oxide layer. For example, the first insulating liner 122 may include a native oxide layer. In some embodiments, the first oxide layer forming the first insulating liner 122 may be obtained by thermally oxidizing a surface of the first-fin-type active region F1. In some embodiments, the first insulating liner 122 may have a thickness of about 10 Å to about 100 Å.

The first stressor liner 124 may include a material capable of applying first stress to a first-conductivity-type channel region CH1. The first stressor liner 124 may serve to introduce first stress into the first-conductivity-type channel region CH1 of the first-fin-type active region F1 and increase the carrier mobility in the first-conductivity-type channel region CH1. In some embodiments, when the first-conductivity-type channel region CH1 is an N-type channel region, the first stressor liner 124 may include a material capable of applying tensile stress to the first-conductivity-type channel region CH1. For example, the first stressor liner 124 may include silicon nitride (SiN), silicon oxynitride (SiON), silicon boronitride (SiBN), silicon carbide (SiC), SiC:H, SiCN, SiCN:H, SiOCN, SiOCN:H, silicon oxycarbide (SiOC), silicon dioxide ($SiO_2$), polysilicon (poly-Si), or a combination thereof. In some embodiments, the first stressor liner 124 may have a thickness of about 10 Å to about 100 Å.

The first buried insulating layer 126 may include a second oxide layer. The first oxide layer and the second oxide layer may be oxide layers formed by using different methods. In some embodiments, the second oxide layer forming the first buried insulating layer 126 may include a layer formed by using a deposition process or a coating process. In some embodiments, the first buried insulating layer 126 may include an oxide layer formed by using a flowable chemical vapor deposition (FCVD) process or a spin coating process. For example, the first buried insulating layer 126 may include fluoride silicate glass (FSG), undoped silicate glass (USG), boro-phospho-silicate glass (BPSG), phospho-silicate glass (PSG), flowable oxide (FOX), plasma-enhanced tetra-ethyl-ortho-silicate (PE-TEOS), or tonen silazene (TOSZ), but the inventive concepts are not limited thereto.

The second device isolation layer 130A may be formed on the periphery of a second-fin-type active region F2 to extend on or cover a second bottom unit BS12 and a second base unit B2 of the second-fin-type active region F2, The second device isolation layer 130A may include a second insulating liner 132, a second stressor liner 134, and a second buried insulating layer 136, which may be sequentially stacked on the second bottom unit BS12 and the second base unit B2 of the second-fin-type active region F2.

The second insulating liner 132 may be formed to be in contact with the second bottom unit BS12 and the second base unit B2 of the second-fin-type active region F2. The second stressor liner 134 may be formed to extend on or cover the second bottom unit BS12 and the second base unit B2 of the second-fin-type active region F2 such that the second insulating liner 132 is between the second stressor liner 134 and the second bottom unit BS12 and the second base unit 132 of the second-fin-type active region F2. The second buried insulating layer 136 may be formed to extend on or cover the second bottom unit BS12 and the second base unit 132 of the second-fin-type active region F2 such that the second insulating liner 132 and the second stressor liner 134 are between the second buried insulating layer 136 and the second bottom unit BS12 and the second base unit B2 of the second-fin-type active region F2.

The second insulating liner 132 may include a third oxide layer. For instance, the second insulating liner 132 may include a native oxide layer. The second insulating liner 132 may be obtained by oxidizing a surface of the second-fin-type active region F2. For example, the second insulating liner 132 may include an oxide layer formed by using a thermal oxidation process. In some embodiments, the third oxide layer forming the second insulating liner 132 may include the same material layer formed by using the same process as the first oxide layer forming the first insulating liner 122. In some embodiments, the second insulating liner 132 may have a thickness of about 10 Å to about 100 Å.

The second stressor liner 134 may include a material capable of applying second stress to a second-conductivity-type channel region CH2. The second stress may be different from the first stress. The second stressor liner 134 may serve to introduce second stress into the second-conductivity-type channel region CH2 of the second-fin-type active region F2 and increase the carrier mobility in the second-conductivity-type channel region. In some embodiments, when the second-conductivity-type channel region CH2 is a P-type channel region, the second stressor liner 134 may include a material capable of applying compressive stress to the second-conductivity-type channel region CH2. For example, the second stressor liner 134 may include SiN, SiON, SiBN, SiC, SiC:H, SiCN, SiCN:H, SiOCN, SiOCN:H, SiOC, $SiO_2$, poly-Si, or a combination thereof. In some embodiments, the second stressor liner 134 may have a thickness of about 10 Å to about 100 Å. In some embodiments, the first stressor liner 124 and the second stressor liner 134 may include the same material capable of applying different stresses to adjacent channel regions. The first stressor liner 124 and the second stressor liner 134 may have the same thickness or different thicknesses. The first stressor liner 124 and the second stressor liner 134 may include layers formed by using different processes.

The second buried insulating layer 136 may include a fourth oxide layer. The second buried insulating layer 136 may include a layer formed by using a deposition process or a coating process. In some embodiments, the second buried insulating layer 136 may include an oxide layer formed by using an FCVD process or a spin coating process. For example, the second buried insulating layer 136 may include FSG, USG, BPSG, PSG, FOX, PE-TEOS, or TOSZ. In some embodiments, the fourth oxide layer forming the second buried insulating layer 136 may include the same material formed by using the same process as the second oxide layer forming the first buried insulating layer 126.

An interfacial portion between the first device isolation layer 120A formed in a first region I and the second device isolation layer 130A formed in a second region II may be aligned with the inter-region stepped portion 108A in a straight line in a height direction (Z direction of the first and second-fin-type active regions F1 and F2. Also, an interfacial portion between the first stressor liner 124 forming the first device isolation layer 120A in the first region I and the second stressor liner 134 forming the second device isolation layer 130A in the second region II may be aligned with the inter-region stepped portion 108A in a straight line in the height direction (Z direction) of the first and second-fin-type active regions F1 and F2.

Furthermore, an interfacial portion between the inter-region stepped portion 108A and the first and second stressor liners 124 and 134 may be aligned with an interfacial portion between the first gate line 152 and the second gate line 154 in a straight line in the height direction (Z direction) of the first and second-fin-type active regions F1 and F2.

In the IC device 100B shown in FIG. 2A, the first device isolation layer 120A formed in the first region I may include the first stressor liner 124, which may extend along both sidewalls of the first-fin-type active region F1 to apply first stress to the first-conductivity-type channel region CH1 of the first-fin-type active region F1. Also, the second device isolation layer 130A formed in the second region II may include the second stressor liner 134, which may extend along both sidewalls of the second-fin-type active region F2 to apply second stress to the second-conductivity-type channel region CH2 of the second-fin-type active region F2. The second stress may be different from the first stress. Thus, different stresses may be applied to independently increase the carrier mobility in each of the first-conductivity-type channel region CH1 of the first-fin-type active region F1 and the second-conductivity-type channel region CH2 of the second-fin-type active region F2. As a result, the performance of transistors formed in the first region I and the second region II may be enhanced.

The IC device 100C shown in FIG. 2B may have generally the same configuration as the IC device 100A shown in FIGS. 1A and 1B except that each of a first-fin-type active region F1 and a second-fin-type active region F2 includes a heterogeneous material.

More specifically, as shown in FIG. 2B, a first insertion layer FL1 including a different material from a material forming the remaining portion of the first-fin-type active region F1, may be formed in a lowest portion of the first-fin-type active region F1, which is adjacent to the first bottom unit BS11 in the first region I, or a portion adjacent to the lowest portion of the first-fin-type active region F1. Also, a second insertion layer FL2 including a different material from a material forming the remaining portion of the second-fin-type active region F2 may be formed in a lowest portion of the second-fin-type active region F2, which is adjacent to the second bottom unit BS12 in the second region II, or a portion adjacent to the lowest portion of the second-fin-type active region F2. For example, the first and second insertion layers FL1 and FL2 may include germanium, and the remaining portions of the first and second-fin-type active regions F1 and F2 may include silicon.

Although FIG. 2B illustrates a case in which the first and second insertion layers FL1 and FL2 are disposed at substantially the same level as the first bottom unit BS11, positions of the first and second insertion layers FL1 and FL2 according to the inventive concepts are not limited to the examples shown in FIG. 2B. The first and second insertion layers FL1 and FL2 may extend at a higher level or lower level than a level at which the first bottom unit BS11 extends, or may extend at a higher level or lower level than a level at which the second bottom unit BS12 extends. Also, the first insertion layer FL1 and the second insertion layer FL2 may extend at the same level or extend at different levels.

The IC device 100D shown in FIG. 2C may have generally the same configuration as the IC device 100B shown in FIG. 2A except that each of a first-fin-type active region F1 and a second-fin-type active region F2 includes a heterogeneous material.

More specifically, as shown in FIG. 2C, a first insertion layer FL1 including a different material from a material forming the remaining portion of the first-fin-type active region F1 may be formed in a lowest portion of the first-fin-type active region F1, which is adjacent to the first bottom unit BS11 in the first region I. Also, a second insertion layer FL2 including a different material from a material forming the remaining portion of the second-fin-type active region F2 may be formed in a lowest portion of the second-fin-type active region F2, which is adjacent to the second bottom unit BS12 in the second region II. For example, the first and second insertion layers FL1 and FL2 may include germanium, and the remaining portions of the first and second-fin-type active regions F1 and F2 may include silicon.

Figure 3A:
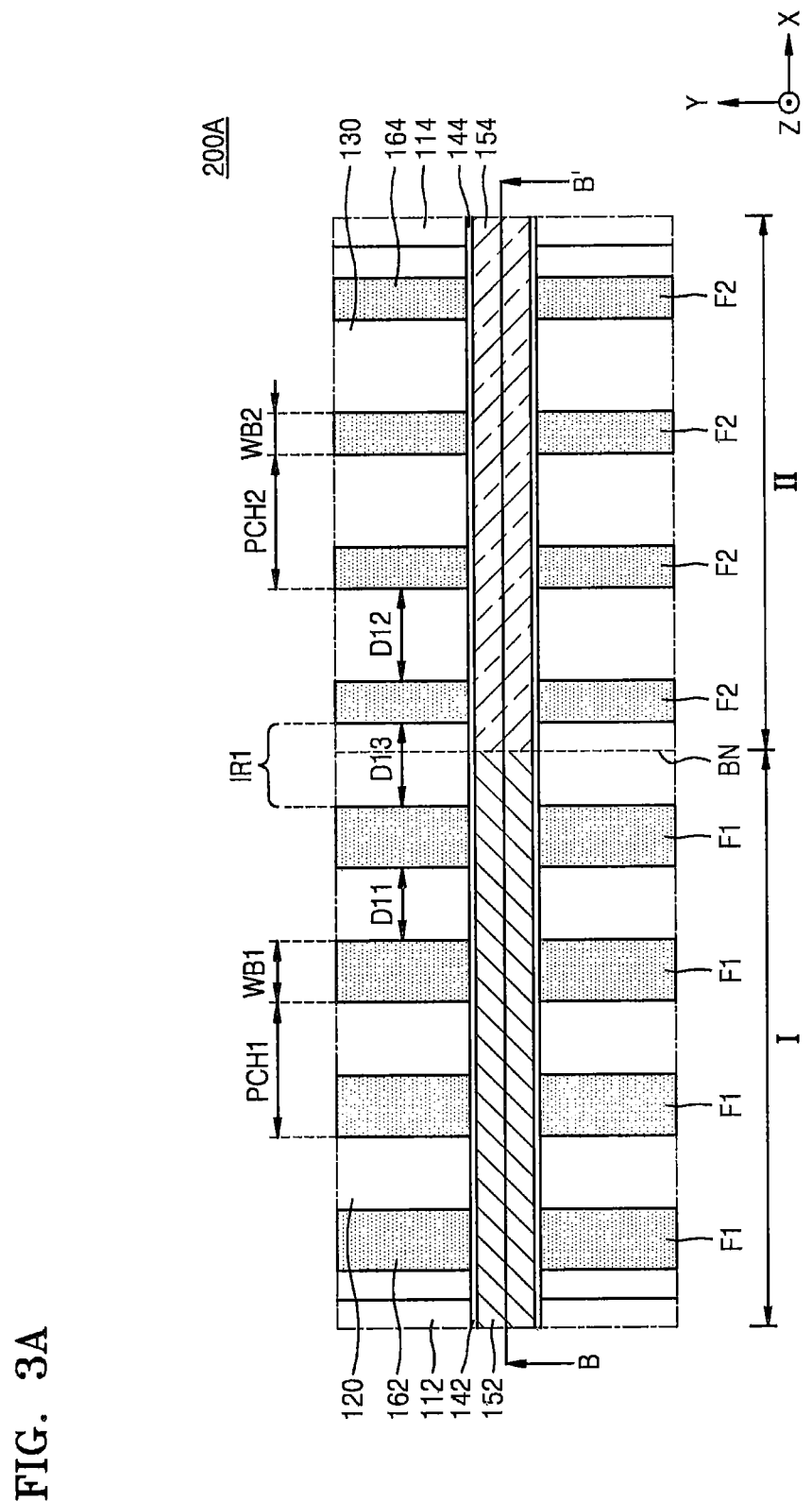
FIG. 3A is a plan layout diagram of some elements of an IC device according to other example embodiments.
Figure 3B:
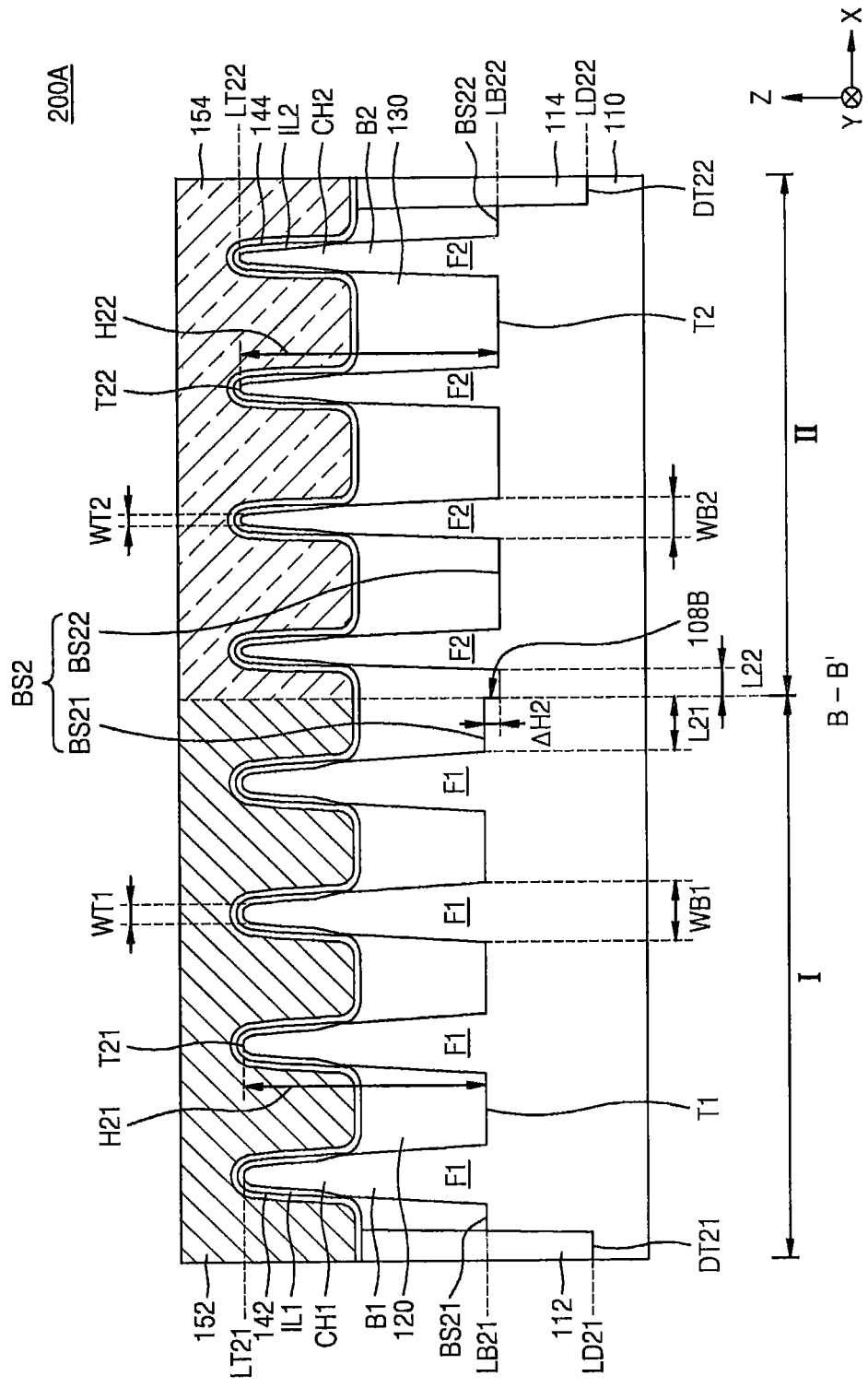
FIG. 3B is a cross-sectional view taken along a line B-B' of FIG. 3A.

FIG. 3A is a plan layout diagram of some elements of an IC device 200A according to other example embodiments, and FIG. 3B is a cross-sectional view taken along a line B-B' of FIG. 3A.

In FIGS. 3A and 3B, the same reference numerals are used to denote the same elements as in FIGS. 1A and 1B, and detailed descriptions thereof are omitted.

The IC device 200A may include a plurality of first-fin-type active regions F1, which may protrude in a direction (Z direction) perpendicular to a main surface of a substrate 110 in a first region I, and a plurality of second-fin-type active regions F2, which may protrude in the direction (Z direction) perpendicular to the main surface of the substrate 110 in a second region II. The main surface of the substrate 110 includes non-coplanar first and second surfaces which are at different levels in the first and second regions I and II.

The plurality of first-fin-type active regions F1 may linearly extend on the substrate 110 parallel to one another in a lengthwise direction (Y direction). Each of the first-fin-type active regions F1 may have a first base unit B1 having a first base width WB1 in a widthwise direction (X direction). Each of a plurality of first-conductivity-type channel regions CH1 of the plurality of first-fin-type active regions F1, which may protrude from a first device isolation layer 120, may have a first upper width WT1 that is less than the first base width WB1.

The plurality of second-fin-type active regions F2 may linearly extend on the substrate 110 parallel to one another in the lengthwise direction (Y direction). Each of the second-fin-type active regions F2 may have a second base width WB2 that is less than the first base width WB1 in the widthwise direction (X direction). Each of a plurality of second-conductivity-type channel regions CH2 of the plurality of second-fin-type active regions F2, which may protrude from the second device isolation layer 130, may have a second upper width WT2 that is less than the second base width WB2 and less than the first upper width WT1.

The substrate 110 of the IC device 200A may include a plurality of first-fin-type active regions F1 and a plurality of bottom surfaces (refer to BS2 in FIG. 3B) disposed respectively between the plurality of second-fin-type active regions F2. An inter-region stepped portion 108B may be formed on one of the plurality of bottom surfaces BS2, which is in an inter-region isolation region IR1 in an interfacial portion between the plurality of first-fin-type active regions F1 and the plurality of second-fin-type active regions F2.

The inter-region stepped portion 108B may extend in a lengthwise direction (Y direction) of the plurality of first-fin-type active regions F1 and the plurality of second-fintype active regions F2. The inter-region stepped portion 108B may extend along an interfacial portion BN between the first region I and the second region II, which is illustrated with a dashed line in FIG. 3A.

The plurality of first-fin-type active regions F1 and the plurality of second-fin-type active regions F2 may extend parallel to one another such that the inter-region stepped portion 108B is between the plurality of first-fin-type active regions F1 and the plurality of second-fin-type active regions F2. The plurality of first-fin-type active regions F1 and the plurality of second-fin-type active regions F2 may be disposed at a first pitch PCH1 and a second pitch PCH2, respectively, in the widthwise direction (X direction) of the plurality of first-fin-type active regions F1 and the plurality of second-fin-type active regions F2. The first pitch PCH1 may be equal to the second pitch PCH2.

The plurality of first-fin-type active regions F1 may be disposed a first space D11 apart from one another in the widthwise direction (X direction), and the plurality of second-fin-type active regions F2 may be disposed a second space D12 apart from one another in the widthwise direction (X direction). The second space D12 may be greater than the first space D11.

The first-fin-type active region F1 and the second-fin-type active region F2, which may face each other across the inter-region isolation region IR1, may be spaced a third space D13 apart from each other. The third space D13 may be greater than the first space D11 and less than the second space D12.

The bottom surfaces BS2 disposed on both sides of the plurality of first-fin-type active regions F1 and on both sides of the plurality of second-fin-type active regions F2 on the substrate 110 may extend at different levels in the first region I and the second region II. As shown in FIG. 3B, each of the bottom surfaces BS2 may include a first bottom unit BS21, which may extend at a height of a first base level LB21 in the first region I, and a second bottom unit BS22, which may extend at a height of a second base level LB22 in the second region II. The second base level LB22 may be lower than the first base level LB21. The inter-region stepped portion 108B may be formed due to a height difference ΔH2 between the first base level LB21 and the second base level LB22.

The inter-region stepped portion 108B may extend along an interfacial portion between the first bottom unit BS21 and the second bottom unit BS22. A lowest portion of each of the plurality of first-fin-type active regions F1, which is adjacent to the first bottom unit BS21, may be located at a higher level than a lowest portion of each of the plurality of second-fin-type active regions F2, which is adjacent to the second bottom unit BS22.

A first tip portion T21 of each of the plurality of first-fin-type active regions F1, which is farthest from the substrate 110, may be located at a first tip level LT21. A second tip portion T22 of each of the plurality of second-fin-type active regions F2, which is farthest from the substrate 110, may be located at a second tip level LT22. In some embodiments, the first tip level LT21 may be the same level as the second tip level LT22. In some other embodiments, the second tip level LT22 may be a lower level than the first tip level LT21.

Since the second base level LB22 of the second bottom unit BS22 is lower than the first base level LB21 of the first bottom unit BS21, a height H22 of the second-fin-type active region F2 may be greater than a height H21 of the first-fin-type active region F1.

A shortest distance L21 from the inter-region stepped portion 108B to one of the plurality of first-fin-type active regions F1, which is nearest to the inter-region stepped portion 108B, may be greater than a shortest distance L22 from the inter-region stepped portion 108B to one of the plurality of second-fin-type active regions F2, which is nearest to the inter-region stepped portion 108B.

The first device isolation layer 120 may be formed on the bottom surface BS2 of the substrate 110 in the first region I and extend on or cover both sidewalls of the first base unit B1 of each of the plurality of first-fin-type active regions F1. The second device isolation layer 130 may be formed on the bottom surface BS2 of the substrate 110 in the second region II and extend on or cover both sidewalls of the second base unit B2 of each of the plurality of second-fin-type active regions F2.

A first deep trench DT21 may be formed in the first region I and spaced apart from the inter-region stepped portion 108 such that the plurality of first-fin-type active regions F1 are between the first deep trench DT21 and the inter-region stepped portion 108B. The first deep trench DT21 may have a bottom surface that extends at a first deep level LD21 lower than the first base level LB21. The first deep trench DT21 may be filled with a first inter-device isolation layer 112.

A second deep trench DT22 may be formed in the second region II and spaced apart from the inter-region stepped portion 108B such that the plurality of second-fin-type active regions F2 are between the second deep trench DT22 and the inter-region stepped portion 108B. The second deep trench DT22 may have a bottom surface that extends at a second deep level LD22 lower than the second base level LB22. The second deep trench DT22 may be filled with a second inter-device isolation layer 114.

Each of the first inter-device isolation layer 112 and the second inter-device isolation layer 114 may include a silicon-containing insulating layer, such as a silicon oxide layer, a silicon nitride layer, a silicon oxynitride layer, and a silicon carbonitride layer, poly-Si, or a combination thereof, but the inventive concepts are not limited thereto.

An interfacial portion between the first device isolation layer 120 and the second device isolation layer 130 may be aligned with the inter-region stepped portion 108B in a straight line in a height direction (Z direction) of the first and second-fin-type active regions F1 and F2. Thus, the interfacial portion between the first device isolation layer 120 and the second device isolation layer 130 may vertically overlap the inter-region stepped portion 108B.

An interfacial portion between a first gate line 152 and the second gate line 154 may be aligned with the inter-region stepped portion 108B in a straight line in the height direction (Z direction) of the first and second-fin-type active regions F1 and F2.

Furthermore, an interfacial portion between the inter-region stepped portion 108B and the first and second device isolation layers 120 and 130 may be aligned with the interfacial portion between the first gate line 152 and the second gate line 154 in a straight line in the height direction (Z direction) of the first and second-fin-type active regions F1 and F2.

FIGS. 3A and 3B illustrate an example in which four first-fin-type active regions F1 are formed in the first region I and four second-fin-type active regions F2 are formed in the second region II, but the inventive concepts are not limited thereto. For instance, two, three, five, or more fin-type active regions may be formed in each of the first region I and the second region II and extend parallel to one another. Also, FIG. 3B illustrates an example in which both sidewalls of each of the plurality of first-fin-type active regions F1 and the plurality of second-fin-type active regions F2 have approximately symmetrical profiles with respect to a central line extending in a direction (Z direction) perpendicular to a main surface of the substrate 110. However, the inventive concepts are not limited thereto, and the both sidewalls of each of at least some of the plurality of first-fin-type active regions F1 and the plurality of second-fin-type active regions F2 may have asymmetrical profiles with respect to the central line.

In the IC device 200A described with reference to FIGS. 3A and 3B, the bottom surfaces BS2 of the substrate 110 may be formed at different levels in the first region I and the second region II, and the first-fin-type active region F1 formed in the first region I may be formed to have a different width from the second-fin-type active region F2 formed in the second region II. Accordingly, the bottom surfaces BS2 may, be formed at different levels in the first and second regions I and II and the first and second-fin-type active regions F1 and F2 may be formed to have different widths according to a structure and characteristics of each of the devices formed in the first and second regions I and II. Thus, a leakage current may be controlled in a highly scaled FinFET, and the performance of transistors may be improved. Also, multi-gate transistors capable of different functions may be formed in the first region I and the second region II.

In some embodiments, at least a portion of the second-conductivity-type channel region CH2 of each of the plurality of second-fin-type active regions F2 formed in the second region II of the IC device 200A may include a different material from the remaining portion of the second-conductivity-type channel region CH2. For example, a selected partial region of the second-conductivity-type channel region CH2 of each of the plurality of second-fin-type active regions F2 may include germanium, and the remaining region of the second-conductivity-type channel region CH2 may include silicon.

In some embodiments, in the IC device 200A, each of the plurality of first-fin-type active regions F1 may further include the first insertion layer FL1 shown in FIG. 2B, and each of the plurality of second-fin-type active regions F2 may further include the second insertion layer FL2 shown in FIG. 2B.

Figure 4A:
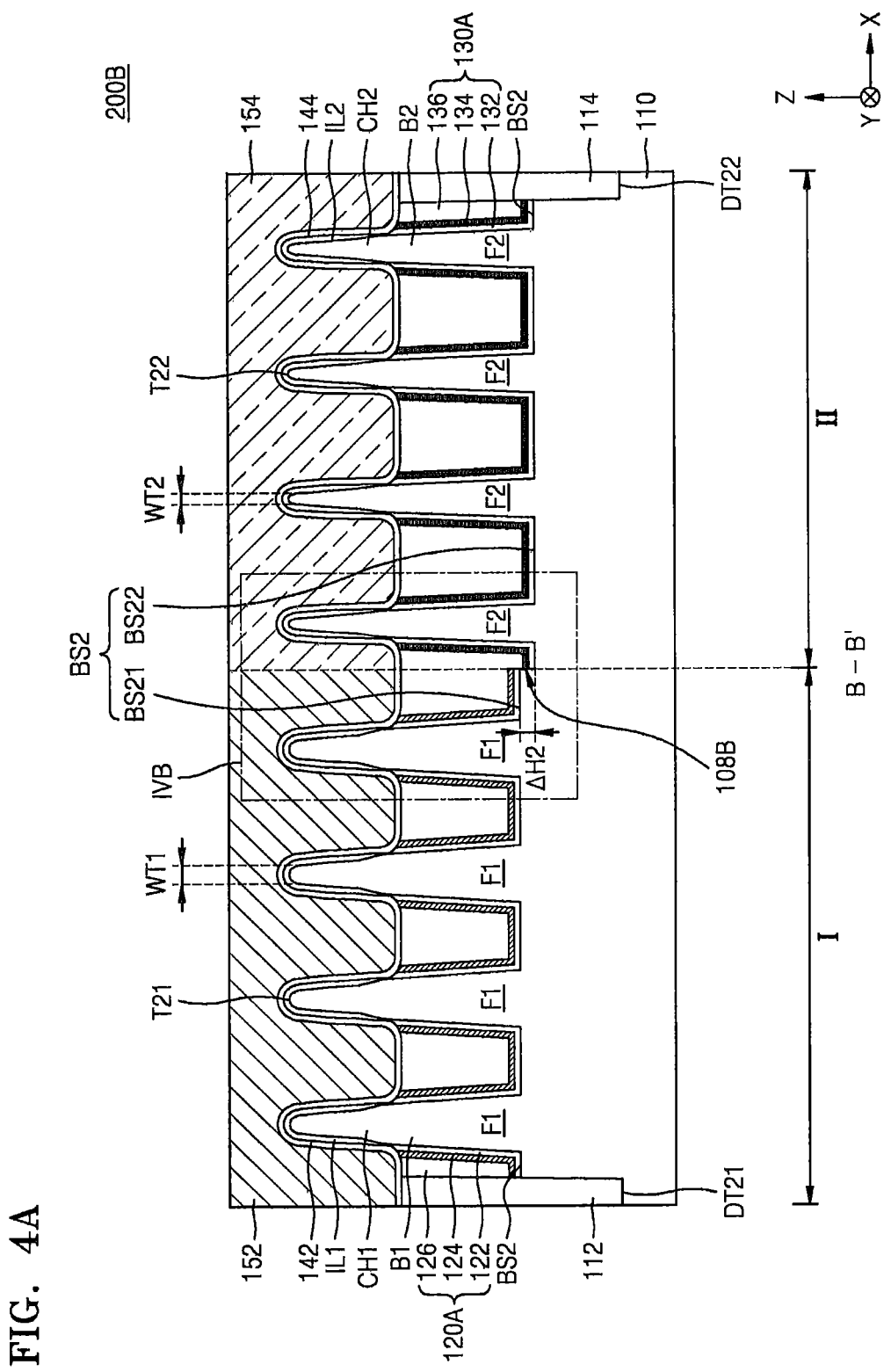
FIG. 4A is a cross-sectional view of an IC device according to another example embodiment.

FIG. 4A is a cross-sectional view of an IC device 200B according to another example embodiment, which corresponds to the line B-B' of FIG. 3A. In FIG. 4A, the same reference numerals are used to denote the same elements as in FIGS. 1A to 3B, and detailed descriptions thereof are omitted.

The IC device 200B shown in FIG. 4A may have generally the same configuration as the IC device 200A shown in FIGS. 3A and 3B except that the IC device 200B includes the first device isolation layer 120A and the second device isolation layer 130A instead of the first device isolation layer 120 and the second device isolation layer 130.

In the IC device 200B shown in FIG. 4A, the first device isolation layer 120A may have a different stack structure from the second device isolation layer 130A. Detailed descriptions of the first device isolation layer 120A and the second device isolation layer 130A are the same as described with reference to FIG. 2A.

In the IC device 200B shown in FIG. 4A, an interfacial portion between the inter-region stepped portion 108B and first and second stressor liners 124 and 134 may be aligned with and vertically overlap an interfacial portion between the first gate line 152 and the second gate line 154 in a straight line in a height direction (Z direction) of the first and second-fin-type active regions F1 and F2.

Figure 4B:
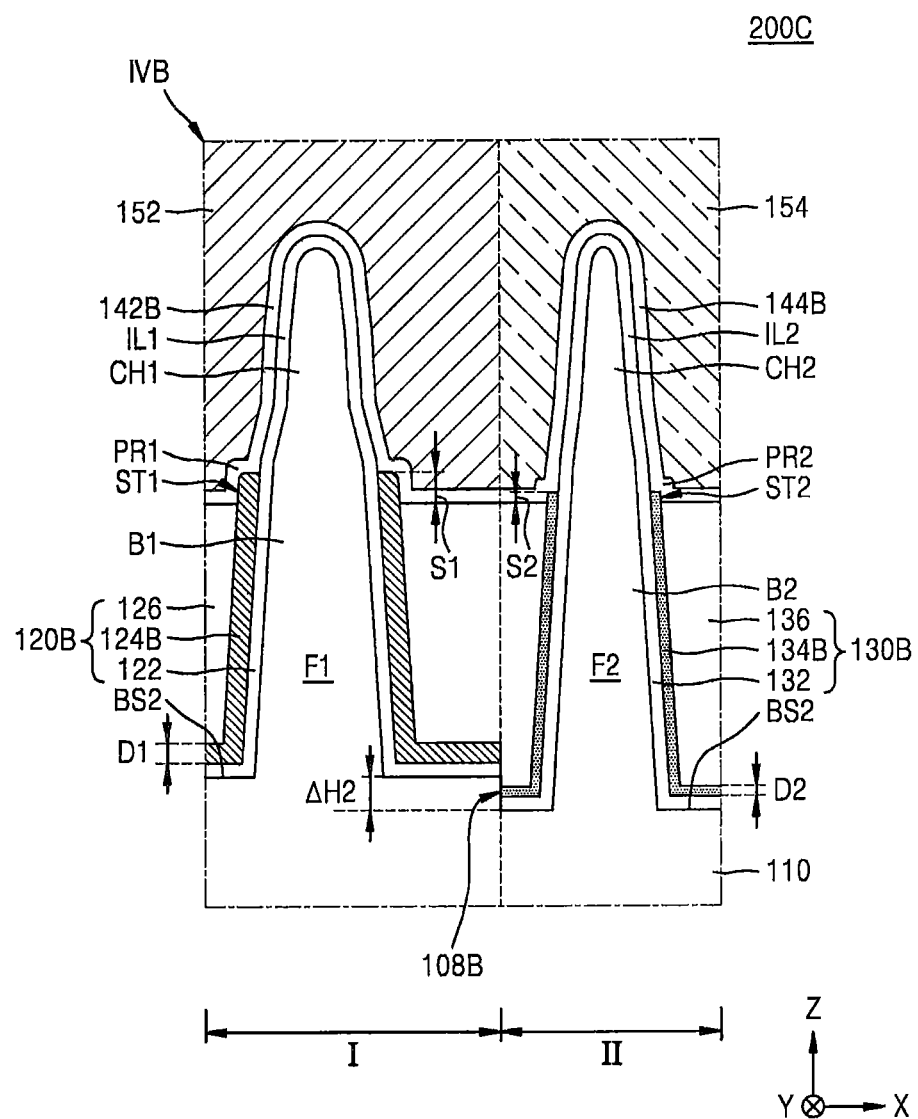
FIG. 4B is a cross-sectional view of some elements of an IC device according to another example embodiment.

FIG. 4B is a cross-sectional view of some elements of an IC device 200C according to another example embodiment. FIG. 4B illustrates a portion of the IC device 200C corresponding a region "IVB" illustrated with an alternating long-short dashed line in FIG. 4A. In FIG. 4B, the same reference numerals are used to denote the same elements as in FIGS. 1A to 4A, and detailed descriptions thereof are omitted.

The IC device 200C shown in FIG. 4B may have generally the same configuration as the IC device 200B shown in FIG. 4A except that a thickness D1 of a first stressor liner 124B included in a first device isolation layer 120B in a first region I is greater than a thickness D2 of a second stressor liner 134B included in a second device isolation layer 130B in a second region II.

In some embodiments, a first-conductivity-type channel region CH1 may be an N-type channel region, and a second-conductivity-type channel region CH2 may be a P-type channel region. In this case, the first stressor liner 124B may include a material capable of applying tensile stress to the first-conductivity-type channel region CH1, and the second stressor liner 134B may include a material capable of applying compressive stress to the second-conductivity-type channel region CH2. For example, the first stressor liner 124B may include SiN, and the second stressor liner 134B may include poly-Si, but the inventive concepts are not limited thereto. In some embodiments, the first stressor liner 124B may have a thickness of about 30 Å to about 100 Å, and the second stressor liner 134B may have a thickness of about 10 Å to about 30 Å, but the inventive concepts are not limited thereto.

Furthermore, a first stepped portion ST1 may be formed between a top surface of the first stressor liner 124B and a top surface of a first buried insulating layer 126 in a top surface of the first device isolation layer 120B that covers both sidewalls of a first base unit B1 of the first-fin-type active region F1 in the first region I. At the first stepped portion ST1, the first stressor liner 124B may protrude by as much as a first height S1 from the top surface of the first buried insulating layer 126. A first protrusion PR1 corresponding to a shape of a top surface of the first stepped portion ST1 may be formed in a portion of the first gate insulating layer 142B, which covers the first stepped portion ST1. Also, a second stepped portion ST2 may be formed between a top surface of the second stressor liner 134B and a top surface of a second buried insulating layer 136 in a top surface of the second device isolation layer 130B that covers both sidewalls of a second base unit B2 of the second-fin-type active region F2 in the second region II. At the second stepped portion ST2, the second stressor liner 134B may protrude by as much as a second height S2 from the top surface of the second buried insulating layer 136. The second height S2 may be lower than the first height S1. A second protrusion PR2 corresponding to a shape of the top surface of the first stepped portion ST1 may be formed on a portion of the second gate insulating layer 142B, which covers the second stepped portion ST2. The second protrusion PR2 may have a smaller dimension than the first protrusion PR1.

Although only one first-fin-type active region F1, one second-fin-type active region F2, and some elements disposed in the vicinities thereof have been described with reference to FIG. 4B, the same configuration as described with reference to FIG. 4B may be applied to an IC device including a plurality of first-fin-type active regions F1 and a plurality of second-fin-type active regions F2 as shown in FIG. 4A.

In the IC devices 200B and 200C shown in FIGS. 4A and 4B, the first device isolation layers 120A and 120B formed in the first region I may include the first stressor liners 124 and 124B, which may extend along both sidewalls of the plurality of first-fin-type active regions F1 so that first stress may be applied to the first-conductivity-type channel regions CH1 of the plurality of first-fin-type active regions F1, Also, the second device isolation layers 130A and 130B formed in the second region II may include second stressor liners 134 and 134B, which may extend along both sidewalls of the plurality of second-fin-type active regions F2, so that second stress may be applied to the second-conductivity-type channel regions CH2 of the plurality of second-fin-type active regions F2. The second stress may be different from the first stress. Thus, different stresses may be applied such that carrier mobility can be independently improved in each of the first-conductivity-type channel regions CH1 of the plurality of first-fin-type active regions F1 and the second-conductivity-type channel regions CH2 of the plurality of second-fin-type active regions F2. As a result, the performance of transistors formed in the first region I and the second region II may be enhanced.

Figure 5A:
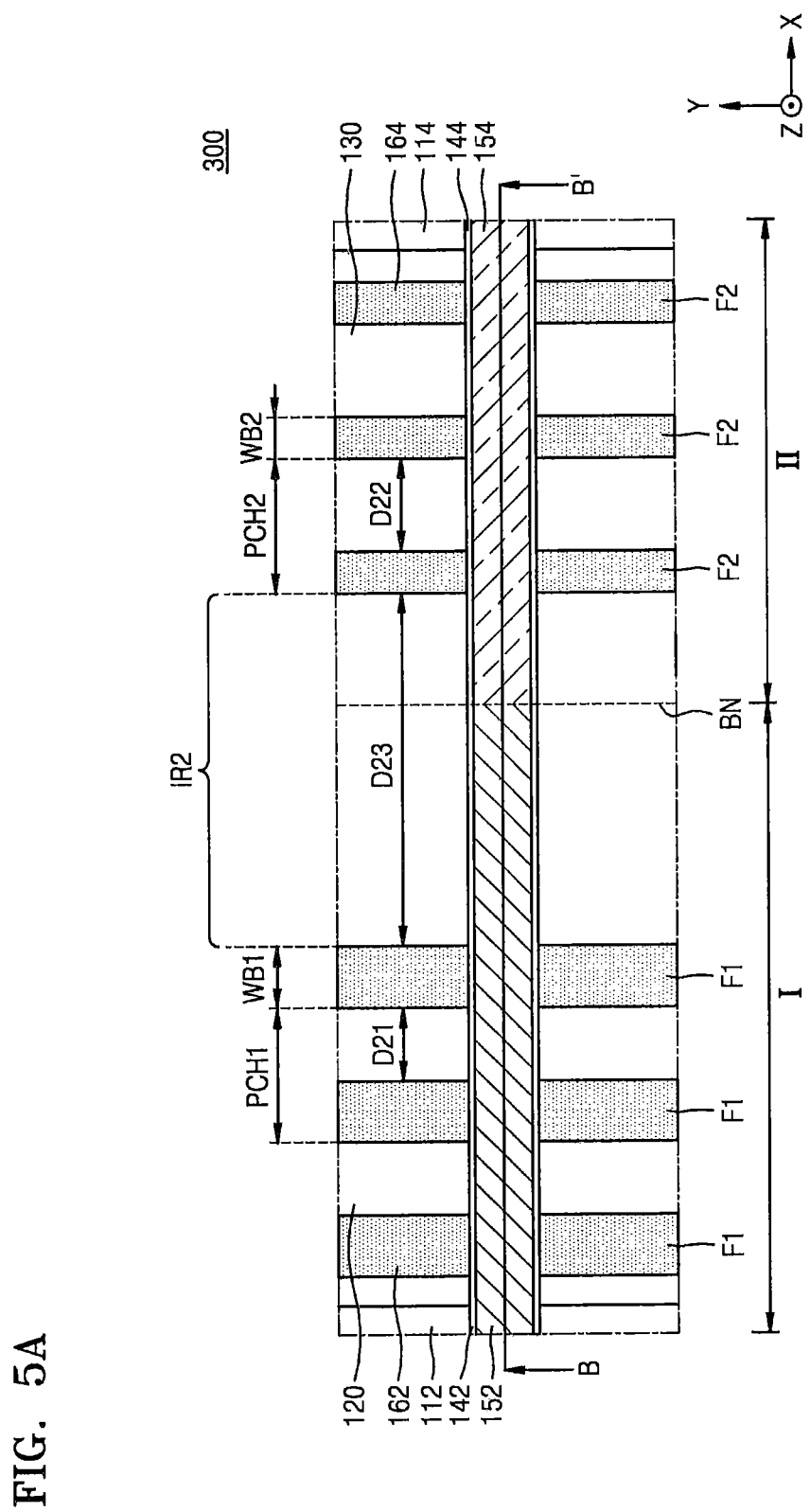
FIG. 5A is a plan layout diagram of some elements of an IC device according to another example embodiment.
Figure 5B:
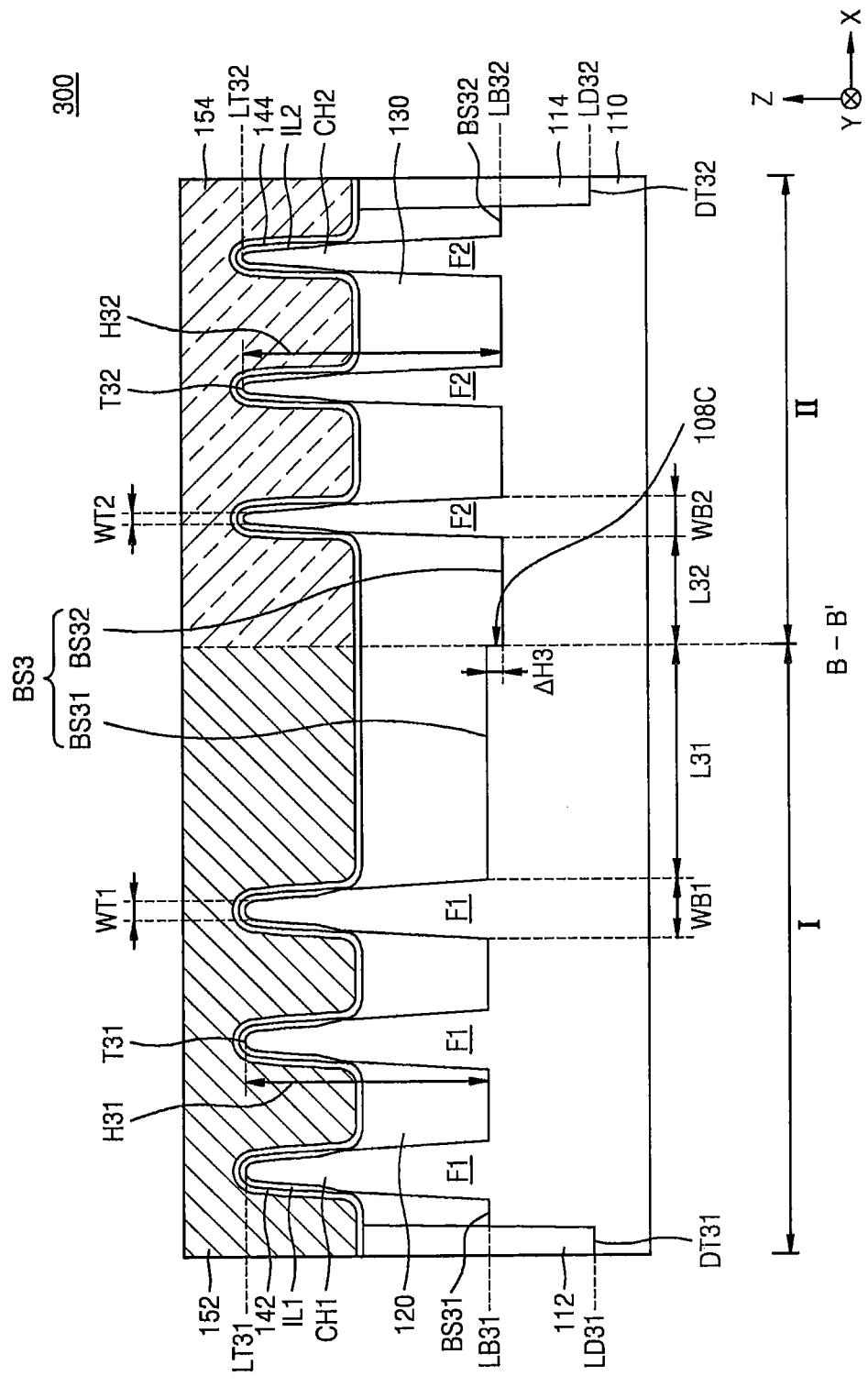
FIG. 5B is a cross-sectional view taken along a line B-B' of FIG. 5A.

FIG. 5A is a plan layout diagram of some elements of an IC device 300 according to other example embodiments, and FIG. 5B is a cross-sectional view taken along a line B-B' of FIG. 5A.

In FIGS. 5A and 5B, the same reference numerals are used to denote the same elements as in FIGS. 1A to 3B, and detailed descriptions thereof are omitted.

The IC device 300 may include a plurality of first-fin-type active regions F1, which may protrude in a direction (Z direction) perpendicular to a main surface of a substrate 110 in a first region I, and a plurality of second-fin-type active regions F2, which may protrude in the direction (Z direction) perpendicular to the main surface of the substrate 110 in a second region II.

The substrate 110 of the IC device 300 may have a plurality of bottom surfaces (refer to BS3 in FIG. 5B) interposed between the plurality of first-fin-type active regions F1 and the plurality of second-fin-type active regions F2, respectively. An inter-region stepped portion 108C may be formed in one of the plurality of bottom surfaces BS3, which is in an inter-region isolation region IR2 in an interfacial portion between the plurality of first-fin-type active regions F1 and the plurality of second-fin-type active regions F2.

The inter-region stepped portion 108C may extend in a lengthwise direction (Y direction) of the plurality of first-fin-type active regions F1 and the plurality of second-fin-type active regions F2. The inter-region stepped portion 108C may extend in an interfacial portion BN between the first region I and the second region II, which is illustrated with a dashed line in FIG. 5A.

The plurality of first-fin-type active regions F1 and the plurality of second-fin-type active regions F2 may extend parallel to one another such that the inter-region stepped portion 108C is between the plurality of first-fin-type active regions F1 and the plurality of second-fin-type active regions F2. The plurality of first-fin-type active regions F1 may be disposed at a first pitch PCH1 in a widthwise direction (X direction). The plurality of second-fin-type active regions F2 may be disposed at a second pitch PCH2 in the widthwise direction (X direction). The first pitch PCH1 may be equal to the second pitch PCH2.

The plurality of first-fin-type active regions F1 may be disposed a first space D21 apart from one another in the widthwise direction (X direction), and the plurality of second-fin-type active regions F2 may be disposed a second space D22 apart from one another in the widthwise direction (X direction). The second space D22 may be greater than the first space D21.

The first-fin-type active region F1 and the second-fin-type active region F2, which may face each other across the inter-region isolation region IR2, may be spaced a third space D23 apart from each other. The third space D23 may be greater than the first space D21 and greater than the second space D22.

The bottom surfaces BS3 disposed on both sides of each of the plurality of first-fin-type active regions F1 and on both sides of each of the plurality of second-fin-type active regions F2 on the substrate 110 may extend at different levels in the first region I and the second region II. As shown in FIG. 5B, each of the bottom surfaces BS3 may include a first bottom unit BS31, which may extend at a height of a first base level LB31 in the first region I, and a second bottom unit BS32, which may extend at a height of a second base level LB32 in the second region II. The second base level LB32 may be lower than the first base level LB31. The inter-region stepped portion 108C may be formed due to a height difference ΔH3 between the first base level LB31 and the second base level LB32.

The inter-region stepped portion 108C may extend along an interfacial portion between the first bottom unit BS31 and the second bottom unit BS32. A lowest portion of each of the plurality of first-fin-type active regions F1, which is adjacent to the first bottom unit BS31, may be located at a higher level than a lowest portion of each of the plurality of second-fin-type active regions F2, which is adjacent to the second bottom unit BS32.

A first tip portion T31 of each of the plurality of first-fin-type active regions F1, which is farthest from the substrate 110, may be located at a first tip level LT31. A second tip portion T32 of each of the plurality of second-fin-type active regions F2, which is farthest from the substrate 110, may be located at a second tip level LT32. In some embodiments, the first tip level LT31 may be the same level as the second tip level LT32. In some other embodiments, the second tip level LT32 may be a lower level than the first tip level LT31.

Since the second base level LB32 of the second bottom unit BS32 is lower than the first base level LB31 of the first bottom unit BS31, a height H32 of the second-fin-type active region F2 may be greater than a height H31 of the first-fin-type active region F1.

A shortest distance L31 from the inter-region stepped portion 108C to one of the plurality of first-fin-type active regions F1, which is nearest to the inter-region stepped portion 108C, may be greater than a shortest distance L32 from the inter-region stepped portion 108C to one of the plurality of second-fin-type active regions F2, which is nearest to the inter-region stepped portion 108C.

A first deep trench DT31 may be formed in the first region I and spaced part from the inter-region stepped portion 108C such that the plurality of first-fin-type active regions F1 are between the first deep trench DT31 and the inter-region stepped portion 108C. The first deep trench DT31 may have a bottom surface that extends at a first deep level LD31 lower than the first base level LB31. The first deep trench DT31 may be filled with a first inter-device isolation layer 112.

A second deep trench DT32 may be formed in the second region II and spaced apart from the inter-region stepped portion 108C such that the plurality of second-fin-type active regions F2 are between the second deep trench DT32 and the inter-region stepped portion 108C. The second deep trench DT32 may have a bottom surface that extends at a second deep level LD32 lower than the second base level LB32. The second deep trench DT32 may be filled with a second inter-device isolation layer 114.

An interfacial portion between the first device isolation layer 120 and the second device isolation layer 130 may be aligned with the inter-region stepped portion 108C in a straight line in a height direction (Z direction) of the first and second-fin-type active regions F1 and F2. Thus, an interfacial portion between the first device isolation layer 120 and the second device isolation layer 130 may vertically overlap the inter-region stepped portion 108C.

An interfacial portion between a first gate line 152 and the second gate line 154 may be aligned with the inter-region stepped portion 108C in a straight line in the height direction (Z direction) of the first and second-fin-type active regions F1 and F2.

Furthermore, an interfacial portion between the inter-region stepped portion 108C and the first and second device isolation layers 120 and 130 may be aligned with an interfacial portion between the first gate line 152 and the second gate line 154 in a straight line in the height direction (Z direction) of the first and second-fin-type active regions F1 and F2.

In some embodiments, the IC device 300 may include a first device isolation layer 120A and a second device isolation layer 130A described with reference to FIG. 2A instead of the first device isolation layer 120 and the second device isolation layer 130.

In some embodiments, at least a portion of a second-conductivity-type channel region CH2 of each of the plurality of second-fin-type active regions F2 formed in the second region II of the IC device 300 may include a different material from the remaining portion of the second-conductivity-type channel region CH2. For example, a selected partial region of the second-conductivity-type channel region CH2 of each of the plurality of second-fin-type active regions F2 may include germanium, and the remaining region of the second-conductivity-type channel region CH2 may include silicon.

In some embodiments, in the IC device 300, each of the plurality of first-fin-type active regions F1 may further include the first insertion layer FL1 shown in FIG. 2B and each of the plurality of second-fin-type active regions F2 may further include the second insertion layer FL2 shown in FIG. 2B.

Figure 6:
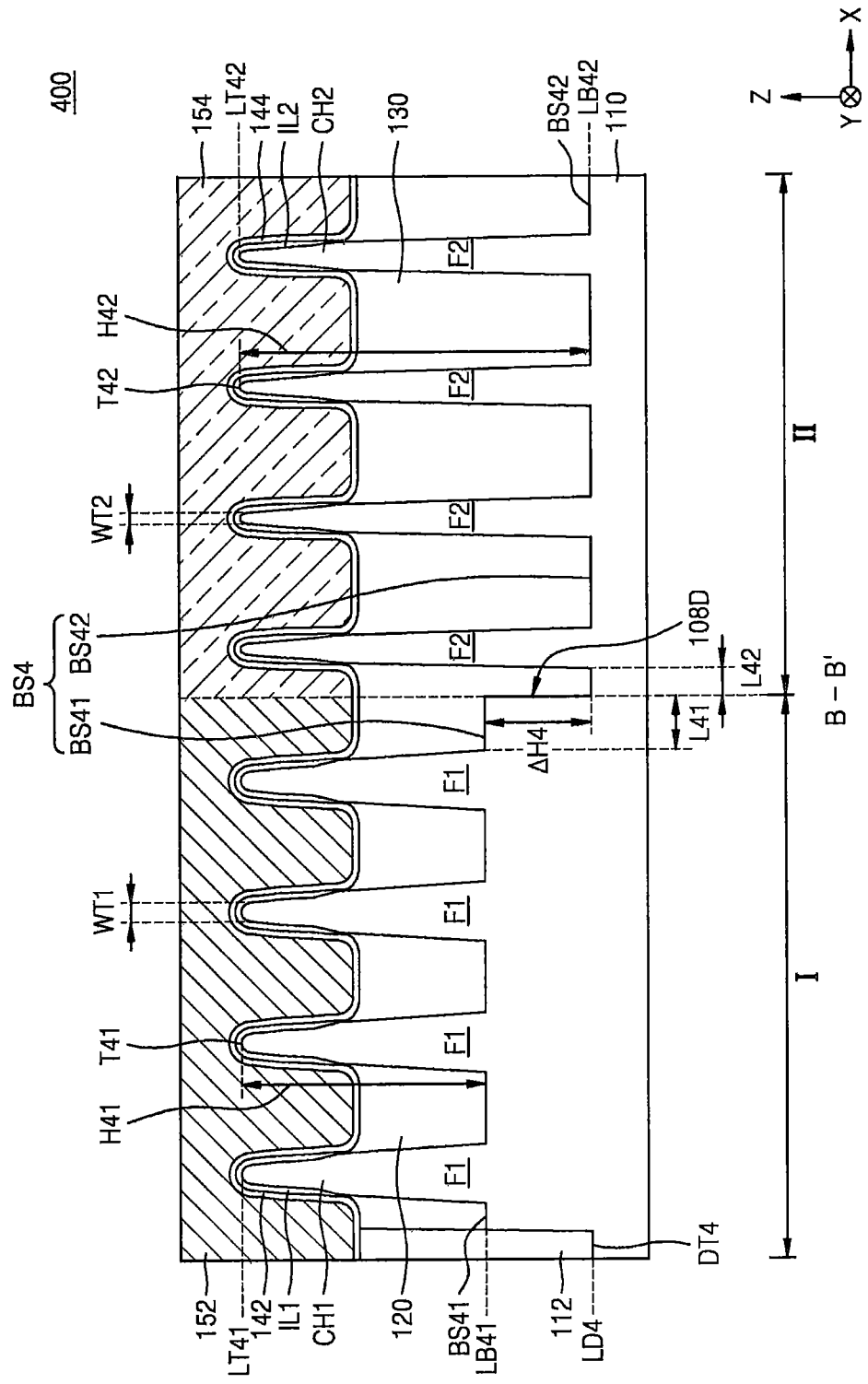
FIG. 6 is a cross-sectional view of main components of an IC device according to another example embodiment.

FIG. 6 is a cross-sectional view of portions of an IC device 400 according to another example embodiment.

In FIG. 6, the same reference numerals are used to denote the same elements as in FIGS. 1A to 5B, and detailed descriptions thereof are omitted.

Referring to FIG. 6, a substrate 110 of the IC device 400 may have a plurality of bottom surfaces BS4 interposed between a plurality of first-fin-type active regions F1 and a plurality of second-fin-type active regions F2, respectively. An inter-region stepped portion 108D may be formed in one of the plurality of bottom surfaces BS4, which may be in an interfacial portion between the plurality of first-fin-type active regions F1 and the plurality of second-fin-type active regions F2.

The inter-region stepped portion 108D may extend in a lengthwise direction (Y direction) of the plurality of first-fin-type active regions F1 and the plurality of second-fin-type active regions F2. The inter-region stepped portion 108D may extend along an interfacial portion between a first region I and a second region II.

The plurality of first-fin-type active regions F1 and the plurality of second-fin-type active regions F2 may extend parallel to one another such that the inter-region stepped portion 108D is between the plurality of first-fin-type active regions F1 and the plurality of second-fin-type active regions F2.

The plurality of bottom surfaces BS4 of the substrate 110 may extend at different levels in the region I and the second region II. Each of the bottom surfaces BS4 may include a first bottom unit BS41, which may extend in the first region I at a height of a first base level LB41, and a second bottom unit BS42, which may extend in the second region II at a height of a second base level LB42 that is lower than the first base level LB41. The inter-region stepped portion 108D may be formed due to a height difference ΔH4 between the first base level LB41 and the second base level LB42.

The inter-region stepped portion 108D may extend along an interfacial portion between the first bottom unit BS41 and the second bottom unit BS42. A lowest portion of each of the plurality of first-fin-type active regions F1, which is adjacent to the first bottom unit BS41, may be located at a higher level than a lowest portion of each of the plurality of second-fin-type active regions F2, which is adjacent to the second bottom unit BS42.

A deep trench DT4 may be formed in the first region I in a position apart from the inter-region stepped portion 108D such that the plurality of first-fin-type active regions F1 is between the deep trench DT4 and the inter-region stepped portion 108D. The deep trench DT4 may have a bottom surface that extends at a deep level LD4 that is lower than the first base level LB41. The deep trench DT4 may be filled with the first inter-device isolation layer 112.

The second base level LB42 of the second bottom unit BS42 formed in the second region II may be equal to or similar to the deep level LD4, which is a bottom level of the deep trench DT4. Thus, a bottom surface of a second device isolation layer 130 formed in the second region II may be at substantially the same level as the bottom surface of the deep trench DT4. In some embodiments, the second base level LB42 may be lower than the deep level LD4. In some other embodiments, the second base level LB42 may be lower than the first base level LB41 and higher than the deep level LD4.

A first tip portion T41 of each of the plurality of first-fin-type active regions F1, which is farthest from the substrate 110, may be located at first tip level LT41. A second tip portion T42 of each of the plurality of second-fin-type active regions F2, which is farthest from the substrate 110, may be located at a second tip level LT42. In some embodiments, the first tip level LT41 may be the same level as the second tip level LT42. In some other embodiments, the second tip level LT42 may be a lower level than the first tip level LT41.

Since the second base level LB42 of the second bottom unit BS42 is lower than the first base level LB41 of the first bottom unit BS41, a height H42 of the second-fin-type active region F2 may be greater than a height H41 of the first-fin-type active region F1.

A shortest distance L41 from the inter-region stepped portion 108D to one of the plurality of first-fin-type active regions F1, which is nearest to the inter-region stepped portion 108D, may be greater than a shortest distance L42 from the inter-region stepped portion 108D to one of the plurality of second-fin-type active regions F2, which is nearest to the inter-region stepped portion 108D.

An interfacial portion between the first device isolation layer 120 and the second device isolation layer 130 may be aligned with the inter-region stepped portion 108D in a straight line in a height direction (Z direction) of the first and second-fin-type active regions F1 and F2. Thus, the interfacial portion between the first device isolation layer 120 and the second device isolation layer 130 may vertically overlap the inter-region stepped portion 108D.

An interfacial portion between a first gate line 152 and the second gate line 154 may be aligned with the inter-region stepped portion 108D in a straight line in the height direction (Z direction) of the first and second-fin-type active regions F1 and F2.

Furthermore, an interfacial portion between the inter-region stepped portion 108D and the first and second device isolation layers 120 and 130 may be aligned with the interfacial portion between the first gate line 152 and the second gate line 154 in a straight line in the height direction (Z direction) of the first and second-fin-type active regions F1 and F2.

In some embodiments, the IC device 400 may include the first device isolation layer 120A and the second device isolation layer 130A described with reference to FIG. 2A instead of the first device isolation layer 120 and the second device isolation layer 130.

In some embodiments, at least a portion of a second-conductivity-type channel region CH2 of each of the plurality of second-fin-type active regions F2 formed in the second region II of the IC device 400 may include a different material from the remaining portion of the second-conductivity-type channel region CH2. For instance, a selected partial region of the second-conductivity-type channel region CH2 of each of the plurality of second-fin-type active regions F2 may include germanium, and the remaining region of the second-conductivity-type channel region CH2 may include silicon.

In some embodiments, in the IC device 400, each of the plurality of first-fin-type active regions F1 may further include the first insertion layer FL1 shown in FIG. 2B, and each of the plurality of second-fin-type active regions F2 may further include the second insertion layer FL2 shown in FIG. 2B.

Figure 7A:
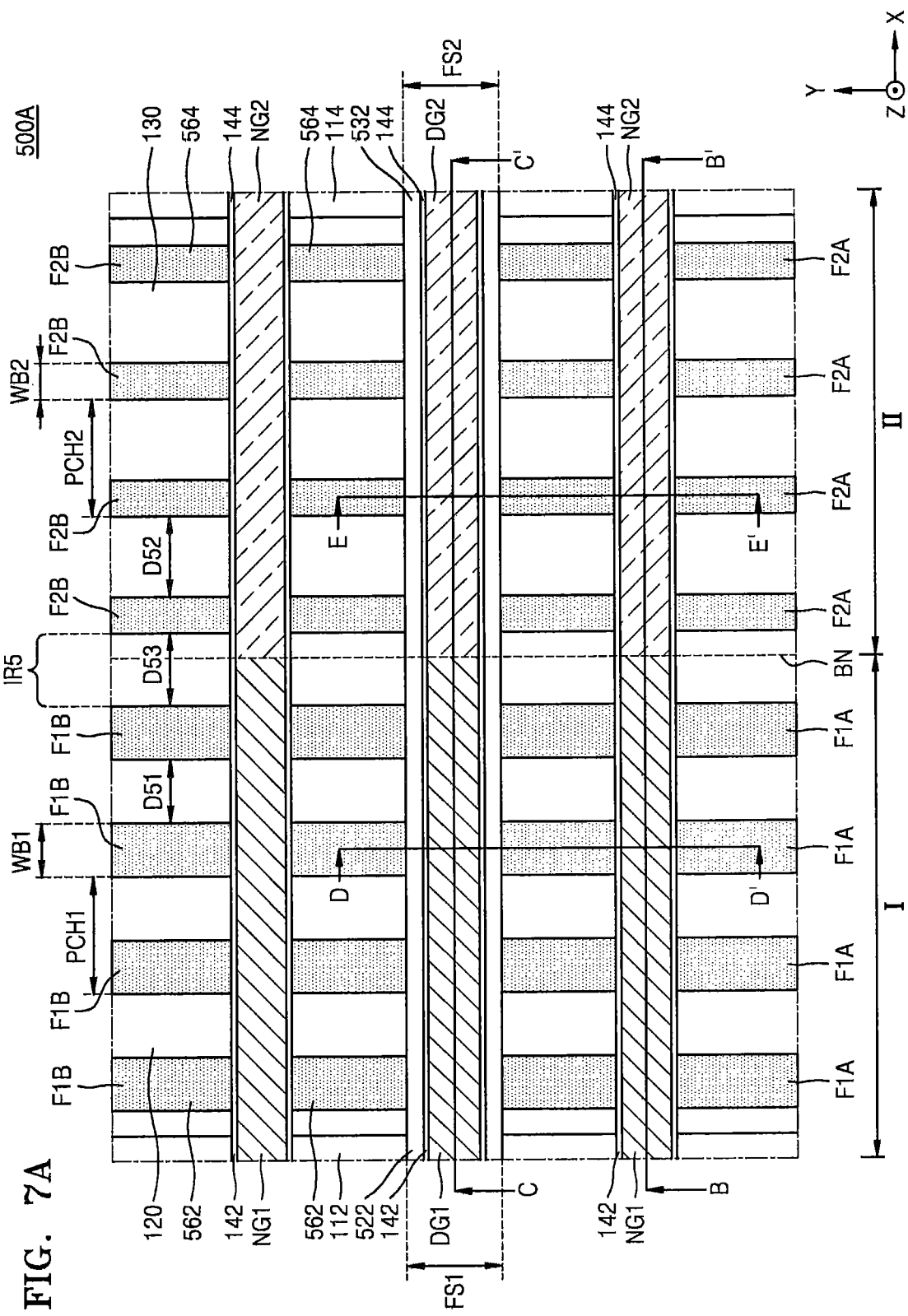
FIG. 7A is a plan layout diagram of some elements of an IC device according to other example embodiments.
Figure 7B:
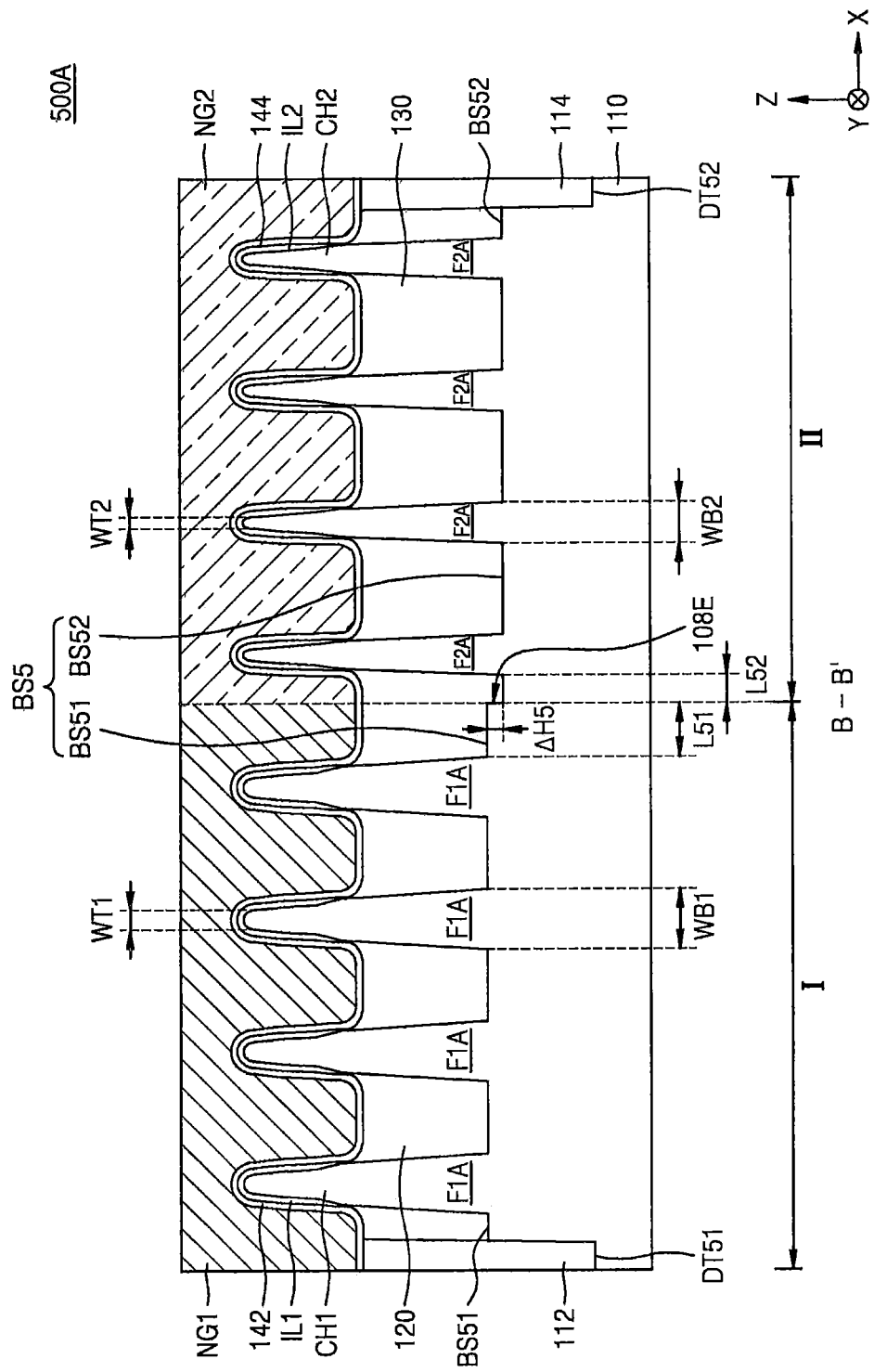
FIG. 7B is a cross-sectional view taken along a line B-B' of FIG. 7A.
Figure 7C:
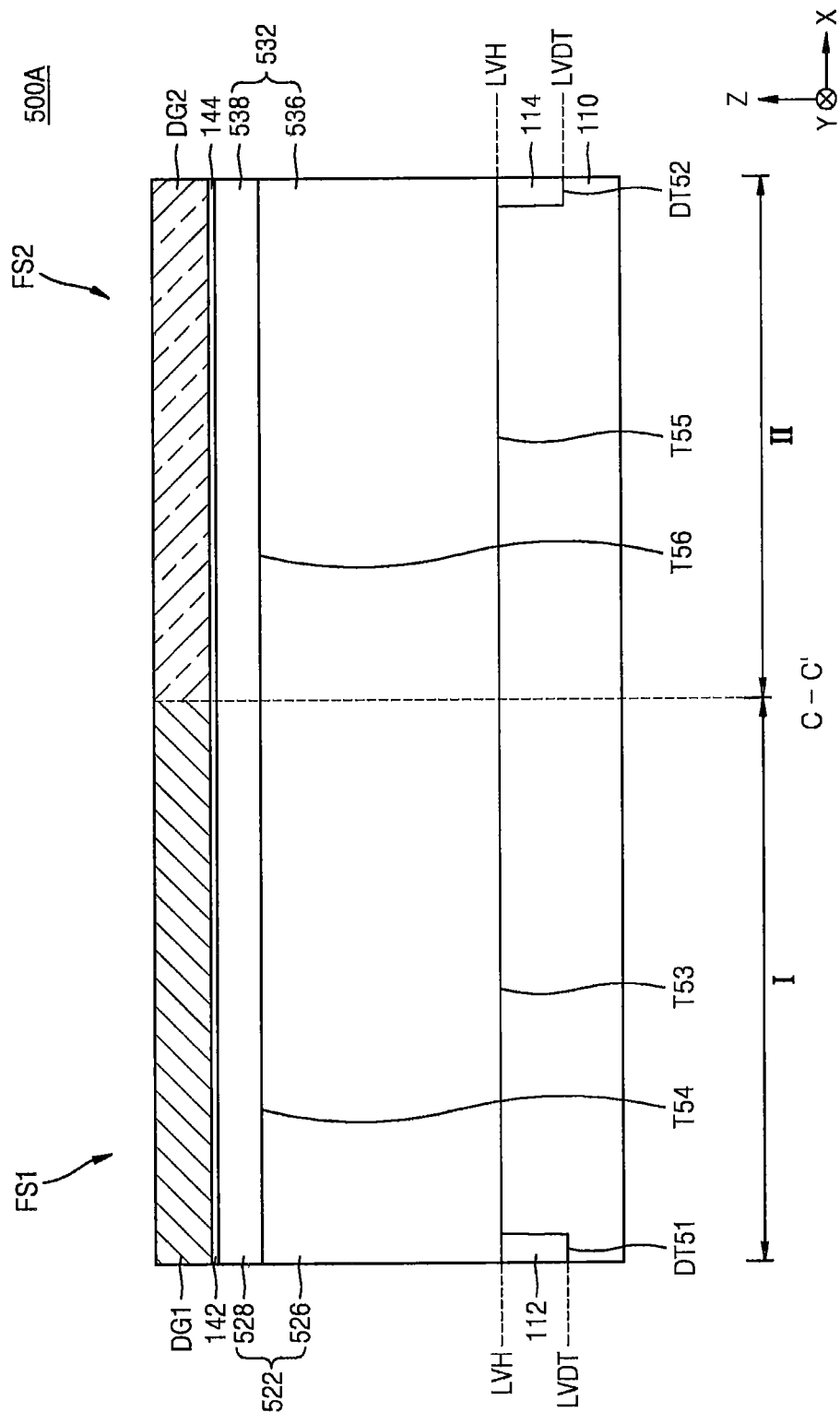
FIG. 7C is a cross-sectional view taken along a line C-C' of FIG. 7A.
Figure 7D:
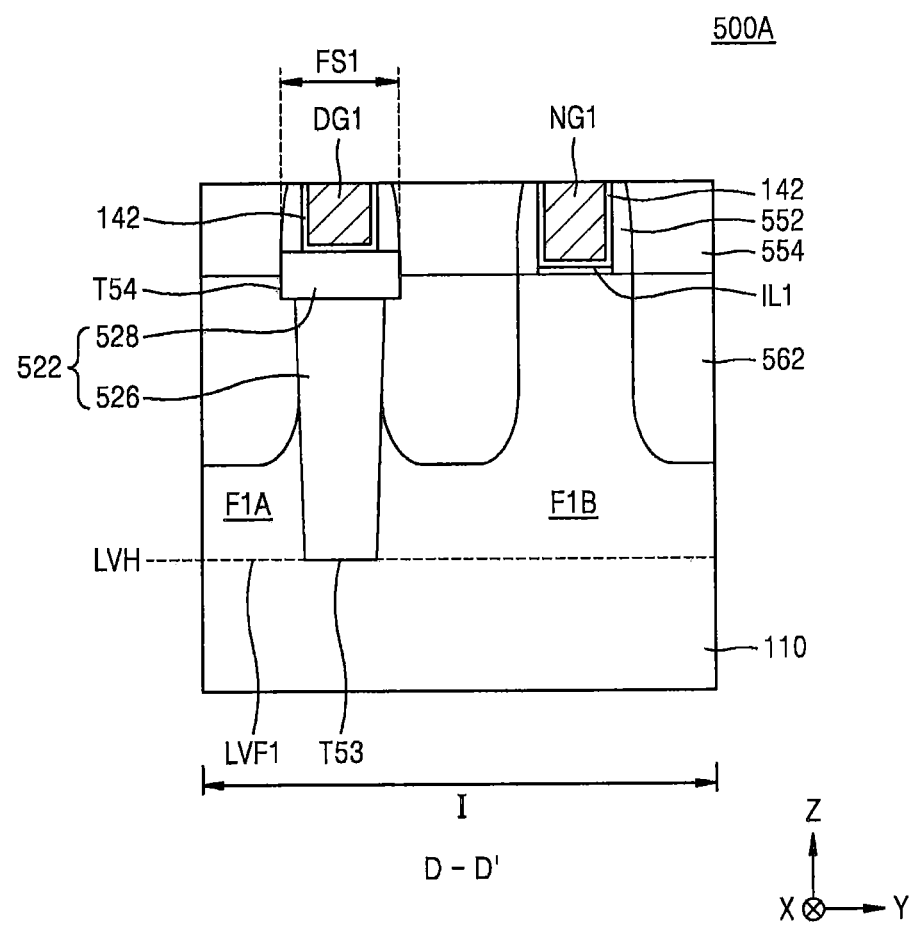
FIG. 7D is a cross-sectional view taken along a line D-D' of FIG. 7A.
Figure 7E:
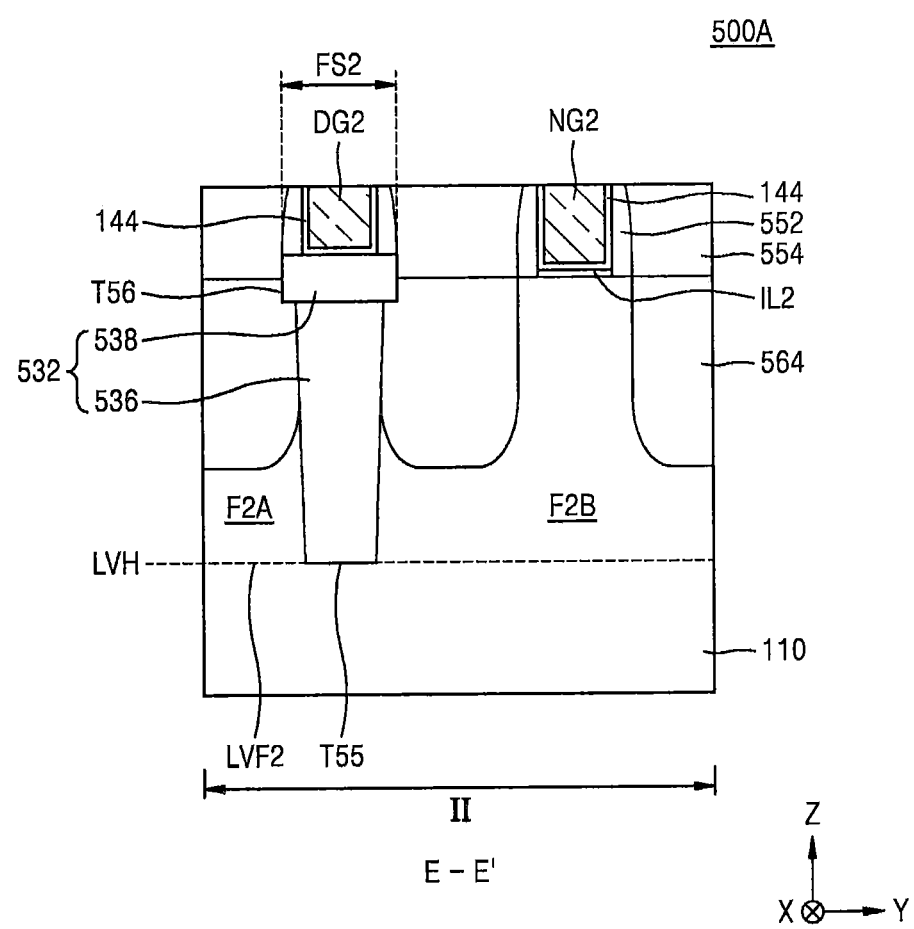
FIG. 7E is a cross-sectional view taken along a line E-E' of FIG. 7A.

FIGS. 7A to 7E are diagrams of an IC device 500A according to other example embodiments. More specifically, FIG. 7A is a plan layout diagram of some elements of an IC device 500A according to other example embodiments, FIG. 7B is a cross-sectional view taken along a line B-B' of FIG. 7A, and FIG. 7C is a cross-sectional view taken along a line C-C' of FIG. 7A. FIG. 7D is a cross-sectional view taken along a line D-D' of FIG. 7A, and FIG. 7E is a cross-sectional view taken along a line E-E' of FIG. 7A. In FIGS. 7A to 7E, the same reference numerals are used to denote the same elements as in FIGS. 1A to 6, and detailed descriptions thereof are omitted.

Referring to FIGS. 7A to 7E, an IC device 500A may include a substrate 110 having a first region I and a second region II.

A plurality of first-fin-type active regions F1A and F1B may protrude from the first region I of the substrate 110 in a direction (Z direction) perpendicular to a main surface of the substrate 110. Each of the plurality of first-fin-type active regions F1A and F1B may have a first-conductivity-type channel region CH1. Both sidewalls of each of the plurality of first-fin-type active regions F1A and F1B may be covered with a first device isolation layer 120 under the first-conductivity-type channel region CH1.

A plurality of second-fin-type active regions F2A and F2B may protrude from the second region II of the substrate 110 in the first direction (Z direction). Each of the plurality of second-fin-type active regions F2A and F2B may have a second-conductivity-type channel region CH2. Both sidewalls of each of the plurality of second-fin-type active regions F2A and F2B may be covered with a second device isolation layer 130 under the second-conductivity-type channel region CH2.

The plurality of first-fin-type active regions F1A and F1B and the plurality of second-fin-type active regions F2A and F2B may extend on the substrate 110 parallel to one another in one direction (Y direction).

Each of the plurality of first-fin-type active regions F1A may extend in a straight line with any one of the plurality of first-fin-type active regions F1B. The plurality of first-fin-type active regions F1A may be spaced apart from the plurality of first-fin-type active regions F1B such that a first fin isolation region FS1 is between the plurality of first-fin-type active regions F1A and the plurality of first-fin-type active regions F1B in an extension direction thereof.

Each of the plurality of second-fin-type active regions F2A may extend in a straight line with any one of the plurality of second-fin-type active regions F2B. The plurality of second-fin-type active regions F2A may be spaced apart from the plurality of second-fin-type active regions F2B such that a second fin isolation region FS2 is between the plurality of second-fin-type active regions F2A and the plurality of second-fin-type active regions F2B in an extension direction thereof.

In some embodiments, the first fin isolation region FS1 and the second fin isolation region FS2 may be connected to each other and extend in a straight line. In some other embodiments, the first fin isolation region FS1 may be spaced apart from the second fin isolation region FS2.

The number of first-fin-type active regions F1A and F1B and the number of second-fin-type active regions F2A and F2B are not limited to the examples shown in FIGS. 7A to 7E and may be variously selected depending on a device to be formed on the substrate 110.

In the first region I and the second region II, a plurality of normal gate lines NG1 and NG and dummy gate lines DG1 and DG2 may extend in a direction (X direction) that intersects an extension direction (Y direction) of the plurality of first-fin-type active regions F1A and F1B and the plurality of second-fin-type active regions F2A and F2B. The dummy gate lines DG1 and DG2 may be disposed in the first and second fin isolation regions FS1 and FS2.

Detailed descriptions of the plurality of first-fin-type active regions F1A and F1B may be generally the same as in the plurality of first-fin-type active regions F1 described with reference to FIGS. 3A and 3B.

The substrate 110 of the IC device 500A may have a plurality of bottom surfaces BS5, which may be interposed between the plurality of first-fin-type active regions F1A and F1B and the plurality of second-fin-type active regions F2A and F2B, respectively. An inter-region stepped portion 108E may be formed on one of the plurality of bottom surfaces BS5, which may be in an inter-region isolation region IRS formed in an interfacial portion between the plurality of first-fin-type active regions F1A and F1B and the plurality of second-fin-type active regions F2A and F2B.

The inter-region stepped portion 108E may extend in a lengthwise direction (Y direction) of the plurality of first-fin-type active regions F1A and F1B and the plurality of second-fin-type active regions F2A and F2B. The inter-region stepped portion 108E may extend along an interfacial portion BN between the first region I and the second region II, which is illustrated with a dashed line in FIG. 7A.

The plurality of first-fin-type active regions F1A and F1B and the plurality of second-fin-type active regions F2A and F2B may extend parallel to one another such that the inter-region stepped portion 108E is between the plurality of first-fin-type active regions F1A and F1B and the plurality of second-fin-type active regions F2A and F2B. In the widthwise direction (X direction) of the plurality of first-fin-type active regions F1A and F1B and the plurality of second-fin-type active regions F2A and F2B, the plurality of first-fin-type active regions F1A and F1B may be disposed at a first pitch CH1, and the plurality of second-fin-type active regions F2A and F2B may be disposed at second pitch PCH2. The first pitch PCH1 may be equal to the second pitch PCH2.

The plurality of first-fin-type active regions F1A and MB may be spaced a first space D51 apart from one another in the widthwise direction (X direction), and the plurality of second-fin-type active regions F2A and F2B may be spaced a second space D52 apart from one another in the widthwise direction (X direction). The second space D52 may be greater than the first space D51.

The first-fin-type active regions F1A and F1B and the second-fin-type active regions F2A and F2B, which may face each other across the inter-region isolation region IRS, may be spaced a third space D53 apart from one another. The third space D53 may be greater than the first space D51 and less than the second space D52.

The bottom surfaces BS5 may extend at different levels in the first region I and the second region II. The inter-region stepped portion 108E may be formed due to a height difference ΔH5 of the bottom surfaces BS5 formed in the first region I and the second region II.

The inter-region stepped portion 108E may extend along an interfacial portion between a first bottom unit BS51 formed in the first region I and a second bottom unit BS22 formed in the second region II.

A shortest distance L51 from the inter-region stepped portion 108E to one of the plurality of first-fin-type active regions F1A and F1B, which is nearest to the inter-region stepped portion 108E, may be greater than a shortest distance L52 from the inter-region stepped portion 108E to one of the plurality of second-fin-type active regions F2A and F2B, which is nearest to the inter-region stepped portion 108E.

As partially shown in FIG. 7B, a first interface layer IL1 and a second gate insulating layer 142 may be interposed between the first-conductivity-type channel regions CH1 of the plurality of first-fin-type active regions F1A and F1B and the plurality of normal gate lines NG1 in the first region I. Also, a second interface layer IL2 and a second gate insulating layer 144 may be interposed between the second-conductivity-type channel regions CH2 of the plurality of second-fin-type active regions F2A and F2B and the plurality of normal gate lines NG2 in the second region II.

In the first region I of the IC device 500A, the first device isolation layer 120 may provide insulating regions between the plurality of first-fin-type active regions F1A and between the plurality of first-fin-type active regions FIB. A first deep trench DT51 formed in a partial region of the first region I may be filled with a first inter-device isolation layer 112.

A first fin isolation insulating layer 522 may be formed in the first fin isolation region FS1 of the first region I, which extends in a direction (X direction) that intersects an extension direction (Y direction) of the plurality of first-fin-type active regions F1A and F1B between the plurality of first-fin-type active regions F1A and the plurality of first-fin-type active regions F1B.

The first fin isolation insulating layer 522 may be disposed in a region between a pair of first-fin-type active regions F1A and F1B, which are adjacent to each other in a major-axis direction (X direction in FIG. 7A) of the plurality of first-fin-type active regions F1A and F1B). Also, the first fin isolation insulating layer 522 may extend in a direction that intersects the plurality of first-fin-type active regions F1A and F1B.

As shown in FIG. 7D, the first fin isolation insulating layer 522 may have a top surface that is at a higher level than top surfaces of the plurality of first-fin-type active regions F1A and F1B. However, the inventive concepts are not limited to the example shown in FIG. 7D, and the first fin isolation insulating layer 522 may have a top surface that is at the same level as the top surfaces of the plurality of first-fin-type active regions F1A and F1B. As shown in FIG. 7D, the first fin isolation insulating layer 522 may have a sidewall that faces one end of each of a pair of first-fin-type active regions F1A and F1B, which are adjacent to each other in a straight line, in the first fin isolation region FS1 interposed between the one pair of first-fin-type active regions F1A and F1B. The first fin isolation insulating layer 522 may include a first lower fin isolation insulating layer 526 and a first upper fin isolation insulating layer 528. The first lower fin isolation insulating layer 526 may fill a fin isolation trench T53, which may extend in a direction parallel to the plurality of normal gate line NG1 and the dummy gate line DG1. The first upper fin isolation insulating layer 528 may fill an upper trench T54, which may be formed on the fin isolation trench T53 to communicate with the fin isolation trench T53. The upper trench T54 may have a greater width than the first isolation trench T53.

In some embodiments, the first lower fin isolation insulating layer 526 and the first upper fin isolation insulating layer 528 may include an oxide layer. For example, the first lower fin isolation insulating layer 526 and the first upper fin isolation insulating layer 528 may include FSG, USG, BPSG, PSG, FOX, PE-TEOS, or TOSZ.

As shown in FIG. 7A, one dummy gate line DG1 may be formed on one first fin isolation insulating layer 522 such that the first fin isolation insulating layer 522 corresponds one-to-one to the dummy gate line DG1. The dummy gate line DG1 may be disposed between a pair of adjacent normal gate lines NG1. The first fin isolation insulating layer 522 may vertically overlap the dummy gate line DG1, and extend along with the dummy gate line DG1 in a direction (X direction) that intersects an extension direction (Y direction) of the plurality of first-fin-type active regions F1A and F1B.

In the second region II of the IC device 500A, the second device isolation layer 130 may provide insulating regions between the plurality of second-fin-type active regions F2A and between the plurality of second-fin-type active regions F2B. A second deep trench DT52 formed in a partial region of the second region II may be filled with a second inter-device isolation layer 114.

A second fin isolation insulating layer 532 may be formed in the second fin isolation region FS2, which may extend in a direction (X direction) that intersects the extension direction (Y direction) of the plurality of second-fin-type active regions F2A and F2B between the plurality of second-fin-type active regions F2A and the plurality of second-fin-type active regions F2b in the second region II.

The second fin isolation insulating layer 532 may be disposed in a region between a pair of second-fin-type active regions F2A and F2B, which are adjacent to each other in a major-axis direction (refer to Y direction in FIG. 7A) of the plurality of second-fin-type active regions F2A and F2B, and extend in a direction that intersects the plurality of second-fin-type active regions F2A and F2B.

As shown in FIG. 7E, the second fin isolation insulating layer 532 may have a top surface that is at a higher level than top surfaces of the plurality of second-fin-type active regions F2A and F2B. However, the inventive concepts are not limited to the example shown in FIG. 7E, and the second fin isolation insulating layer 532 may have a top surface that is at the same level as the top surfaces of the plurality of second-fin-type active regions F2A and F2B.

As shown in FIG. 7E, the first fin isolation insulating layer 532 may have a sidewall that faces one end of each of a pair of second-fin-type active regions F2A and F2B, which are adjacent to each other in a straight line, in the second fin isolation region FS2 interposed between the pair of second-fin-type active regions F2A and F2B. The second fin isolation insulating layer 532 may include a second lower fin isolation insulating layer 536 and a second upper fin isolation insulating layer 538. The second lower fin isolation insulating layer 536 may fill a fin isolation trench T55, which may extend in a direction parallel to the plurality of normal gate lines NG2 and the dummy gate line DG2 in the second fin isolation region FS2. The second upper fin isolation insulating layer 538 may fill an upper trench T56, which may be formed on the fin isolation trench T55 to communicate with the fin isolation trench T55. The upper trench T56 may have a greater width than the fin isolation trench T55.

In some embodiments, the second lower fin isolation insulating layer 536 and the second upper fin isolation insulating layer 538 may include an oxide layer. For example, the second lower fin isolation insulating layer 536 and the second upper fin isolation insulating layer 538 may include FSG, USG, BPSG, PSG, FOX, PE-TEOS, or TOSZ.

A bottom surface of the fin isolation trench T53 formed in the first region I and a bottom surface of the fin isolation trench T55 formed in the second region II may extend at the same level.

The first inter-device isolation layer 112 filling the first deep trench DT51 in the first region I may have a top surface that is covered with the first upper fin isolation insulating layer 528 filling the upper trench T54. The second inter-device isolation layer 114 filling the second deep trench DT62 in the second region II may have a top surface that is covered with the second upper fin isolation insulating layer 588 filling the upper trench T56.

As shown in FIG. 7A, one dummy gate line DG2 may be formed on one second fin isolation insulating layer 532 such that the second fin isolation insulating layer 532 corresponds one-to-one to the dummy gate line DG2. The dummy gate line DG2 may be disposed between a pair of adjacent normal gate lines NG2. The second fin isolation insulating layer 532 may vertically overlap the dummy gate line DG2. The second fin isolation insulating layer 532 may extend along with the dummy gate line DG2 in a direction (X direction) that intersects the extension direction (Y direction) of the plurality of second-fin-type active regions F2A and F2B.

In some embodiments, a bottom level LVDT of the first and second inter-device isolation layers 112 and 114 formed in the first and second deep trenches DT51 and DT52 (refer to FIGS. 7B and 7C) may be lower than a bottom level LVH of the first fin isolation insulating layer 522 and the second fin isolation insulating layer 532.

The plurality of normal gate line NG1 and the dummy gate line DG1 formed in the first region I and the plurality of normal gate line NG2 and the dummy gate line DG2 formed in the second region II may have substantially the same configurations as the first gate line 152 and the second gate line 154 described with reference to FIGS. 1A and 1B.

Both sidewalls of each of the plurality of normal gate lines NG1 and the dummy gate line DG1 formed in the first region I and the plurality of normal gate lines NG2 and the dummy gate line DG2 formed in the second region II may be covered with insulating spacers 552 and an inter-gate insulating layer 554. In some embodiments, the insulating spacers 552 may include a silicon nitride ($Si_3N_4$) layer, a silicon oxynitride (SiON) layer, a carbon-containing silicon oxynitride (SiCON) layer, and a combination thereof. In some embodiments, the inter-gate insulating layer 554 may include a tetra ethyl ortho silicate (TEOS) layer or a ultralow K (ULK) layer having a ultralow dielectric constant K of about 2.2 to 2.4, for example, any one layer selected out of a SiOC layer and a SiCOH layer.

In some embodiments, the plurality of normal gate lines NG1 and NG2 and the dummy gate lines DG1 and DG2 may be formed by using a gate-last process (or referred to as a replacement poly-gate (RPG) process), but the inventive concepts are not limited thereto.

As shown in FIG. 7D, in the first region I, a first gate insulating layer 142 may be interposed between the plurality of normal gate lines NG1 and the plurality of first-fin-type active regions F1A and F1B and between the dummy gate line DG1 and the first upper fin isolation insulating layer 528.

As shown in FIG. 7D, source and drain regions 562 may be formed on both sides of each of the plurality of normal gate lines NG1 of the plurality of first-fin-type active regions F1A and F1B in the first region I. From among the plurality of source and drain regions 562 formed in the plurality of first-fin-type active regions F1A and FIB, portions of the source and drain regions 562 disposed on both sides of the first fin isolation region FS1 may vertically overlap the first upper fin isolation insulating layer 528 and the insulating spacers 552 formed within the upper trench T54, and have 'tuck' shapes pushed or tucked under the first upper fin isolation insulating layer 528.

In the second region II, a second gate insulating layer 144 may be interposed between the plurality of normal gate lines NG2 and the plurality of second-fin-type active regions F2A and F2B and between the dummy gate line DG2 and the second upper fin isolation insulating layer 538.

As shown in FIG. 7E, in the second region II, source and drain regions 564 may be formed on both sides of each of the plurality of normal gate lines NG2 of the plurality of second-fin-type active regions F2A and F2B in the second region II. From among the plurality of source and drain regions 564 formed in the plurality of second-fin-type active regions F2A and F2B, portions of the source and drain regions 564 disposed on both sides of the second fin isolation region FS2 may vertically overlap the second upper fin isolation insulating layer 538 and the insulating spacers 552 formed within the upper trench T56, and have tuck shapes pushed under the second upper fin isolation insulating layer 538.

In some embodiments, the IC device 500A may include the first device isolation layer 120A and the second device isolation layer 130A described with reference to FIG. 2A instead of the first device isolation layer 120 and the second device isolation layer 130.

In some embodiments, at least a portion of a second-conductivity-type channel region CH2 of each of the plurality of second-fin-type active regions F2A and F2B formed in the second region II of the IC device 500A may include a different material from the remaining portion of the second-conductivity-type channel region CH2 of each of the second-fin-type active regions F2A and F2B. For example, a selected partial region of the second-conductivity-type channel region CH2 of each of the plurality of second-fin-type active regions F2A and F2B may include germanium, and the remaining region of the second-conductivity-type channel region CH2 may include silicon.

In some embodiments, in the IC device 500A, each of the plurality of first-fin-type active regions F1A and F1B may further include the first insertion layer FL1 shown in FIG. 2B, and each of the plurality of second-fin-type active regions F2A and F2B may further include the second insertion layer FL2 shown in FIG. 2B.

The IC device 500A shown in FIGS. 7A to 7E may have substantially the same effects as those of the IC device 200A described with reference to FIGS. 3A and 3B.

Figure 8A:
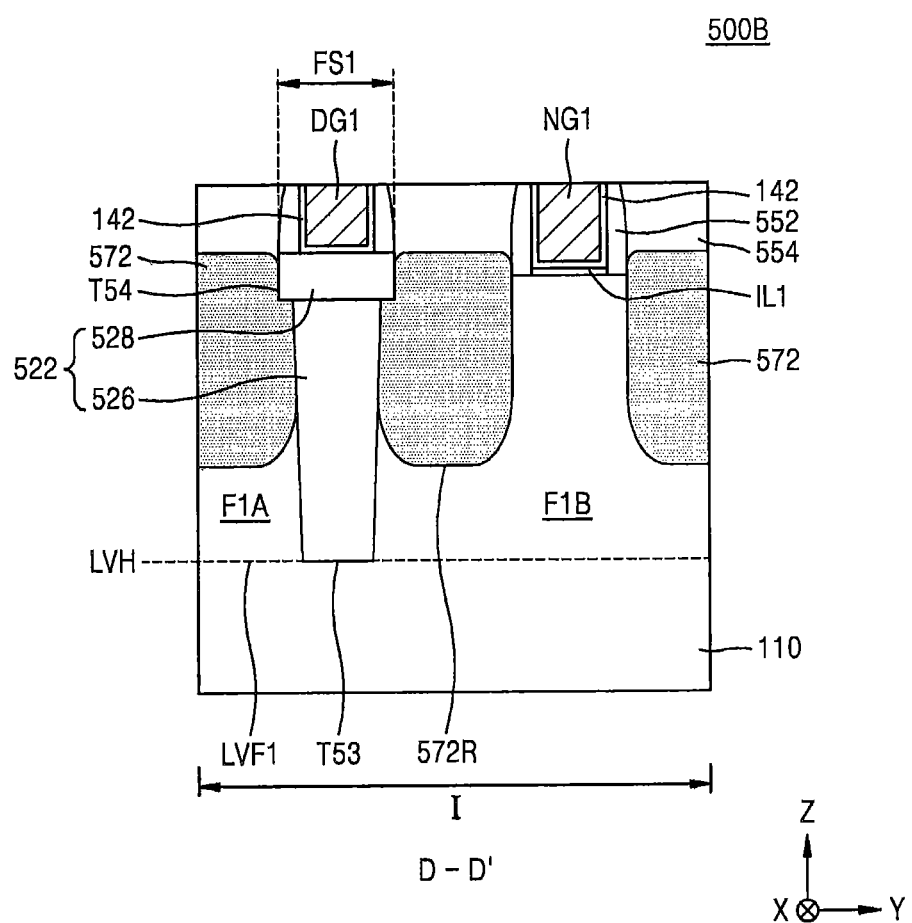
FIGS. 8A and 8B are diagrams of an IC device according to other example embodiments.
Figure 8B:
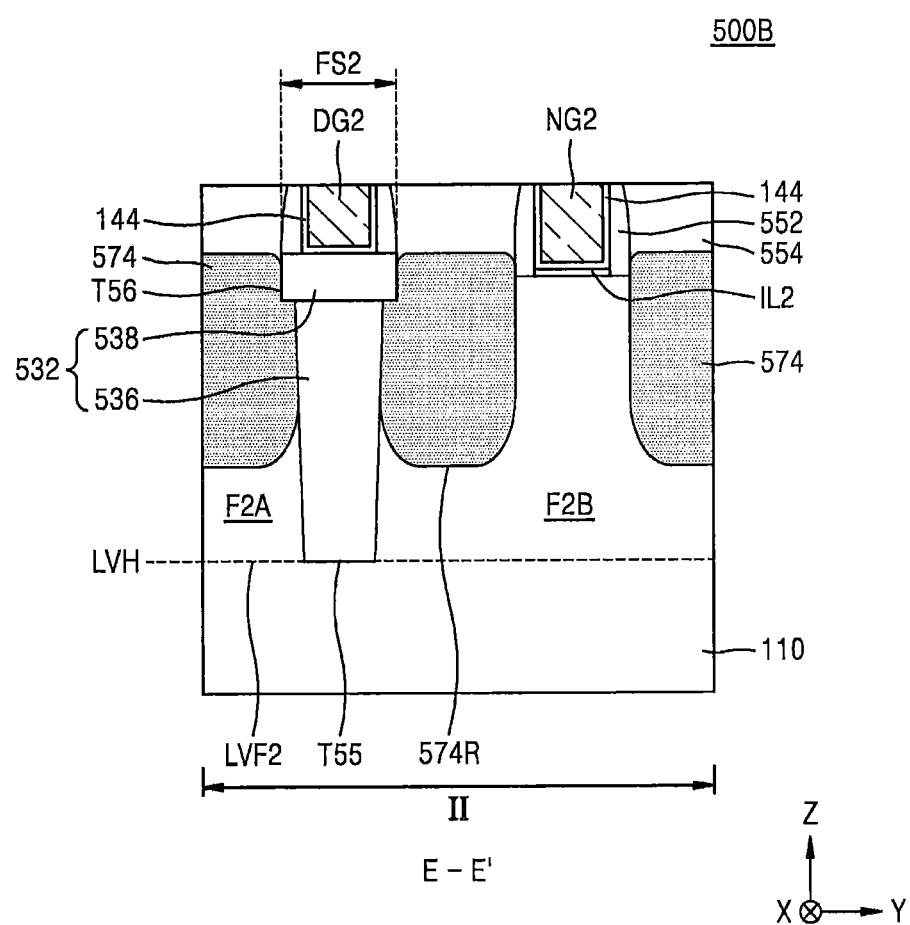

FIGS. 8A and 8B are diagrams of an IC device 500B according to other example embodiments. The IC device 500B shown in FIGS. 8A and 8B may have the same plan layout as shown in FIG. 7A. FIG. 8A is a cross-sectional view of a portion corresponding to the line D-D' of FIG. 7A, and FIG. 8B is a cross-sectional view of a portion corresponding to the line E-E' of FIG. 7A. In FIGS. 8A and 8B, the same reference numerals are used to denote the same elements as in FIGS. 1A to 7E, and detailed descriptions thereof are omitted.

Referring to FIGS. 8A and 8B, the IC device 500B may have generally the same configuration as the IC device 500A described with reference to FIGS. 7A to 7E except that source and drain regions 572 having raised source and drain (RSD) structures may be formed in the first fin-type active regions F1A and F1B formed in the first region I and source and rain regions 574 having RSD structures may be formed in the second fin-type active regions F2A and F2B formed in the second region II.

More specifically, in the first region I, RSD-type source and drain regions 572 may be formed in the plurality of first-fin-type active regions F1A and F1B on both sides of the normal gate line NG1. Also, in the second region II, RSD-type source and drain regions 574 may be formed in the plurality of second-fin-type active regions F2A and F2B on both sides of the normal gate line NG2.

To form the source and drain regions 572 and 574 in the first region I and the second region II, respectively, recesses 572R and 574R may be formed by removing portions of the first and second-fin-type active regions F1A and F1B and F2A and F2B. Thereafter, a semiconductor layer required for forming the source and drain regions 572 and 574 may be formed within the recesses 572R and 574R by using an epitaxial growth process. In some embodiments, the source and drain regions 572 may include silicon or silicon carbide in the first region I. An N+ doping process may be performed during the process of epitaxially growing the semiconductor layer including silicon or silicon carbide in the first region I. Source and drain regions 574 may include silicon germanium (SiGe) in the second region II. A P+ doping process may be performed during the process of epitaxially growing the semiconductor layer including SiGe in the second region II.

Top surfaces of the source and drain regions 572 and 574 may be formed at a higher level than top surfaces of the first and second-fin-type active region F1A, F1B, F2A, and F2B.

In the first region I, portions of the source and drain regions 572 disposed on both sides of the first fin isolation region FS1, from among the plurality of source and drain regions 572 formed in the plurality of first-fin-type active regions F1A and F1B, may vertically overlap the first upper fin isolation insulating layer 528 and the insulating spacers 552 formed within the upper trench T54, and have tuck shapes pushed under the first upper fin isolation insulating layer 528.

In the second region II, portions of the source and drain regions 574 disposed on both sides of the second fin isolation region FS2, from among the plurality of source and drain regions 574 formed in the plurality of second-fin-type active regions F2A and F2B, may vertically overlap a second upper fin isolation insulating layer 538 and the insulating spacers 552 formed within the upper trench T56, and have tuck shapes pushed under the second upper fin isolation insulating layer 538.

In the IC devices 500A and 500B shown in FIGS. 7A to 8B, a first fin isolation insulating layer 522 may be formed under a dummy gate line DG1 in the first region I, and a second fin isolation insulating layer 532 may be disposed under a dummy gate line DG2 in the second region II. The first fin isolation insulating layer 522 and the second fin isolation insulating layer 532 may have top surfaces disposed at the same level as or at a higher level than top surfaces of the plurality of first and second-fin-type active regions F1A, F1B, F2A, and F2B, respectively. Thus, the dummy gate lines DG1 and DG2 may not be disposed in respective spaces between the plurality of first and second-fin-type active regions F1A, F1B, F2A, and F2B. Accordingly, as compared with a case in which the top surfaces of the first fin isolation insulating layer 522 and the second fin isolation insulating layer 532 are at lower levels than the top surfaces of the plurality of first and second-fin-type active regions F1A, F1B, F2A, and F2B, respectively, parasitic capacitances formed between the dummy gate lines DG1 and DG2 and the plurality of first and second-fin-type active regions F1A, F1B, F2A, and F2B may be reduced. Also, a leakage current may be inhibited by ensuring a distance between the dummy gate lines DG1 and DG2 and the plurality of first and second-fin-type active regions F1A, F1B, F2A, and F2B. Also, the first and second upper fin isolation regions 528 and 538 may be formed to have a greater width than the dummy gate lines DG1 and DG2 in the first fin isolation insulating layer 522 and the second fin isolation insulating layer 532. Thus, when the dummy gate lines DG1 and DG2 are formed on the first fin isolation insulating layer 522 and the second fin isolation insulating layer 532, an alignment margin may be ensured.

Figure 9:
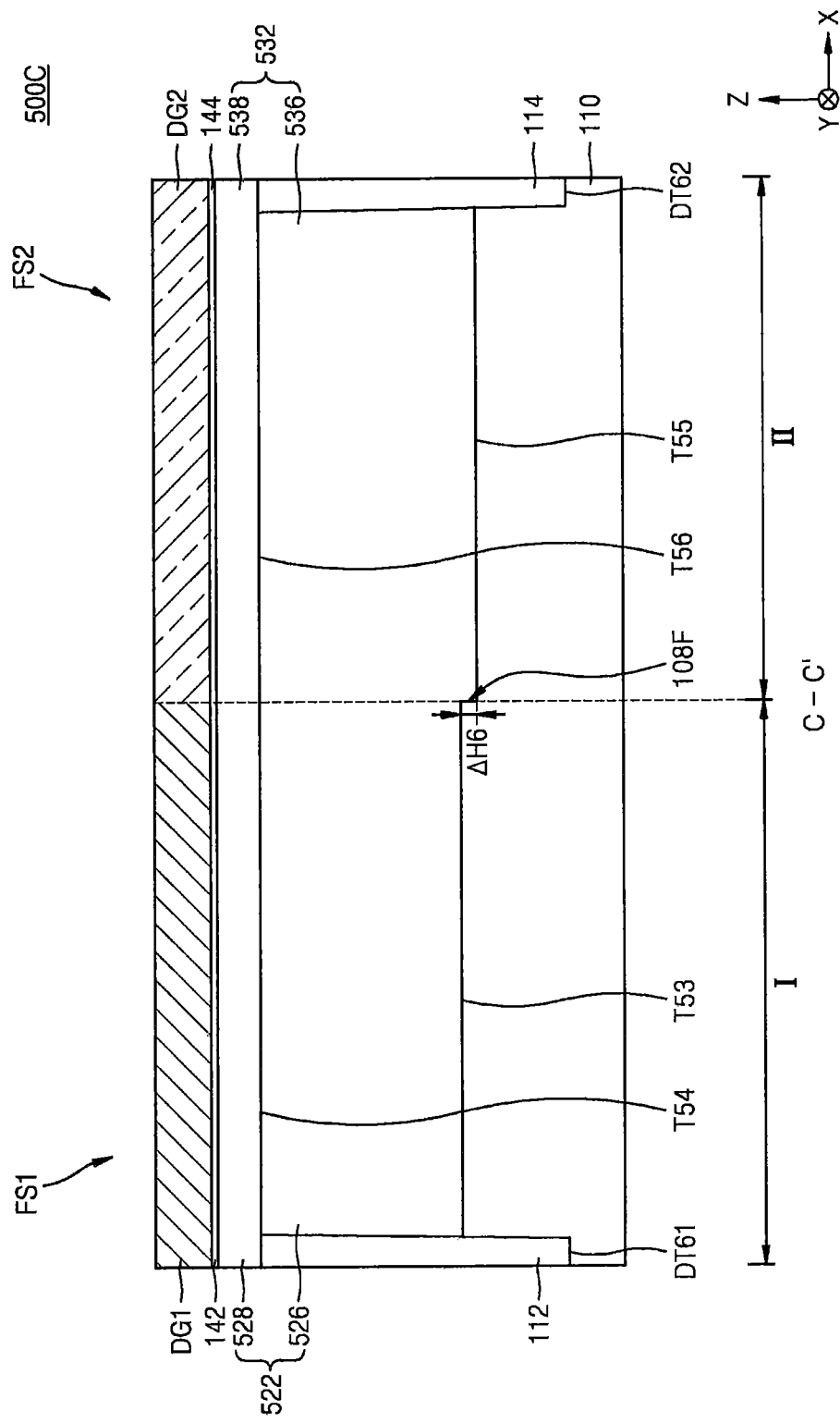
FIG. 9 is a cross-sectional view of an IC device according to another example embodiment.

FIG. 9 is a cross-sectional view of an IC device 500C according to another example embodiment. The IC device 500C shown in FIG. 9 may have the same plan layout as shown in FIG. 7A. FIG. 9 is a cross-sectional view corresponding to the line C-C' of FIG. 7A. In FIG. 9, the same reference numerals are used to denote the same elements as in FIGS. 1A to 7E, and detailed descriptions thereof are omitted.

The IC device 500C shown in FIG. 9 may have generally the same configuration as the IC device 500A shown in FIGS. 7A to 7E except that an inter-region stepped portion 108F is formed between a bottom surface of a fin isolation trench T53 formed in a first region I and a bottom surface of a fin isolation trench T55 formed in a second region II. The bottom surface of the fin isolation trench T53 formed in the first region I and the bottom surface of the fin isolation trench T55 formed in the second region II may extend at different levels. The inter-region stepped portion 108F may be formed due to a height difference ΔH6 between the fin isolation trench T53 formed in the first region I and the fin isolation trench T55 formed in the second region II.

The first and second fin isolation insulating layers 522 and 532 may extend on or cover a portion of the inter-region stepped portion 108F and extend in a direction that intersects an extension direction of the inter-region stepped portion 108F.

As in the plan layout shown in FIG. 7A, one sidewalls of the first and second fin isolation insulating layers 522 and 532 may face one end of each of a plurality of first-fin-type active regions F1A and one end of each of a plurality of second-fin-type active regions F2A. The other sidewalls of the first and second fin isolation insulating layers 522 and 532 may face one end of each of a plurality of first-fin-type active regions F1B and one end of each of a plurality of second-fin-type active regions F2B. Also, the dummy gate lines DG1 and DG2 may extend on the first and second fin isolation insulating layer 522 and 532 parallel to the normal gate lines NG1 and MG2.

A first inter-device isolation layer 112 filling a first deep trench DT61 in the first region I may extend on or cover sidewalls of a first lower fin isolation insulating layer 526 filling a fin isolation trench T53. A top surface of the first inter-device isolation layer 112 may be covered with a first upper fin isolation insulating layer 528 filling an upper trench T54.

A second inter-device isolation layer 114 filling a second deep trench DT62 in the second region II may extend on or cover sidewalls of a second lower fin isolation insulating layer 536 filling a fin isolation trench T55. A top surface of the second inter-device isolation layer 114 may be covered with a second upper fin isolation insulating layer 588 filling an upper trench T56.

Figure 10:
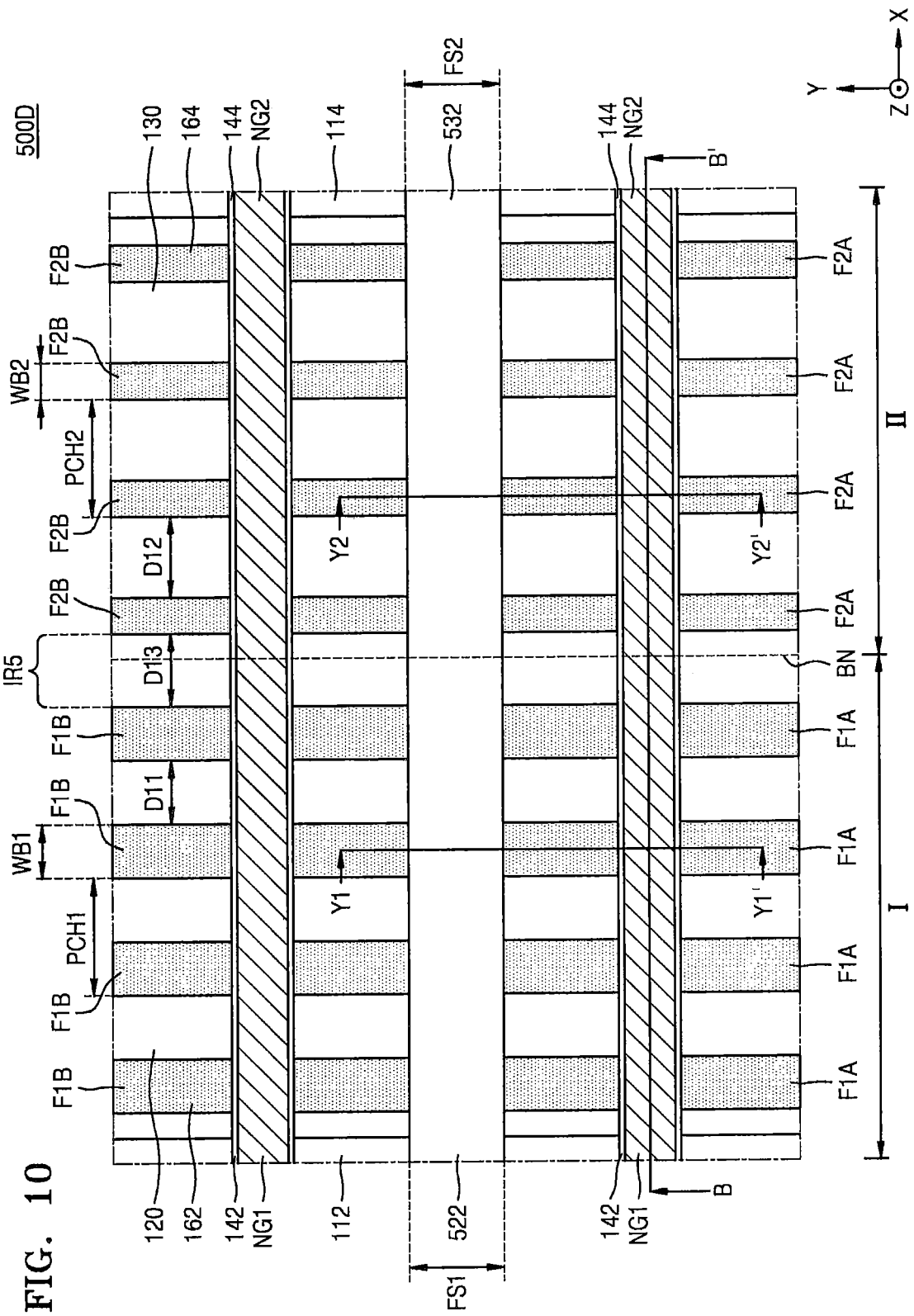
FIG. 10 is a plan layout diagram of an IC device according to other example embodiments.

FIG. 10 is a plan layout diagram of some elements of an IC device 500D according to other example embodiments.

The IC device 500D may have generally the same configuration as the IC device 500A shown in FIGS. 7A to 7E except that dummy gates are not formed over a first fin isolation insulating layer 522 and a second fin isolation insulating layer 532 in first and second fin isolation regions FS1 and FS2.

Figure 11A:
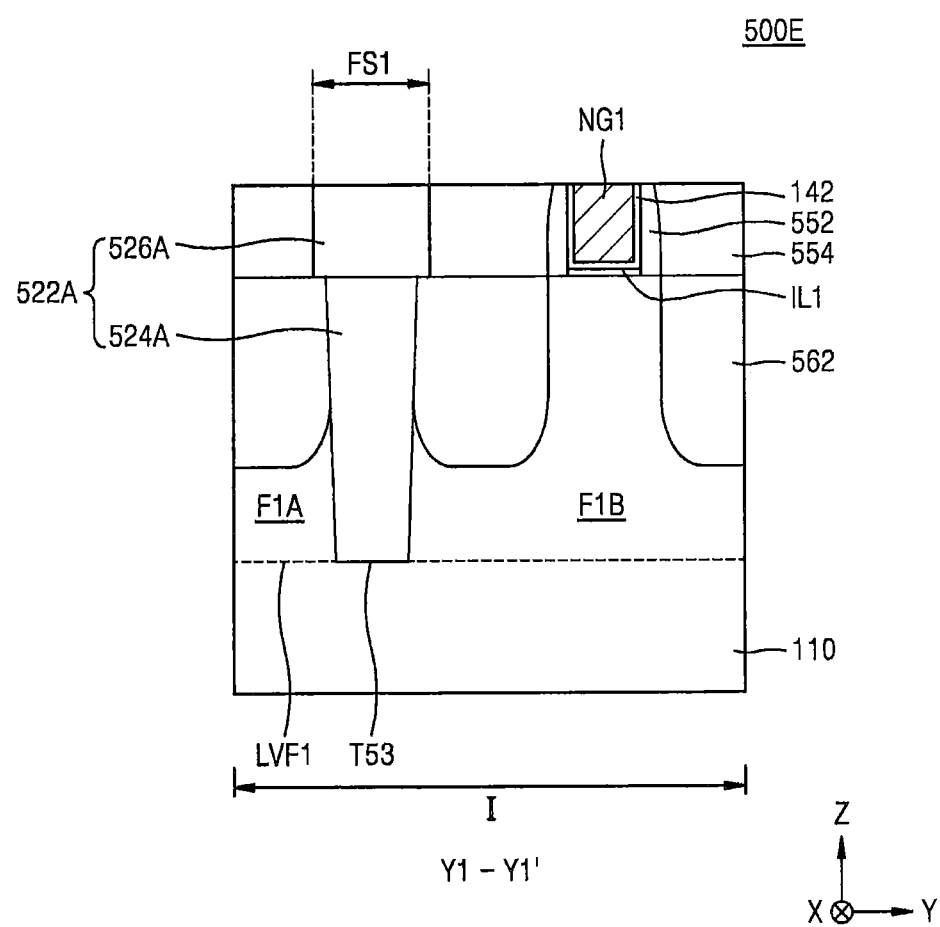
FIGS. 11A and 11B are cross-sectional views of an IC device according to other example embodiments.
Figure 11B:
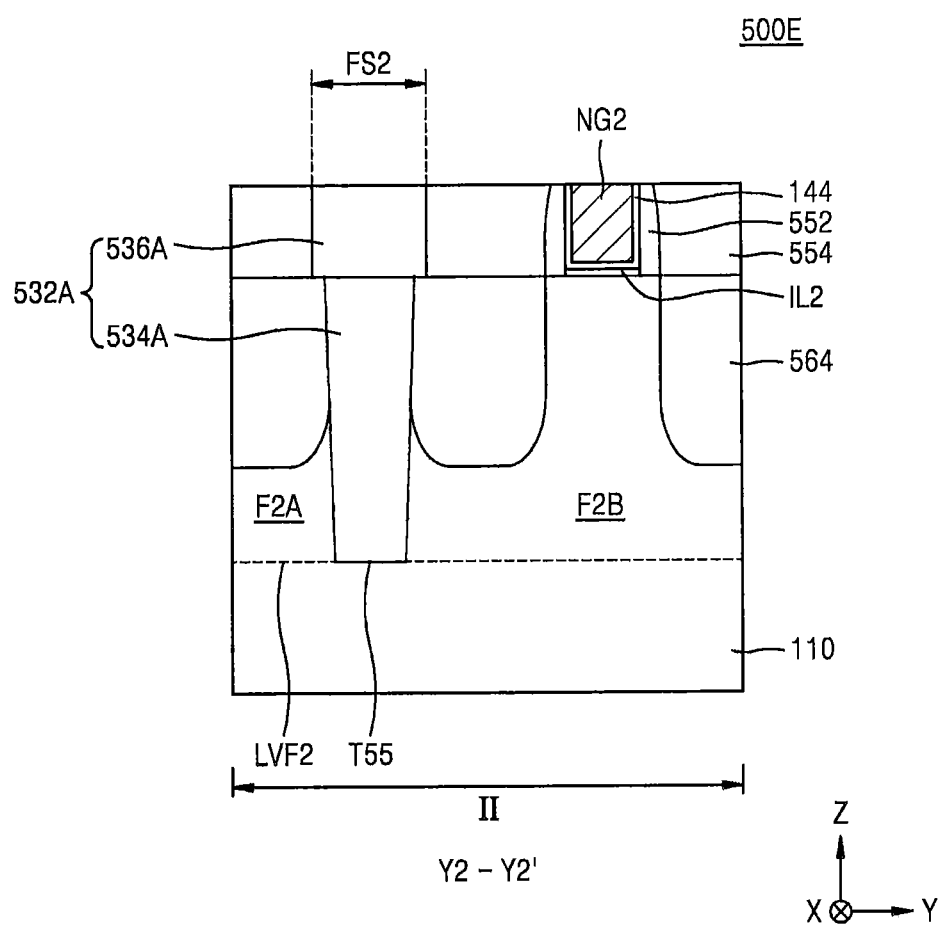

FIGS. 11A and 11B are cross-sectional views of an IC device 500E according to other example embodiments.

The IC device 500E may have the same plan layout as shown in FIG. 10. More specifically, FIG. 11A is a cross-sectional view of a portion corresponding to the line Y1-Y1' of FIG. 10, and FIG. 11B is a cross-sectional view of a portion corresponding to the line Y2-Y2' of FIG. 10. In FIGS. 11A and 11B, the same reference numerals are used to denote the same elements as in FIGS. 1A to 10, and detailed descriptions thereof are omitted.

Referring to FIGS. 11A and 11B, the IC device 500E may have generally the same configuration as the IC device 500A shown in FIGS. 7A to 7E except that the IC device 500E includes a first fin isolation insulating layer 522A formed in a first region I instead of the first fin isolation insulating layer 522 shown in FIG. 10. The first fin isolation insulating layer 522A may include a first fin isolation insulating layer 524A, which may be in contact with a plurality of first-fin-type active regions F1A and a plurality of first-fin-type active regions F1B and fill a first fin isolation region FS1, and an insulating line 526A, which may extend on the first fin isolation insulating layer 524A parallel to a normal gate line NG1. Also, the IC device 500E may include a second fin isolation insulating layer 532A formed in a second region II instead of the second fin isolation insulating layer 532 shown in FIG. 10. The second fin isolation insulating layer 532A may include a second fin isolation insulating layer 534A, which may be in contact with a plurality of second-fin-type active regions F2A and a plurality of second-fin-type active regions F2B and fill a second fin isolation region FS2, and an insulating line 536A, which may extend on the first fin isolation insulating layer 534A parallel to a normal gate line NG2.

Dummy gates may not be formed over the first fin isolation insulating layer 522A and the second fin isolation insulating layer 532A in the first and second fin isolation regions FS1 and FS2.

Figure 12A:
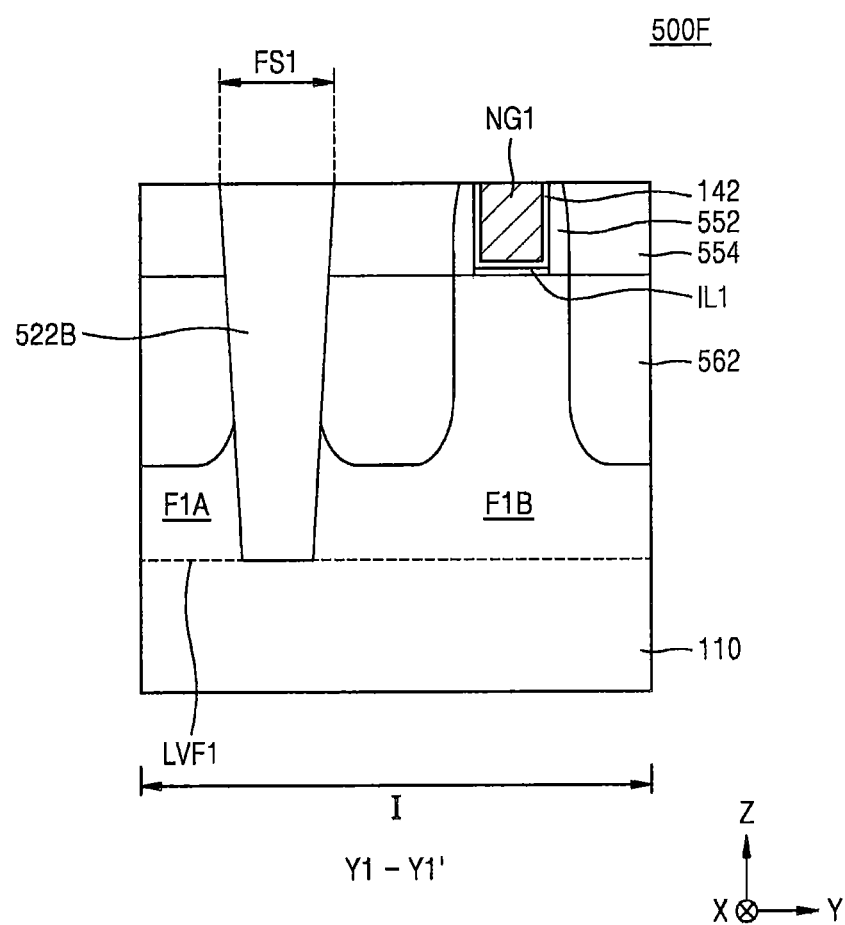
FIGS. 12A and 12B are cross-sectional views of an IC device according to other example embodiments.
Figure 12B:
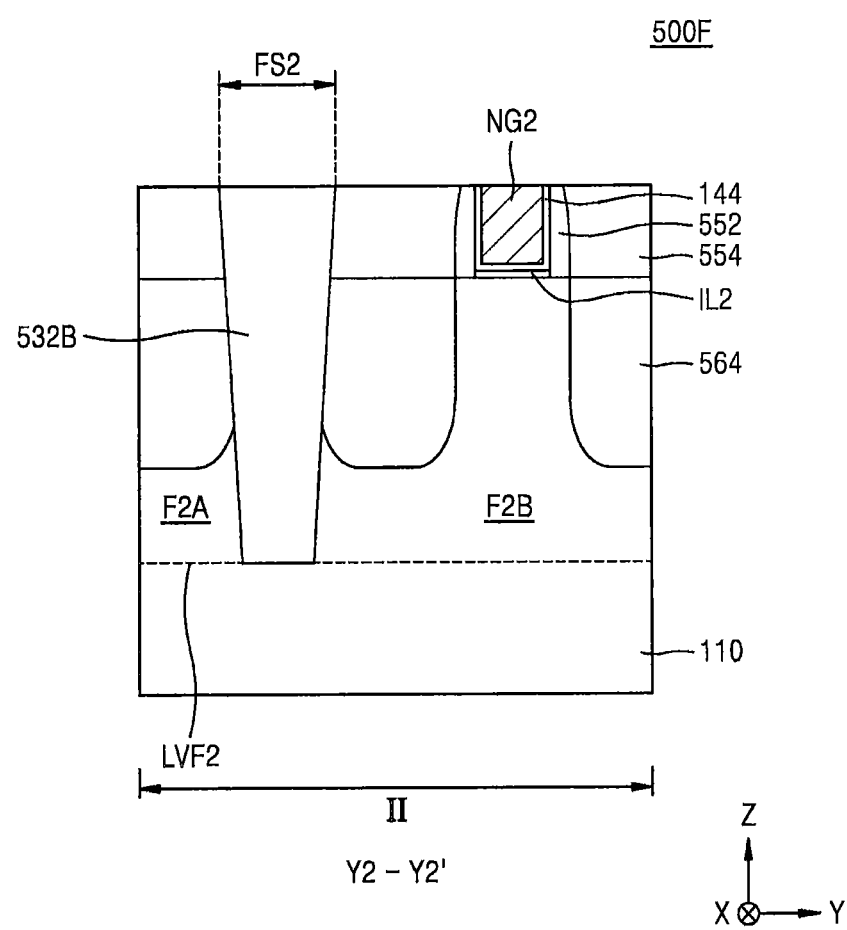

FIGS. 12A and 12B are cross-sectional views of an IC device 500F according to other example embodiments.

The IC device 500F may have the same plan layout as shown in FIG. 10. More specifically, FIG. 12A is a cross-sectional view of a portion corresponding to the line Y1-Y1' of FIG. 10, and FIG. 12B is a cross-sectional view of a portion corresponding to the line Y2-Y2' of FIG. 10. In FIGS. 12A and 12B, the same reference numerals are used to denote the same elements as in FIGS. 1A to 10, and detailed descriptions thereof are omitted.

Referring to FIGS. 12A and 12B, the IC device 500F may have substantially the same configuration as the IC device 500A shown in FIGS. 7A to 7E except that the IC device 500F may include a first fin isolation insulating layer 522B having a top surface that is at substantially the same level as a top surface of a normal gate line NG1, instead of the first isolation insulating layer 522 shown in FIG. 10. Also, the IC device 500F may include a second fin isolation insulating layer 532B having a top surface that is at substantially the same level as a top surface of a normal gate line NG2, instead of the second fin isolation insulating layer 532 shown in FIG. 10.

The first fin isolation insulating layer 522B formed in the first region I may contact a plurality of first-fin-type active regions F1A and a plurality of first-fin-type active regions F1B and fill a first fin isolation region FS1. An upper portion of the first fin isolation insulating layer 522B may extend at the same level as the normal gate line NG1 parallel to the normal gate line NG1.

The second fin isolation insulating layer 532B formed in the second region II may contact the plurality of second-fin-type active regions F2A and the plurality of second-fin-type active regions F2B and fill a second fin isolation region FS2. An upper portion of the second fin isolation insulating layer 532B may extend at the same level as the normal gate line NG2 parallel to the normal gate line NG2.

Figure 13A:
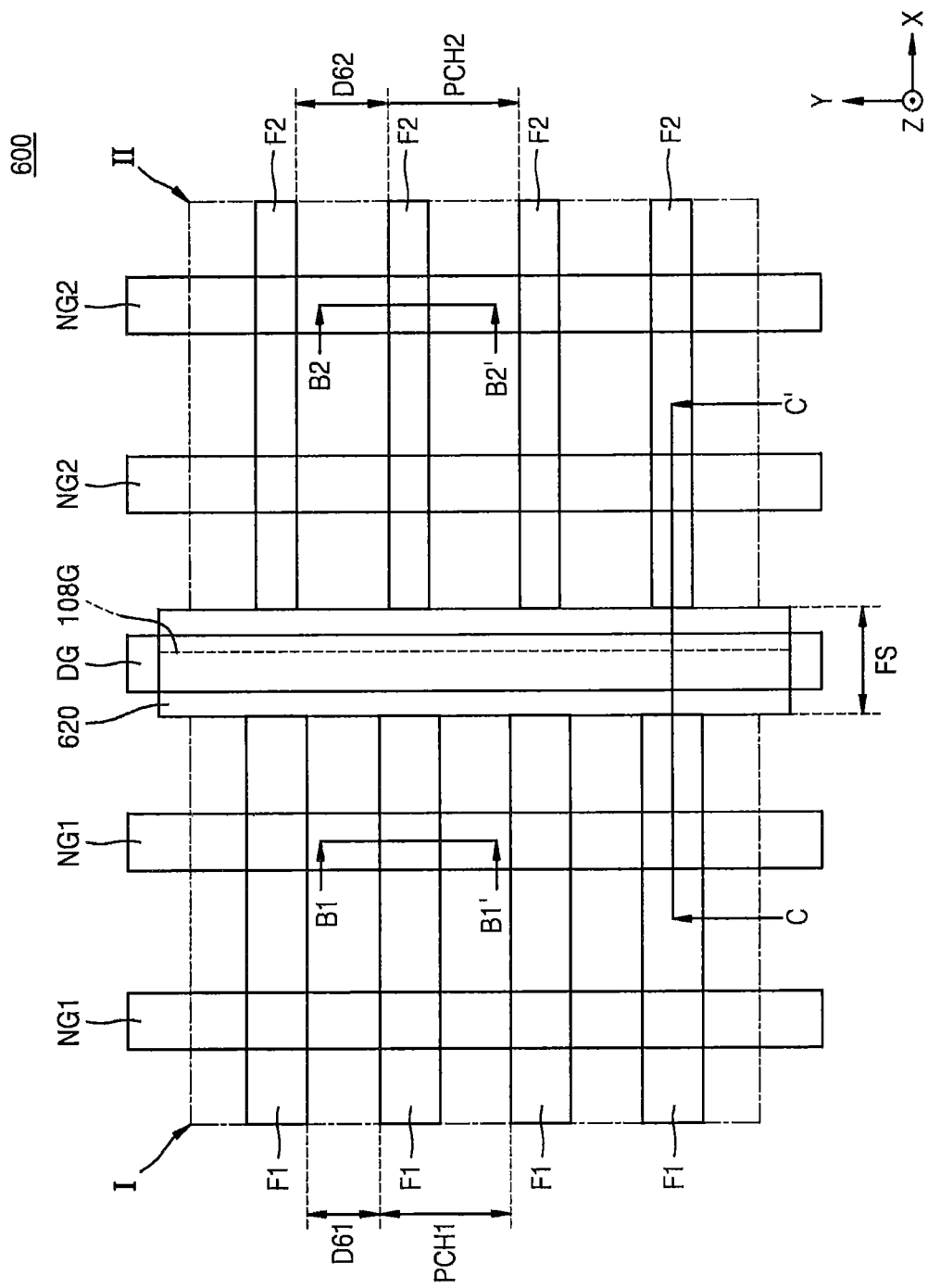
FIG. 13A is a plan layout diagram of an IC device according to another example embodiment.
Figure 13B:
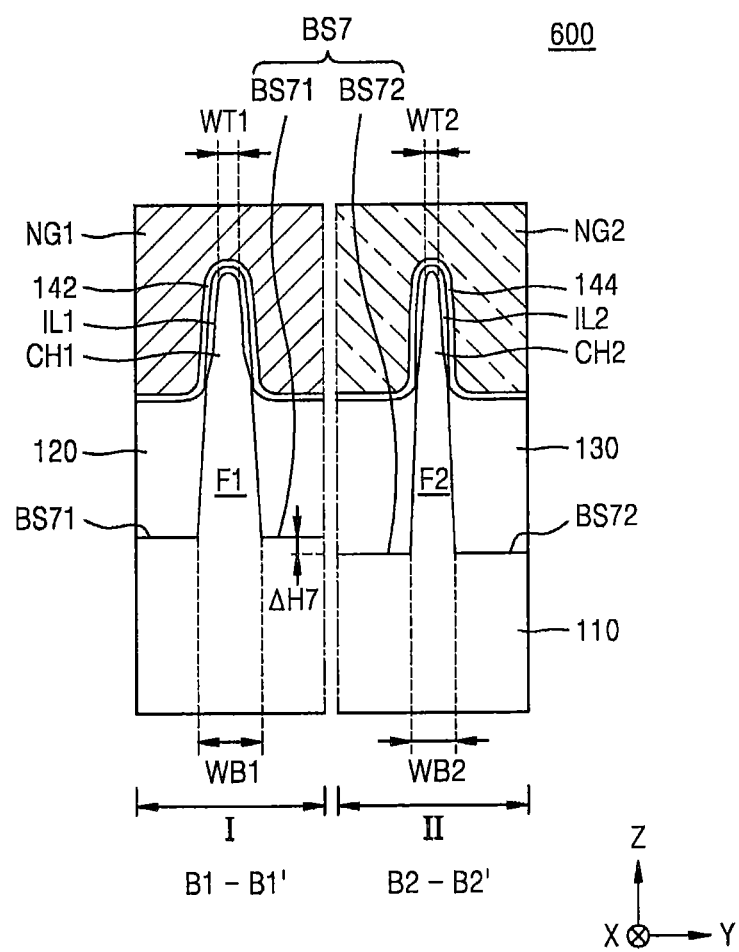
FIG. 13B is a cross-sectional view taken along lines B1-B1' and B2-B2' of FIG. 13A.
Figure 13C:
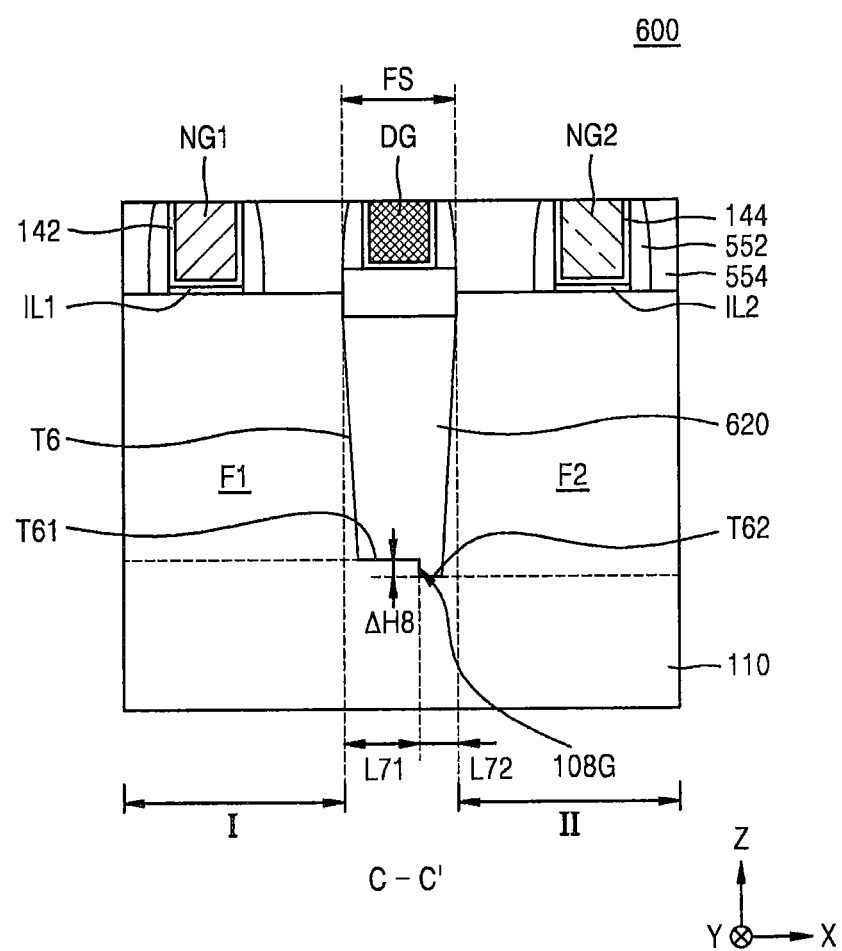
FIG. 13C is a cross-sectional view taken along a line C-C' of FIG. 13A.

FIGS. 13A to 13C are diagrams of an IC device 600 according to other example embodiments. More specifically, FIG. 13A is a plan layout diagram of some elements of an IC device 600 according to other example embodiments, FIG. 13B is a cross-sectional view taken along lines B1-B1' and B2-B2' of FIG. 13A B2-B2', and FIG. 13C is a cross-sectional view taken along a line C-C' of FIG. 13A. In FIGS. 13A to 13C, the same reference numerals are used to denote the same elements as in FIGS. 1A to 7E, and detailed descriptions thereof are omitted.

Referring to FIGS. 13A to 13C, the IC device 600 may include a substrate 110 having a first region I and a second region II. The first region I and the second region II may be formed on the substrate 110 apart from each other with a fin isolation region FS therebetween.

A plurality of first-fin-type active regions F1 may protrude from the first region I of the substrate 110 in a direction (Z direction) perpendicular to a main surface of the substrate

110. Each of the plurality of first-fin-type active regions F1 may have a first-conductivity-type channel region CH1. Both sidewalls of each of the plurality of first-fin-type active regions F1 may be covered with a first device isolation layer 120 under the first-conductivity-type channel region CH1.

A plurality of second-fin-type active regions F2 may protrude from the second region II of the substrate 110 in a first direction (Z direction). Each of the plurality of second-fin-type active regions F2 may have a second-conductivity-type channel region CH2. Both sidewalls of each of the plurality of second-fin-type active regions F2 may be covered with a second device isolation layer 130 under the second-conductivity-type channel region CH2.

The plurality of first-fin-type active regions F1 and the plurality of second-fin-type active regions F2 may extend on the substrate 110 parallel to one another in one direction (X direction).

Each of the plurality of first-fin-type active regions F1 may extend in a straight line with any one of the plurality of second-fin-type active regions F2. The plurality of first-fin-type active regions F1 may be spaced apart from the plurality of second-fin-type active regions F2 such that the fin isolation region FS is between the plurality of first-fin-type active regions F1 and the plurality of second-fin-type active regions F2 in an extension direction thereof.

In the first region I and the second region II, a plurality of normal gate lines NG1 and NG2 and a dummy gate line DG may extend in a direction (Y direction) that intersects an extension direction (X direction) of the plurality of first-fin-type active regions F1 and the plurality of second-fin-type active regions F2. The dummy gate line DG may be disposed in the fin isolation region FS.

The substrate 110 of the IC device 600 may have a plurality of bottom surfaces BS7, which may be interposed between the plurality of first-fin-type active regions F1 and the plurality of second-fin-type active regions F2, respectively. From among the plurality of bottom surfaces BS7, a first bottom unit BS71 and a second bottom unit BS72 may extend at different levels. The first bottom unit BS71 may be interposed between the plurality of first-fin-type active regions F1 in the first region I, and the second bottom unit BS72 may be interposed between the plurality of second-fin-type active regions F2 in the second region II. Thus, there may be a height difference $\Delta H7$ between the first bottom unit BS71 and the second bottom unit BS72.

A lowest portion of each of the plurality of first-fin-type active regions F1, which is adjacent to the bottom surface BS7, may be located at a higher level than a lowest portion of each of the plurality of second-fin-type active regions F2, which is adjacent to the bottom surface BS7.

Detailed descriptions of the plurality of first and second-fin-type active regions F1 and F2 may be generally the same as described with reference to FIGS. 3A and 3B.

A fin isolation trench T6 may be formed in a fin isolation region FS disposed in an interfacial region between the first region I and the second region II. The fin isolation trench T6 may be filled with a fin isolation insulating layer 620. An inter-region stepped portion 108G may be formed on a bottom surface of the fin isolation trench T6. As illustrated with a dashed line in FIG. 13A, the inter-region stepped portion 108G may extend in a lengthwise direction of the fin isolation insulating layer 620.

The inter-region stepped portion 108G may extend between the plurality of first-fin-type active regions F1 and the plurality of second-fin-type active regions F2 along an interfacial portion between the first region I and the second region II. The inter-region stepped portion 108G may extend in a direction parallel to an extension direction of the plurality of first and second-fin-type active regions F1 and F2.

A bottom surface of the fin isolation trench T6 may include a first bottom surface unit T61 and a second bottom surface unit T62 having different heights, which are distinguished from one another by the inter-region stepped portion 108G. From among the first bottom surface unit T61 and the second bottom surface unit T62, the first bottom surface unit T61 that is at a relatively high level may be interposed between one end of the first-fin-type active region F1 and the inter-region stepped portion 108G, while the second bottom surface unit T62 that is at a relatively low level may be interposed between one end of the second-fin-type active region F2 and the inter-region stepped portion 108G.

In some embodiments, a height difference $\Delta H8$ between the first bottom surface unit T61 and the second bottom surface unit T62 may be equal to a height difference $\Delta H7$ between a bottom surface BS7 disposed in the first region I and a bottom surface BS7 disposed in the second region II.

In some embodiments, a distance L71 between one end of the first-fin-type active region F1 and the inter-region stepped portion 108G may be greater than a distance L72 between one end of the second-fin-type active region F2 and the inter-region stepped portion 108G in the widthwise direction (X direction) of the fin isolation trench T6.

The plurality of first-fin-type active regions F1 and the plurality of second-fin-type active regions F2 may be disposed at a first pitch PCH1 and a second pitch PCH2, respectively, in a widthwise direction (Y direction) of the plurality of first-fin-type active regions F1 and the plurality of second-fin-type active regions F2. The first pitch PCH1 may be equal to the second pitch PCH2.

The plurality of first-fin-type active regions F1 may have a first base width WB1 and a first upper width WT1. Each of the plurality of second-fin-type active regions F2 may have a second base width WB2 less than the first base width WB1. Also, the plurality of second-fin-type active regions F2 may have a second upper width WT2 that is less than the first upper width WT1.

The plurality of first-fin-type active regions F1 may be disposed a first space D61 apart from one another in the widthwise direction (Y direction) of the plurality of first and second-fin-type active regions F1 and F2. The plurality of second-fin-type active regions F2 may be disposed a second space D62 apart from one another in the widthwise direction (Y direction) of the plurality of first and second-fin-type active regions F1 and F2. The second space D62 may be greater than the first space D61.

Detailed descriptions of the plurality of normal gate lines NG1 and NG2 and the dummy gate line DG may be similar to the normal gate lines NG1 and NG2 and the dummy gate lines DG1 and DG2 described with reference to FIGS. 7A to 7E.

In some embodiments, the IC device 600 may include the first device isolation layer 120A and the second device isolation layer 130A described with reference to FIG. 2A instead of the first device isolation layer 120 and the second device isolation layer 130.

In some embodiments, at least a portion of a second-conductivity-type channel region CH2 of each of the plurality of second-fin-type active regions F2 formed in the second region II of the IC device 600 may include a different material from the remaining portion of the second-conductivity-type channel region CH2. For example, a selected partial region of the second-conductivity-type channel region CH2 of each of the plurality of second-fin-type active regions F2 may include germanium, and the remaining region of the second-conductivity-type channel region CH2 may include silicon.

In some embodiments, in the IC device 600, each of the plurality of first-fin-type active regions F1 may further include the first insertion layer FL1 shown in FIG. 2B, and each of the plurality of second-fin-type active regions F2 may further include the second insertion layer FL2 shown in FIG. 2B.

Figure 14A:
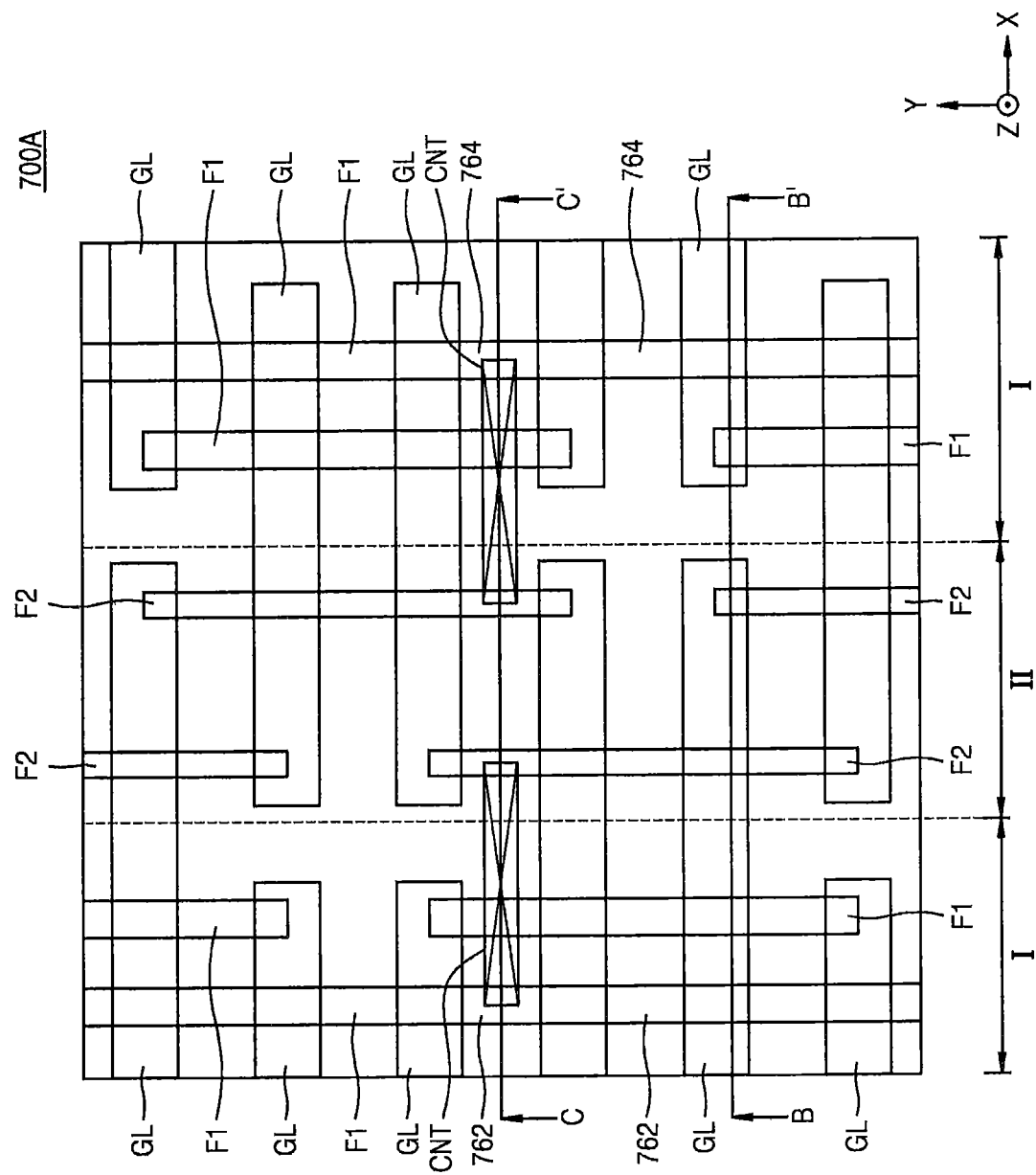
FIG. 14A is a plan layout diagram of an IC device according to other example embodiments.
Figure 14B:
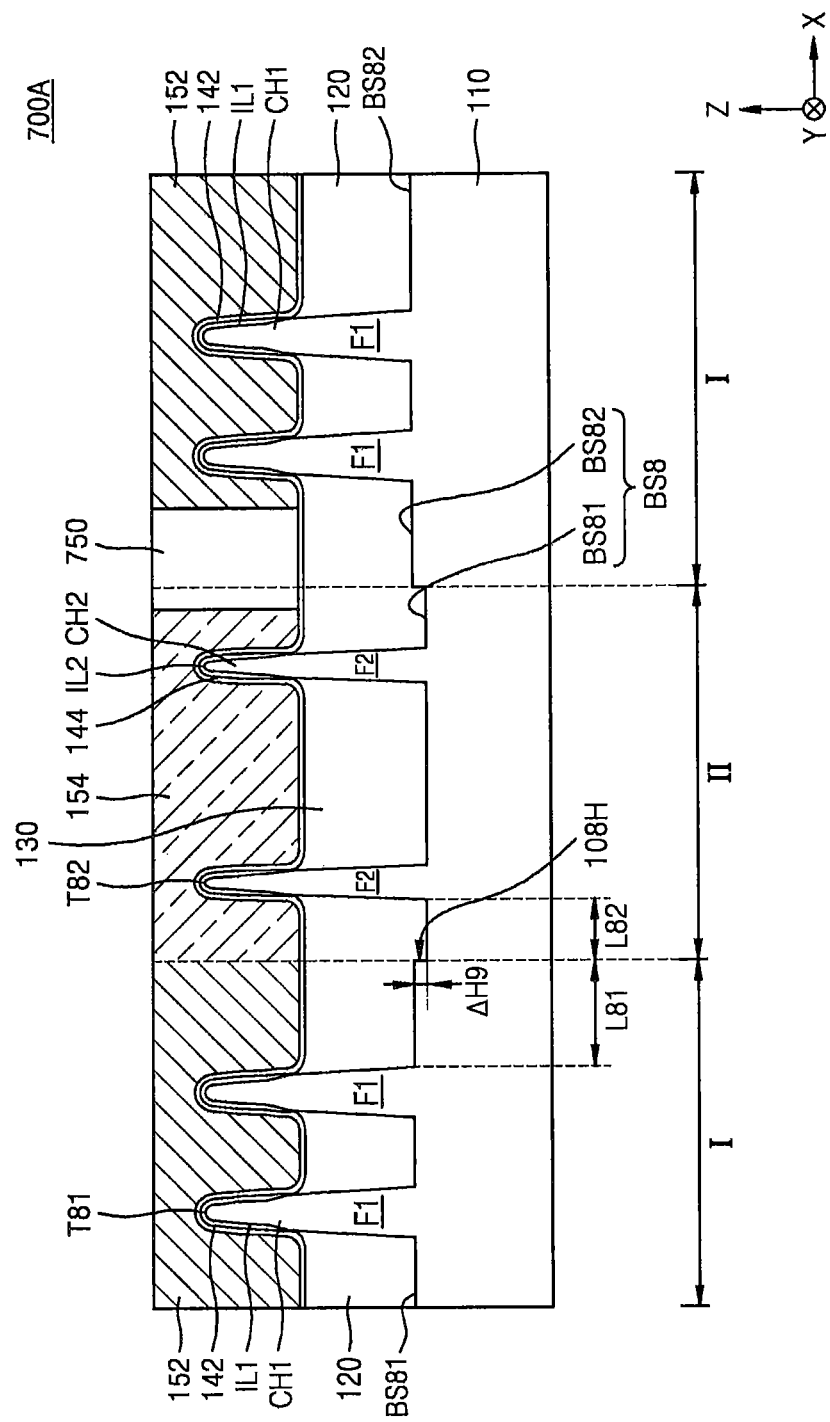
FIG. 14B is a cross-sectional view taken along a line B-B' of FIG. 14A.
Figure 14C:
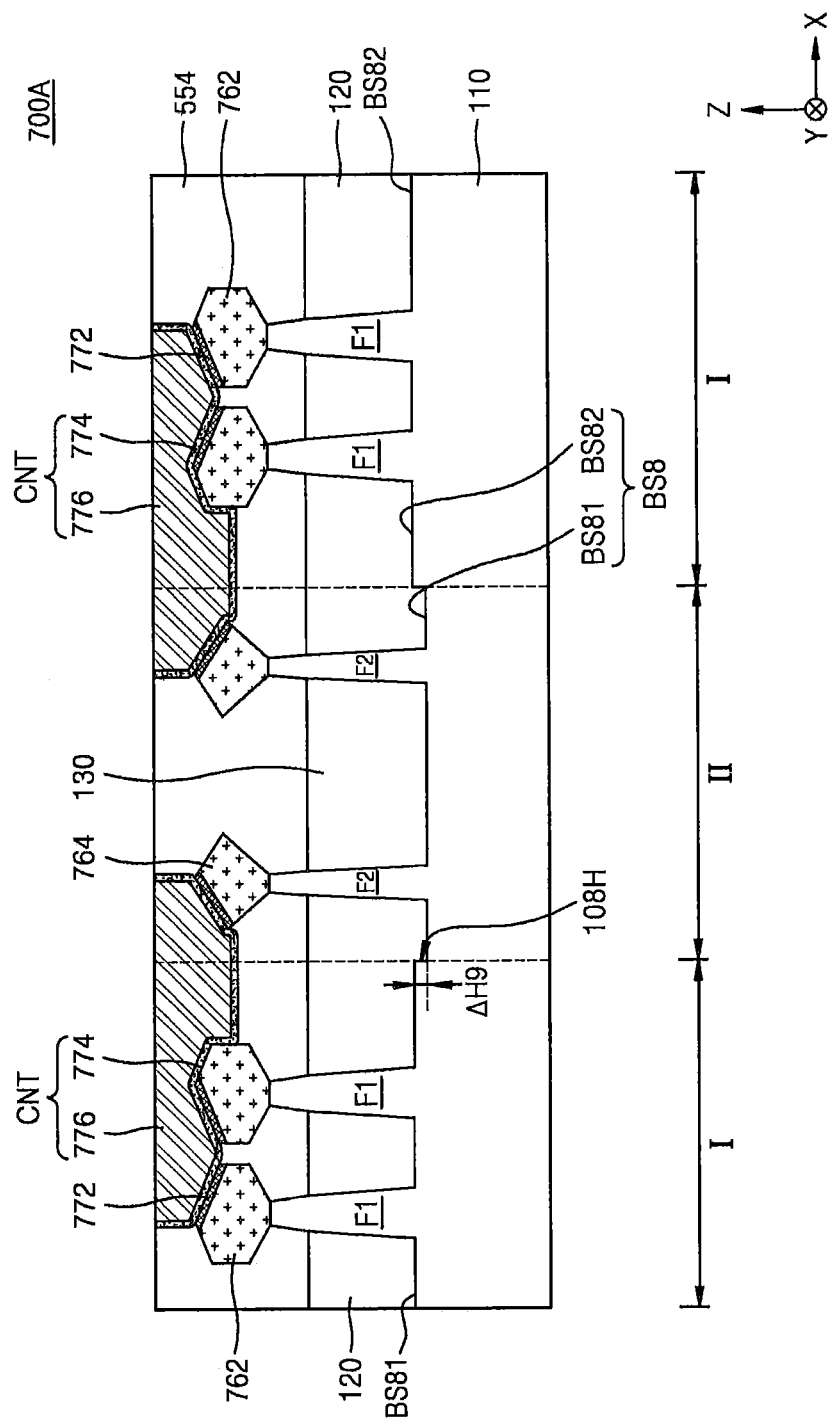
FIG. 14C is a cross-sectional view taken along a line C-C' of FIG. 14A.

FIGS. 14A to 14C are diagrams of some elements of an IC device 700A according to other example embodiments. More specifically, FIG. 14A is a plan layout diagram of an IC device 700A according to other example embodiments, FIG. 14B is a cross-sectional view taken along a line B-B' of FIG. 14A, and FIG. 14C is a cross-sectional view taken along a line C-C' of FIG. 14A. In FIGS. 14A to 14C, the same reference numerals are used to denote the same elements as in FIGS. 1A to 3B, and detailed descriptions thereof are omitted.

A substrate 110 of the IC device 700A may include a plurality of first regions I and a plurality of second regions II, which are alternately disposed in one direction (refer to X direction in FIG. 14B). A plurality of first-fin-type active regions F1 may protrude in a direction (Z direction) perpendicular to a main surface of the substrate 110 in the first region I. A plurality of second-fin-type active regions F2 may protrude in the direction (Z direction) perpendicular to the main surface of the substrate 110 in the second region II interposed between two adjacent first regions I. The plurality of second-fin-type active regions F2 may have a smaller width than the plurality of first-fin-type active regions F1 in a widthwise direction (X direction).

A plurality of gate lines GL (refer to FIG. 14A) may extend on the plurality of first-fin-type active regions F1 and the plurality of second-fin-type active regions F2 in a direction that intersects an extension direction of the plurality of first-fin-type active regions F1 and the plurality of second-fin-type active regions F2. The plurality of gate lines GL may include a first gate line 152 (refer to FIG. 14B) disposed in the first region I and a second gate line 154 (refer to FIG. 14B) disposed in the second region II.

In a partial region of the IC device 700A, a gate-cut insulating layer 750 (refer to FIG. 14B) may be interposed between two gate lines GL, which are adjacent to each other in a lengthwise direction of the plurality of gate lines. The gate-cut insulating layer 750 may include a silicon oxide layer, a silicon nitride layer, or a combination thereof.

The substrate 110 may have a plurality of bottom surfaces BS8 interposed between the plurality of first-fin-type active regions F1 and the plurality of second-fin-type active regions F2, respectively. An inter-region stepped portion 108H may be formed in one of the plurality of bottom surface BS8, which is in an interfacial portion between the plurality of first-fin-type active regions F1 and the plurality of second-fin-type active regions F2.

The inter-region stepped portion 108H may extend in a lengthwise direction (Y direction) of the plurality of first-fin-type active regions F1 and the plurality of second-fin-type active regions F2. The inter-region stepped portion 108H may extend along an interfacial portion between the first region I and the second region II. A space between the plurality of first-fin-type active regions F1 may be less than a space between the plurality of second-fin-type active regions F2 in the widthwise direction (X direction).

Each of the bottom surfaces BS8 of the substrate 110 may include a first bottom unit BS81 and a second bottom unit BS82, which may extend at different levels. The first bottom unit BS81 may be disposed on both sides of each of the plurality of first-fin-type active regions F1 in the first region I, and the second bottom unit BS82 may be disposed on both sides of each of the plurality of second-fin-type active regions F2 in the second region II. As shown in FIGS. 14B and 14C, the second bottom unit BS82 disposed in the second region II may be at a lower level than the first bottom unit BS81 disposed in the first region I. The inter-region stepped portion 108H may be formed due to a height difference ΔH9 between the first bottom unit BS81 and the second bottom unit BS82.

A lowest portion of each of the plurality of first-fin-type active regions F1, which is adjacent to the first bottom unit BS81, may be located at a higher level than a lowest portion of each of the plurality of second-fin-type active regions F2, which is adjacent to the second bottom unit BS82.

In some embodiments, a first tip portion T81 of each of the plurality of first-fin-type active regions F1 may be at the same level as a second tip portion T82 of each of the plurality of second-fin-type active regions F2. In some other embodiments, The second tip portion T82 of each of the plurality of second-fin-type active regions F2 may be at a lower level than the first tip portion T81 of the first tip portion T81 of each of the plurality of first-fin-type active regions F1. In some embodiments, the second-fin-type active region F2 may have a greater height than the first-fin-type active region F1.

A shortest distance L81 from the inter-region stepped portion 108H to one of the plurality of first-fin-type active regions F1, which is nearest to the inter-region stepped portion 108H, may be greater than a shortest distance L82 from the inter-region stepped portion 108H to one of the plurality of second-fin-type active regions F2, which is nearest to the inter-region stepped portion 108H.

In a partial region of the IC device 700A, an interfacial portion between a first device isolation layer 120 and a second device isolation layer 130 may be aligned with the inter-region stepped portion 108H in the height direction (Z direction) of the first and second-fin-type active regions F1 and F2. Thus, the interfacial portion between the first device isolation layer 120 and the second device isolation layer 130 may vertically overlap the inter-region stepped portion 108H.

In a partial region of the IC device 700A, an interfacial portion between a first gate line 152 and the second gate line 154 may be aligned with the inter-region stepped portion 108H in the height direction (Z direction) of the first and second-fin-type active regions F1 and F2. Thus, an interfacial portion between the first gate line 152 and the second gate line 154 may vertically overlap the inter-region stepped portion 108H.

In a partial region of the IC device 700A, an interfacial portion between the inter-region stepped portion 108H and the first and second device isolation layers 120 and 130 may be aligned with the interfacial portion between the first gate line 152 and the second gate line 154 in a straight line in the height direction (Z direction) of the first and second-fin-type active regions F1 and F2.

In another partial region of the IC device 700A, the inter-region stepped portion 108H may be aligned with the gate-cut insulating layer 750 in the height direction (Z direction) of the first and second-fin-type active regions F1 and F2.

FIG. 14B illustrates an example in which both sidewalls of each of the plurality of first-fin-type active regions F1 and the plurality of second-fin-type active regions F2 have approximately symmetrical profiles with respect to a central line extending in a direction (Z direction) perpendicular to a main surface of the substrate 110, but the inventive concepts are not limited thereto. For instance, both sidewalls of each of at least some of the plurality of first-fin-type active regions F1 and the plurality of second-fin-type active regions F2 may have asymmetrical profiles with respect to the central line extending in the direction (Z direction) perpendicular to the main surface of the substrate 110.

In the first region I, first source and drain regions 762 may be formed on the first-fin-type active region F1 on both sides of the first gate line 152. The first source and drain regions 762 may include a semiconductor layer that is epitaxially grown from the first-fin-type active region F1. The first source and drain regions 762 may include an epitaxially grown silicon layer or an epitaxially grown SiC layer.

In the second region II, second source and drain regions 764 may be formed on the second-fin-type active region F2 on both sides of the second gate line 154. The second source and drain regions 764 may include a semiconductor layer that may be epitaxially grown from the second-fin-type active region F2. The second source and drain regions 764 may have an embedded SiGe structure including a plurality of epitaxially grown SiGe layers. The plurality of SiGe layers may have different Ge contents.

The first source and drain regions 762 may include a semiconductor layer having a top surface disposed at a higher level than a top surface of each of the plurality of first-fin-type active regions F1 and have an RSD structure. Also, the second source and drain regions 764 may include a semiconductor layer having a top surface disposed at a higher level than a top surface of each of the plurality of second-fin-type active regions F2 and have an RSD structure. FIG. 14C illustrates an example in which each of the first source and drain regions 762 and the second source and drain regions 764 has a specific sectional shape, but the sectional shape of each of the first source and drain regions 762 and the second source and drain regions 764 is not limited to the example shown in FIG. 14C. In some embodiments, each of the first source and drain regions 762 and the second source and drain regions 764 may have various sectional shapes, such as a diamond-like shape, a circular shape, a square shape, a pentagonal shape, and a hexagonal shape.

An inter-gate insulating layer 554 may be formed between the first gate line 152 and the second gate line 154 on the first and second device isolation layers 120 and 130. In some embodiments, the inter-gate insulating layer 554 may include a low-k dielectric layer having a lower dielectric constant than a silicon oxide layer. For example, the inter-gate insulating layer 554 may include a tetra ethyl ortho silicate (TEOS) layer. In some other embodiments, the inter-gate insulating layer 554 may include an ULK layer having an ultralow dielectric constant K of about 2.2 to 2.4, for example, any one selected out of a SiOC layer and a SiCOH layer, but a material forming the inter-gate insulating layer 554 is not limited to the examples.

At least one contact plug CNT may be formed on the first source and drain regions 762 and the second source and drain regions 764. The contact plug CNT may penetrate the inter-gate insulating layer 554 and be electrically connected to the first source and drain regions 762 and the second source and drain regions 764.

As shown in FIGS. 14A and 14C, the contact plug CNT may be connected in common to at least two adjacent ones of the plurality of first and second fin-type active regions F1 and F2 through the first source and drain regions 762 and the second source and drain regions 764.

The contact plug CNT may include a conductive plug 776 formed on the conductive barrier layer 774 and the conductive barrier layer 774. The conductive barrier layer 774 may include a conductive metal nitride layer. For example, the conductive barrier layer 774 may include TiN, TaN, MN, WN, or a combination thereof. The conductive plug 776 may include a metal. For example, the conductive plug 776 may include W, Cu, Al, an alloy thereof, or a combination thereof, but the inventive concepts are not limited to the above-described examples.

A metal silicide layer 772 may be formed between the first source and drain regions 762 and the second source and drain regions 764 and the conductive barrier layer 774. The metal silicide layer 772 may include a metal, for example, Ti, W, Ru, Nb, Mo, Hf, Ni, Co, Pt, Yb, Tb, Dy, Er, Pd, or a combination thereof.

The contact plug CNT may extend across an interfacial portion between the first region I and the second region II. Thus, the contact plug CNT may vertically overlap the inter-region stepped portion 108H.

In the IC device 700A described with reference to FIGS. 14A to 14C, bottom surfaces BS8 of the substrate 110 may be formed at different levels in the first region I and the second region II, and the first-fin-type active region F1 formed in the first region I may be formed to have a different width than the second-fin-type active region F2 formed in the second region II. Accordingly, the bottom surfaces BS8 of the substrate 110 may be formed at different levels in the first and second regions I and II and fin-type active regions may have different widths in the first and second regions I and II according to a structure and characteristics of each of the devices formed in the first and second regions I and II. Thus, a leakage current may be controlled in a highly scaled FinFET, and the performance of transistors may be improved. Also, multi-gate transistors capable of different functions may be formed in the first and second regions I and II.

Figure 15:
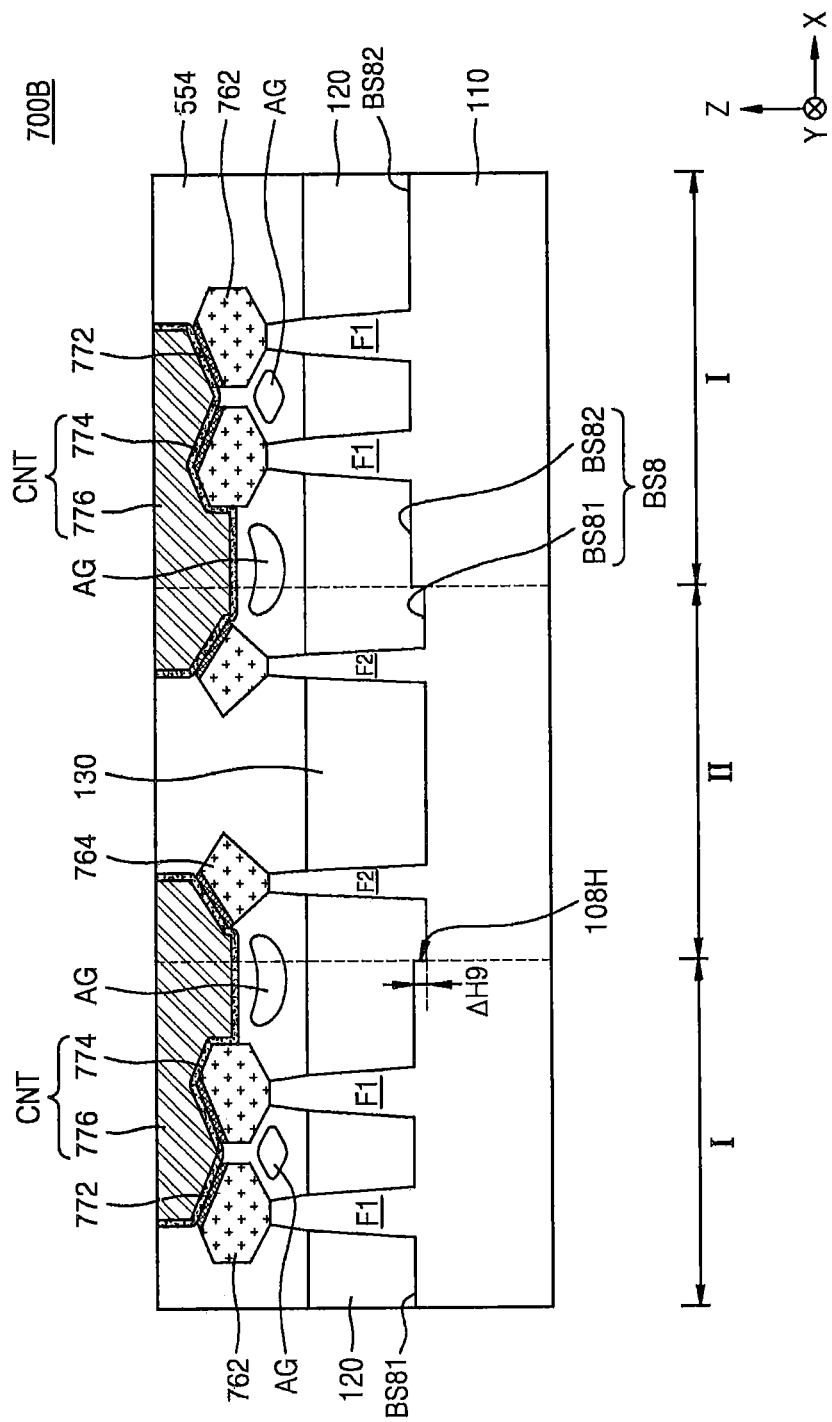
FIG. 15 is a cross-sectional view of main components of an IC device according to another example embodiment.

FIG. 15 is a cross-sectional view of main components of an IC device 700B according to another example embodiment. The IC device 700B shown in FIG. 15 may have the same plan layout as shown in FIG. 14A. FIG. 15 is a cross-sectional view of a portion corresponding to the line C-C' of FIG. 14A. In FIG. 15, the same reference numerals are used to denote the same elements as in FIGS. 1A to 14C, and detailed descriptions thereof are omitted.

The IC device 700B shown in FIG. 15 may have generally the same configuration as the IC device 700 shown in FIGS. 14A to 14C except that the IC device 700B includes at least one air gap AG surrounded by an inter-gate insulating layer 554 between a substrate 110 and a contact plug CNT. The at least air gap AG may be formed between two adjacent first-fin-type active regions F1 or formed between the first-fin-type active region F1 and the second-fin-type active region F2, which are adjacent to each other with an inter-region stepped portion 108H therebetween. In some embodiments, the air gap AG formed between the first-fin-type active region F1 and the second-fin-type active region F2 may be aligned with the inter-region stepped portion 108H in the height direction (Z direction) of the first and second-fin-type active regions F1 and F2 so that at least a portion of the air gap AG may vertically overlap the inter-region stepped portion 108H.

In the IC device 700A shown in FIGS. 14A to 14C and the IC device 700B shown in FIG. 15, at least a portion of a second-conductivity-type channel region CH2 of each of the plurality of second-fin-type active regions F2 formed in the second region II may include a different material from the remaining portion of the second-conductivity-type channel region CH2. For example, a selected partial region of the second-conductivity-type channel region CH2 of each of the plurality of second-fin-type active regions F2 may include germanium, and the remaining region of the second-conductivity-type channel region CH2 may include silicon.

In the IC device 700A shown in FIGS. 14A to 14C and the IC device 700B shown in FIG. 15, each of the plurality of first-fin-type active regions F1 may further include the first insertion layer FL1 shown in FIG. 2B, and each of the plurality of second-fin-type active regions F2 may further include the second insertion layer FL2 shown in FIG. 2B.

FIGS. 16A to 16K are cross-sectional views of process operations of a method of manufacturing an IC device according to example embodiments. A method of manufacturing the IC device 200B shown in FIG. 4A according to an example embodiment will be described with reference to FIGS. 16A to 16K. In FIGS. 16A to 16K, the same reference numerals are used to denote the same elements as in FIGS. 1A to 4A, and detailed descriptions thereof are omitted.

Figure 16A:
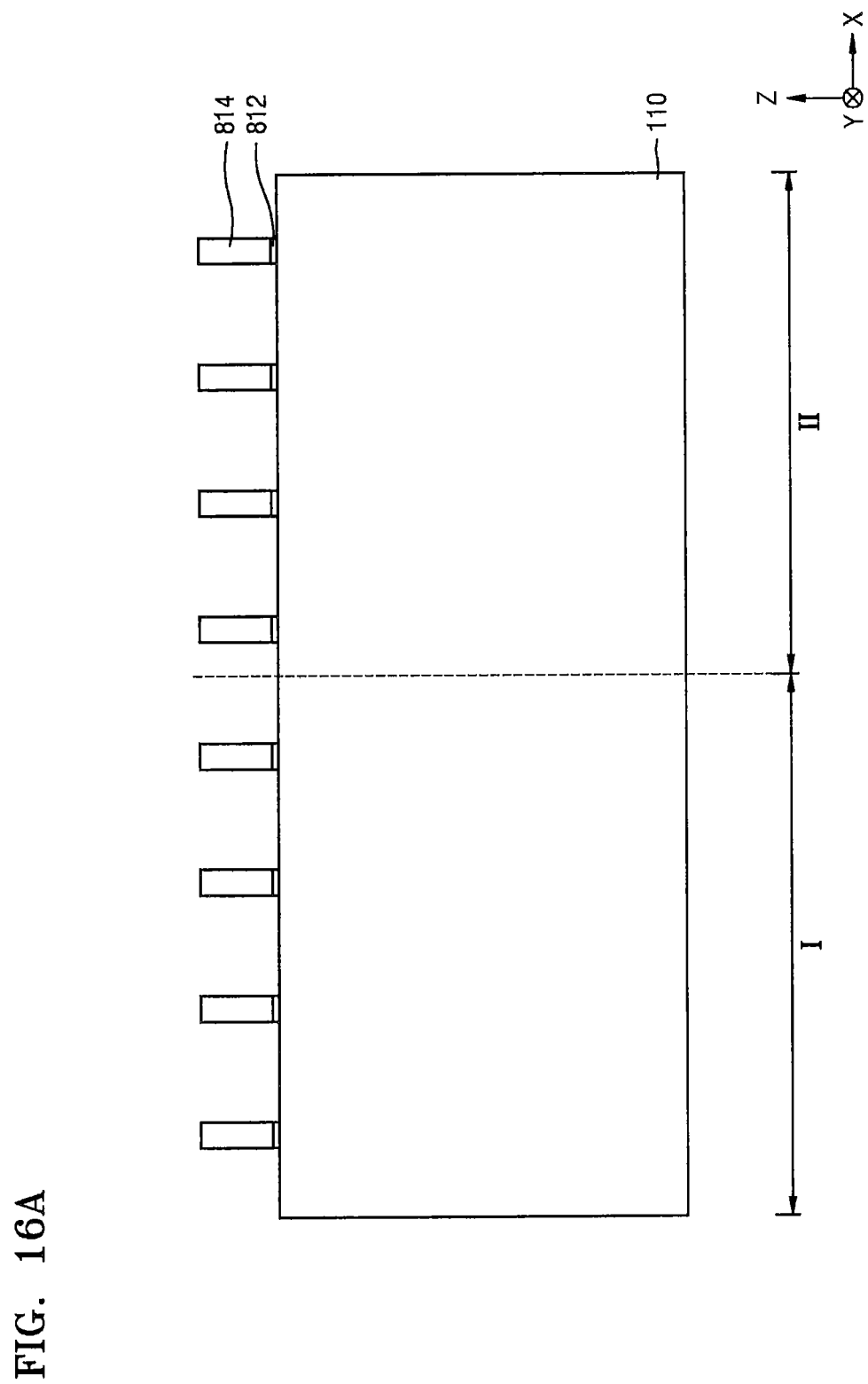

Referring to FIG. 16A, a substrate 110 including a first region I and a second region II may be prepared. A plurality of pad oxide layer patterns 812 and a plurality of mask patterns 814 may be formed on the first region I and the second region II of the substrate 110.

The plurality of pad oxide layer patterns 812 and the plurality of mask patterns 814 may extend on the substrate 110 parallel to one another in one direction (Y direction).

In some embodiments, the plurality of pad oxide layer patterns 812 may include an oxide layer obtained by thermally oxidizing a surface of the substrate 110. The plurality of mask patterns 814 may include a silicon nitride layer, a silicon oxynitride layer, a spin on glass (SOG) layer, a spin-on-hardmask (SOH) layer, a photoresist layer, or a combination thereof, but the inventive concepts are not limited thereto.

Referring to FIG. 16B, a partial region of the substrate 110 may be etched by using the plurality of mask patterns 814 as an etch mask so that a plurality of first and second trenches T1 and T2 may be formed in the substrate 110. Due to the formation of the plurality of first and second trenches T1 and T2, a plurality of first and second preliminary fin-type active regions P1 and P2 may protrude from the substrate 110 in a direction (Z direction) perpendicular to a main surface of the substrate 110 and extend in one direction (Y direction).

Figure 16C:
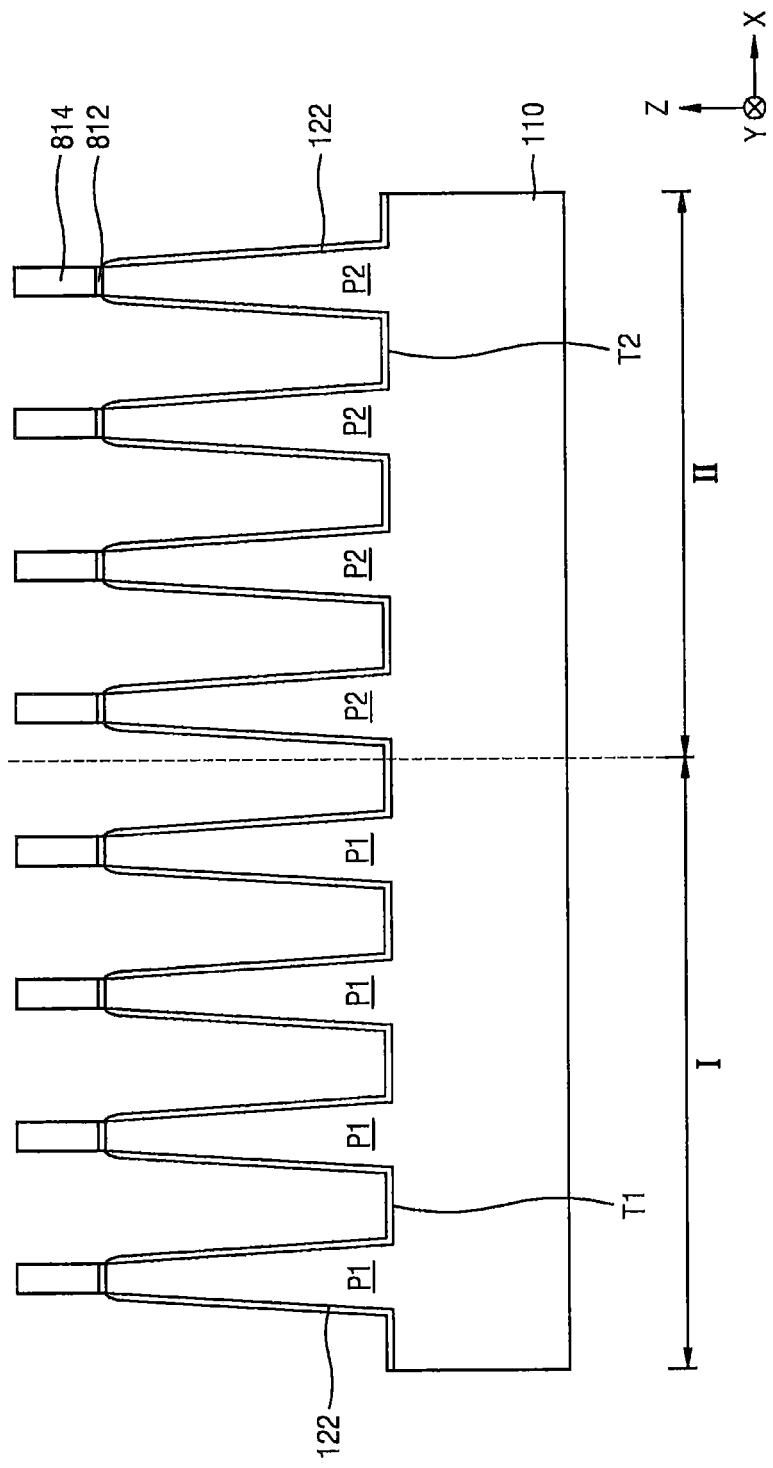

Referring to FIG. 16C, a first insulating liner 122 may be formed in the first region I and the second region II to extend on or cover exposed surfaces of the plurality of first and second preliminary fin-type active regions P1 and P2.

The first insulating liner 122 may be obtained by oxidizing surfaces of the first-fin-type active region F1 and the second-fin-type active region F2. For example, the first insulating liner 122 may be formed by using a thermal oxidation process, but the inventive concepts are not limited thereto. In some embodiments, the first insulating liner 122 may have a thickness of about 10 Å to about 100 Å.

Figure 16D:
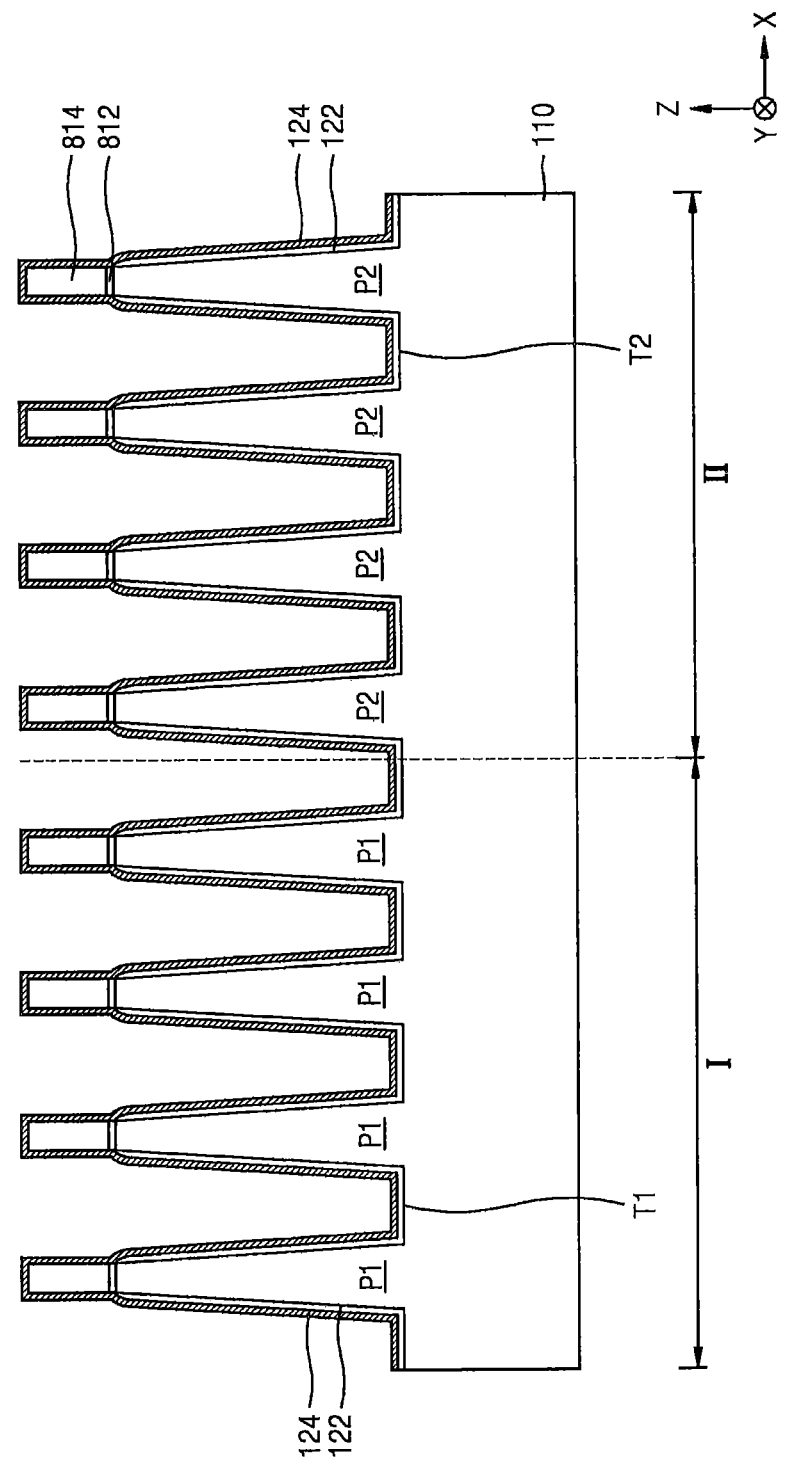

Referring to FIG. 16D, a first stressor liner 124 may be formed on the first insulating liner 122 in the first region I and the second region II.

The first stressor liner 124 may be formed to a uniform thickness to conformally extend on or cover the first insulating liner 122.

When an NMOS transistor is to be formed in the first region I, the first stressor liner 124 may include a material capable of applying tensile stress to a channel region of each of the plurality of first-fin-type active regions F1 (refer to FIG. 4A). For example, the first stressor liner 124 may include SiN, SiON, SiBN, SiC, SiC:H, SiCN, SiCN:H, SiOCN, SiOCN:H, SiOC, SiO$_2$, poly-Si, or a combination thereof. In some embodiments, the first stressor liner 124 may have a thickness of about 10 Å to about 100 Å.

In the process described with reference to FIG. 16D, the IC device 100B shown in FIG. 2A or the IC device 200C shown in FIG. 4B may be manufactured by appropriately selecting the thickness of the first stressor liner 124.

In some embodiments, the first stressor liner 124 may be formed by using a plasma-enhanced chemical vapor deposition (PECVD) process, a high-density plasma CVD (HDP CVD) process, an inductively coupled plasma CVD (ICP CVD) process, or a capacitor coupled plasma CVD (CCP CVD) process.

Figure 16E:
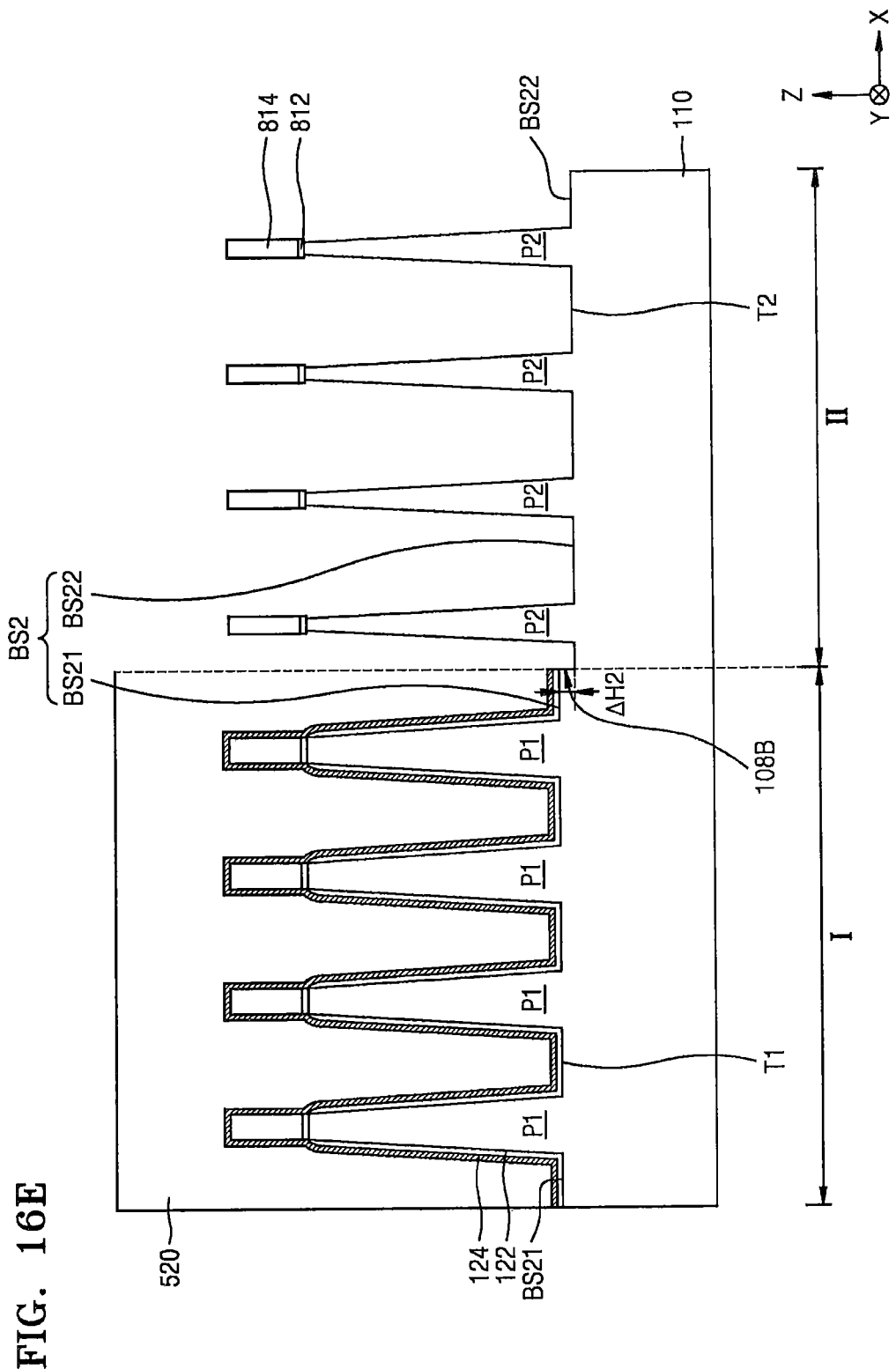

Referring to FIG. 16E, a mask pattern 520 may be formed on the substrate 110 to expose the second region II and cover the first region I. The first stressor liner 124 and the first insulating liner 122 may be removed from the second region II. Thereafter, the exposed substrate 110 may be removed by as much as a predetermined thickness from exposed surfaces of the plurality of second preliminary fin-type active regions P2 and an exposed bottom surface of the second trench T2. Thus, a width of the plurality of second preliminary fin-type active regions P2 in an X direction may be reduced, and a level of the bottom surface of the second trench T2 may be reduced. As a result, the inter-region stepped portion 108B may be formed due to a height difference ΔH2 between a first bottom unit BS21 provided by the bottom surface of the first trench T1 and a second bottom unit BS22 provided by the bottom surface of the second trench T2.

Figure 16F:
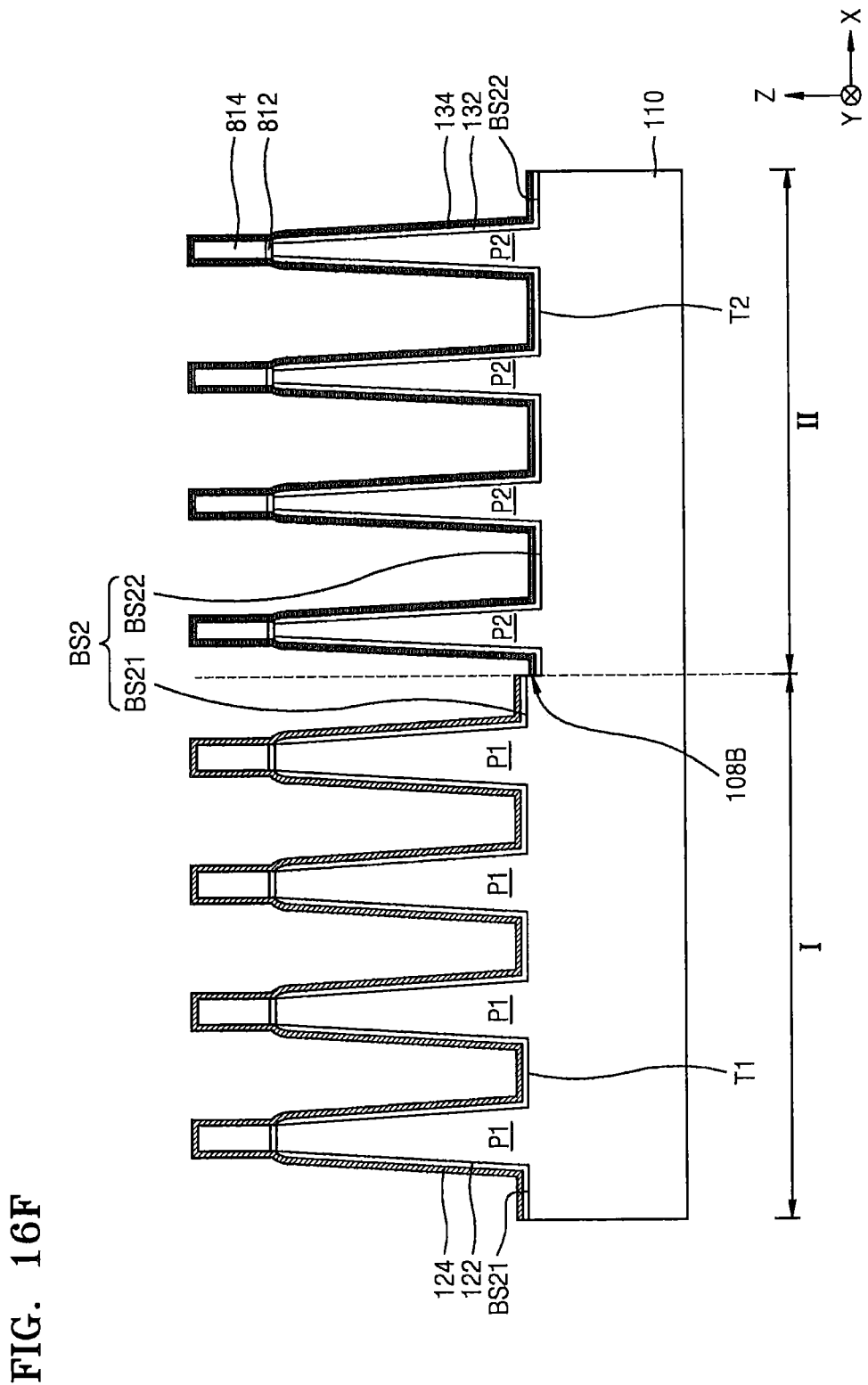

Referring to FIG. 16F, a second insulating liner 132 and a second stressor liner 134 may be sequentially formed on surfaces of the plurality of second preliminary fin-type active regions P2, which are exposed in the second region II, on the resultant structure of FIG. 16E. Thereafter, the remaining mask pattern 520 may be removed from the first region I to expose the first stressor liner 124 in the first region I.

The second stressor liner 134 may be formed to a uniform thickness to conformally extend on or cover the second insulating liner 132.

When a PMOS transistor is to be formed in the second region II, the second stressor liner 134 may include a material capable of applying tensile stress to channel regions of the plurality of second-fin-type active regions F2 (refer to FIG. 4A). For example, the second stressor liner 134 may include SiN, SiON, SiBN, SiC, SiC:H, SiCN, SiCN:H, SiOCN, SiOCN:H, SiOC, SiO$_2$, poly-Si, or a combination thereof. In some embodiments, the second stressor liner 134 may have a thickness of about 10 Å to about 100 Å.

In the process described with reference to FIG. 16F, the IC device 100B shown in FIG. 2A or the IC device 200C shown in FIG. 4B may be manufactured by appropriately selecting the thickness of the second stressor liner 134.

In some embodiments, the second stressor liner 134 may be formed by using a PECVD process, an HDP CVD process, an ICP CVD process, or a CCP CVD process.

Figure 16G:
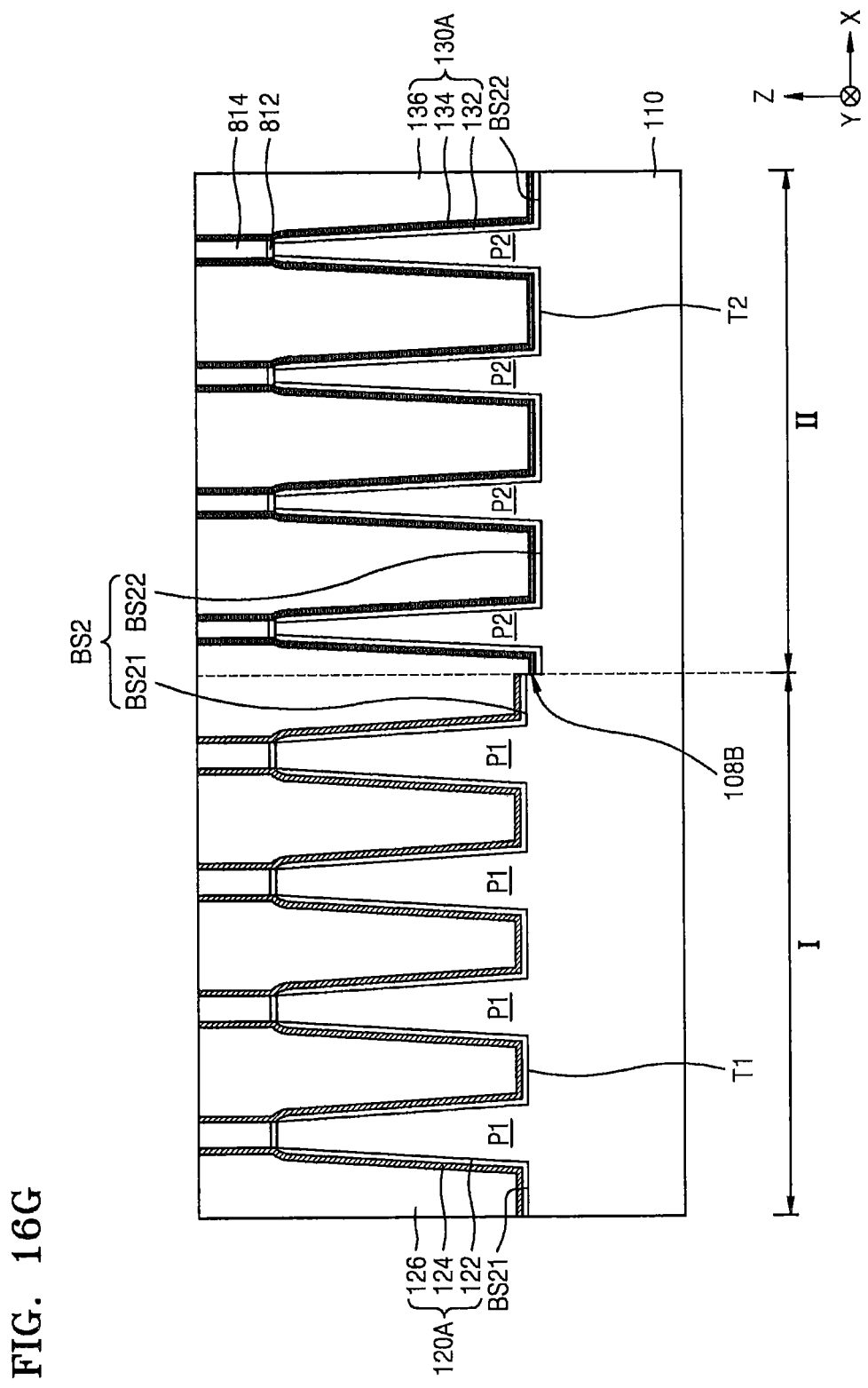

Referring to FIG. 16G, a first buried insulating layer 126 filling a plurality of first trenches T1 may be formed in a first region I, and a second buried insulating layer 16 filling a plurality of second trenches T2 may be formed in a second region II. As a result, a first device isolation layer 120A may be formed in the first region I, and a second device isolation layer 130A may be formed in the second region II.

The first buried insulating layer 126 and the second buried insulating layer 136 may be formed at the same time and include the same material layer. The formation of the first buried insulating layer 126 and the second buried insulating layer 136 may include depositing an oxide to fill each of the plurality of first trenches T1 and the plurality of second trenches T2 and annealing the deposited oxide. Thereafter, upper portions of the first buried insulating layer 126 and the second buried insulating layer 136 may be partially removed to expose top surfaces of the plurality of mask patterns 814.

The first buried insulating layer 126 and the second buried insulating layer 136 may be formed by using a flowable chemical vapor deposition (FCVD) process or a spin coating process. For example, the first buried insulating layer 126 and the second buried insulating layer 136 may include FSG, USG, BPSG, PSG, FOX, PE-TEOS, or TOSZ. In some embodiments, an oxide layer forming the second buried insulating layer 136 may include the same material layer formed by using the same process as an oxide layer forming the first buried insulating layer 126.

Figure 16H:
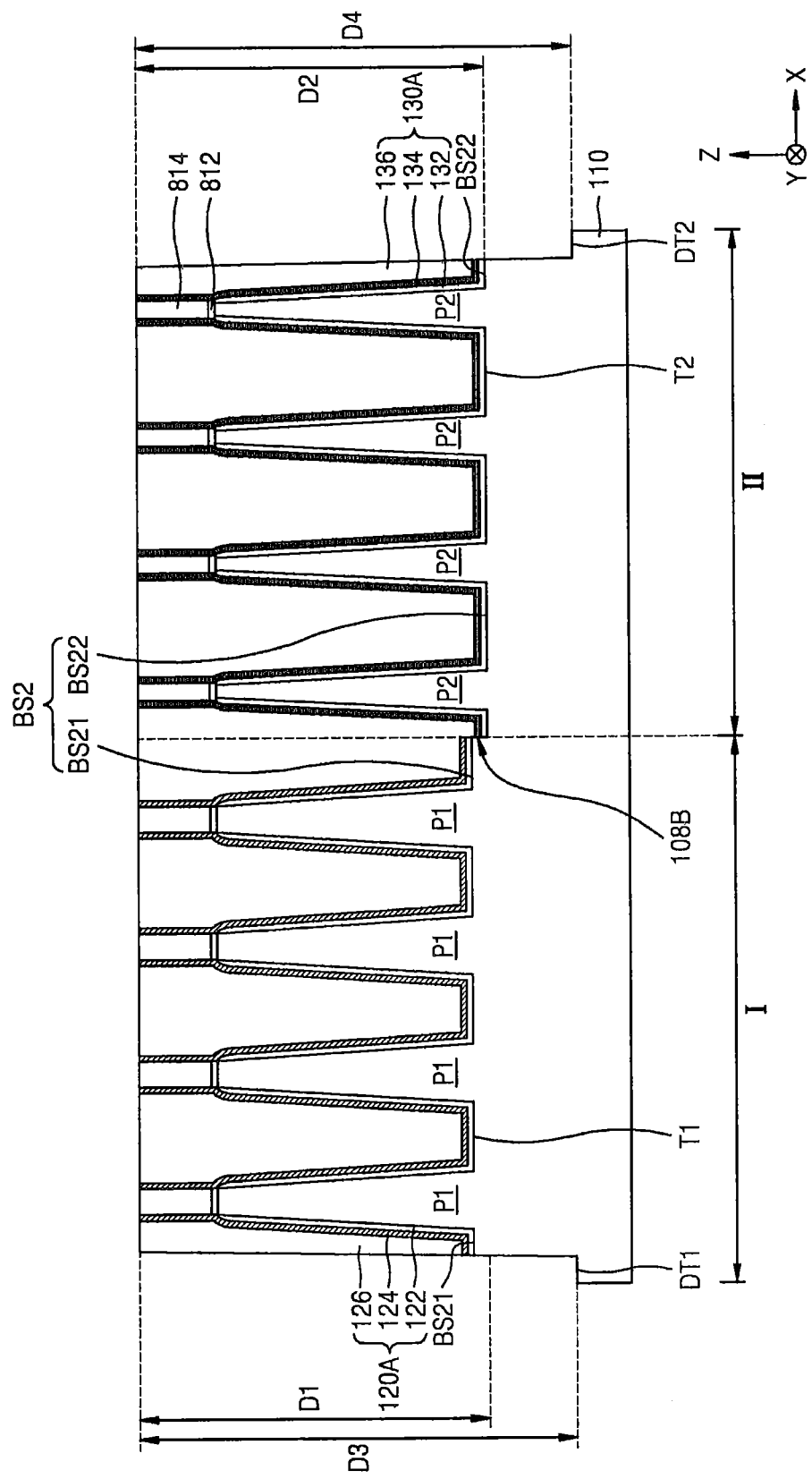

Referring to FIG. 16H, portions of the plurality of first preliminary fin-type active regions P1, portions of the plurality of second preliminary fin-type active regions P2, and insulating layers surrounding the portions of the plurality of first and second preliminary fin-type active regions P1 and P2 may be removed from the first region I and the second region II, thereby forming first and second deep trenches DT1 and DT2.

Depths D3 and D4 from top surfaces of the plurality of mask patterns 814 to bottom surfaces of the first and second deep trenches DT1 and DT2 may be greater than depths D1 and D2 from the top surfaces of the plurality of mask patterns 814 to bottom surfaces of the first and second trenches T1 and T2. For example, the depths D3 and D4 of the first and second deep trenches DT1 and DT2 may be about 50 nm to about 150 nm greater than the depths D1 and D2 of the first and second trenches T1 and T2. Also, each of the first and second deep trenches DT1 and DT2 may have a depth greater than the second bottom unit BS22 in the second region II.

The formation of the first and second deep trenches DT1 and DT2 may include forming a photoresist pattern to expose a portion of a top surface of the resultant structure of FIG. 16F, dry etching the exposed portion of the resultant structure by using the photoresist pattern as an etch mask, and removing the photoresist pattern.

Figure 16I:
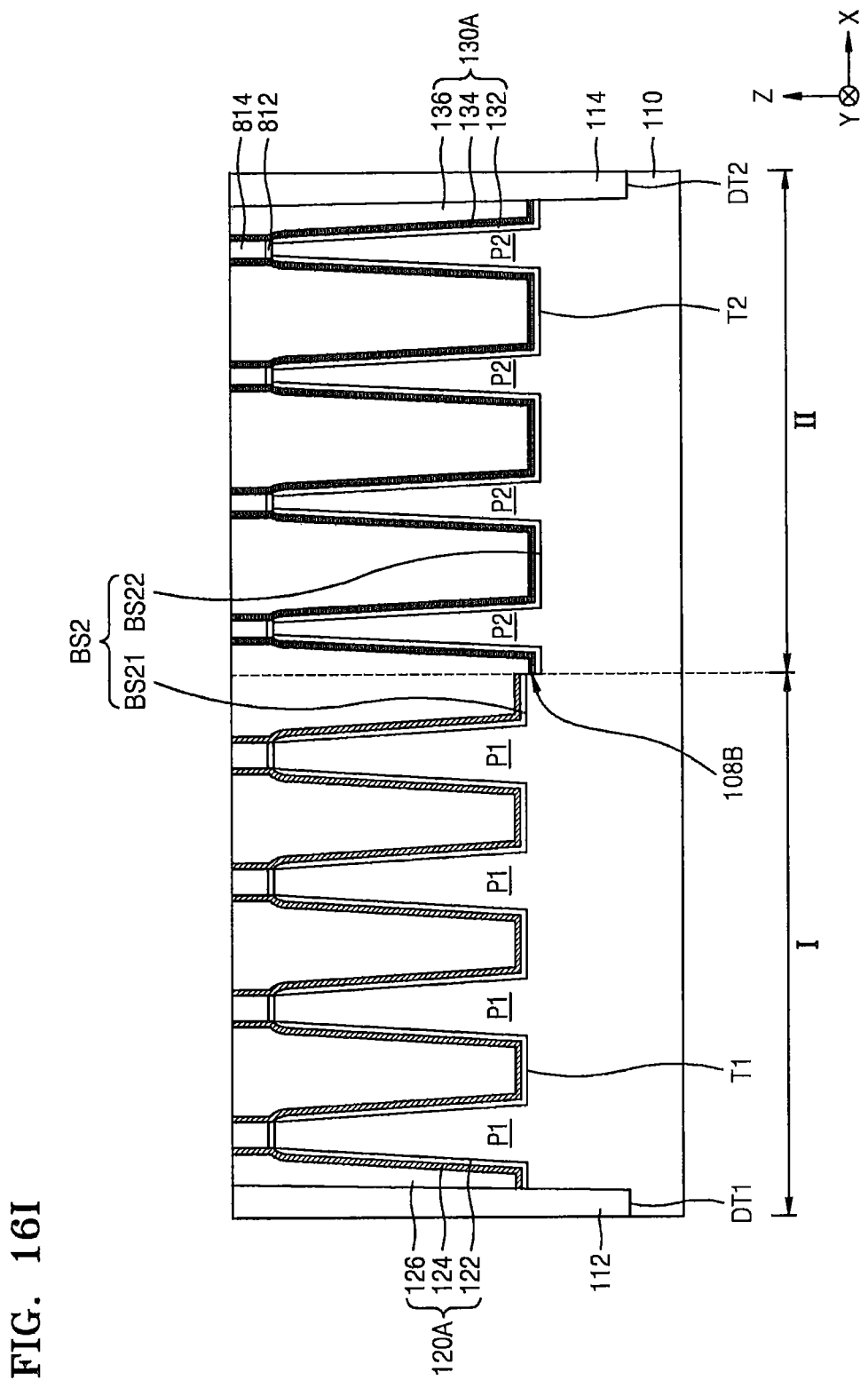

Referring to FIG. 16I, first and second inter-device isolation insulating layers 112 and 114 may be formed to fill the first and second deep trenches DT1 and DT2.

The first and second inter-device isolation insulating layers 112 and 114 may be formed by using a coating process or a deposition process. In some embodiments, each of the first and second inter-device isolation insulating layers 112 and 114 may include USG, but the inventive concepts are not limited thereto.

In some embodiments, the formation of first and second inter-device isolation insulating layers 112 and 114 may include forming an insulating layer to fill the first and second deep trenches DT1 and DT2 and planarizing a top surface of the insulating layer to expose the plurality of mask patterns 814. In this case, each of the plurality of mask patterns 814 and the first and second buried insulating layers 126 and 136 may be partially consumed and have a reduced height.

Figure 16J:
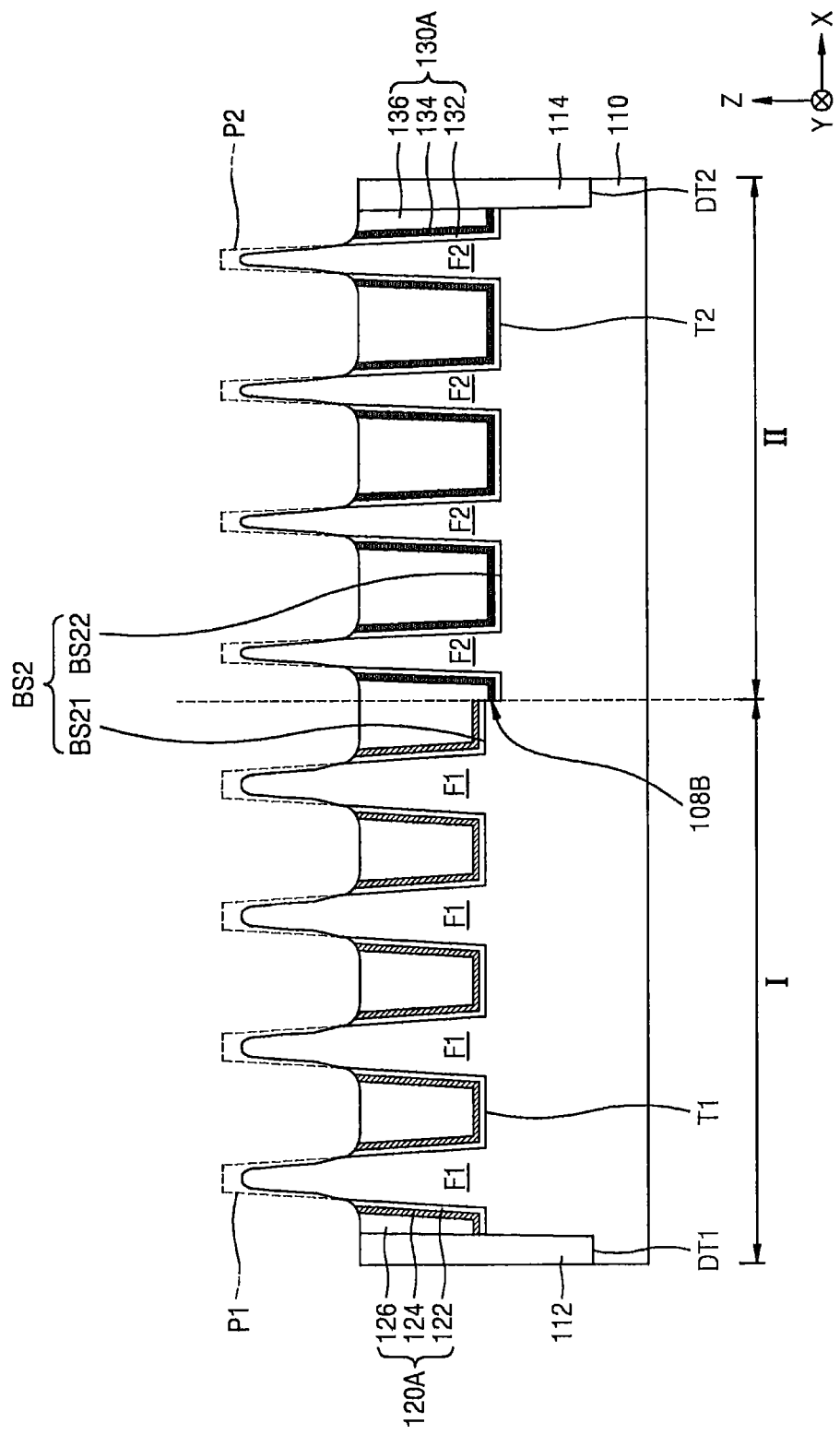

Referring to FIG. 16J, a recess process for removing the plurality of mask patterns 814 and the plurality of pad oxide layer patterns 812 (refer to FIG. 16H), portions of the first and second inter-device isolation insulating layers 112 and 114, and portions of the first and second device isolation layers 120A and 130A may be performed to expose a top surface and sidewalls of each of the plurality of first and second preliminary fin-type active regions P1 and P2.

As a result, heights of top surfaces of the first and second device isolation layers 120A and 130A may be reduced in the first region I and the second region II, and the first and second-fin-type active regions F1 and F2 may be obtained by using the plurality of first and second preliminary fin-type active regions P1 and P2.

In some embodiments, the recess process may be performed by using a dry etching process, a wet etching process, or a combination of dry and wet etching processes. During the performing of the recess process, an upper portion of each of the first and second preliminary fin-type active regions P1 and p2 exposed in the first region I and the second region II may be exposed to an etching atmosphere and/or a subsequent cleaning atmosphere. As a result, outer surfaces of the first and second preliminary fin-type active regions P1 and P2 may be partially consumed due to an etching process, an oxidation process, and/or a cleaning process. Thus, first and second-fin-type active regions F1 and F2 having reduced upper widths may be formed as shown in FIG. 16J.

In some embodiments, an ion implantation process for controlling a threshold voltage may be performed on an upper portion of each of the first and second-fin-type active regions F1 and F2 exposed in the first region I and the second region IL During the ion implantation process for controlling the threshold voltage, boron (B) ions may be implanted as impurity ions into one of the first region I and the second region II, in which an NMOS transistor is formed, while phosphorus (P) or arsenic (As) ions may be implanted as impurity ions into the other region of the first region I and the second region II in which a PMOS transistor is formed.

Figure 16K:
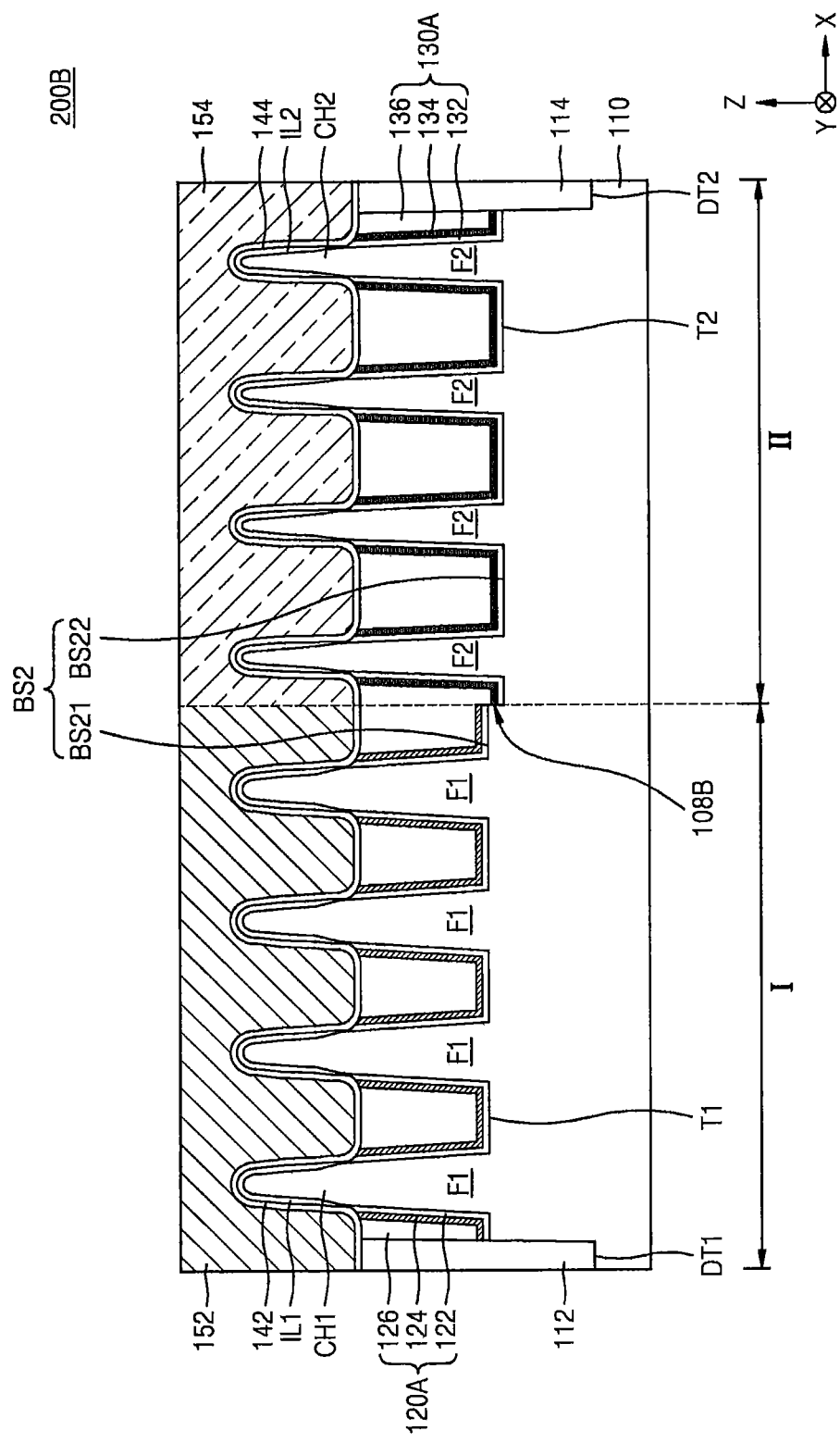

Referring to FIG. 16K, first and second interface layers IL1 and IL2 may be formed to extend on or cover surfaces of the first and second-fin-type active regions F1 and F2 exposed in the first region I and the second region II. A first gate insulating layer 142 and a first gate line 152 may be sequentially formed to extend on or cover each of the plurality of first-fin-type active regions F1 in the first region I. A second gate insulating layer 144, a second gate line 154, and first and second source and drain regions 162 and 164 (refer to FIG. 1A) may be sequentially formed to extend on or cover each of the plurality of second-fin-type active regions F2 exposed in the second region II. Thus, the IC device 200B shown in FIG. 4A may be manufactured.

In some embodiments, the first and second gate lines 152 and 154 may be formed by using an RPG process. Upper portions of the plurality of first and second-fin-type active regions F1 and F2 may be first and second-conductivity-type channel regions CH1 and CH2, respectively.

According to the method of manufacturing the IC device 200B described with reference to FIGS. 16A to 16K, an IC device in which the bottom surfaces BS1 of the substrate 110 are formed at different levels in the first and second regions I and II and fin-type active regions have different widths in the first and second regions I and II may be manufactured by using less difficult and/or less complex processes. Accordingly, multi-gate transistors having different functions may be formed in the first and second regions I and II. Also, a leakage current may be controlled in highly scaled FinFETs, and performances of the transistors may be improved.

Although a method of manufacturing the IC device 200B shown in FIG. 4A, according to an example embodiment, has been described with reference to FIGS. 16A to 16K, IC devices having various structures (e.g., the IC device 100A shown in FIGS. 1A and 1B, the IC devices 100B, 100C, and 100D shown in FIGS. 2A to 2C, the IC device 200A shown in FIG. 3, the IC device 200C shown in FIG. 4B, and the IC device 300 shown in FIGS. 5A and 5B) may be embodied by using various methods, which are modified and changed within the scope of the inventive concepts.

Figure 17:
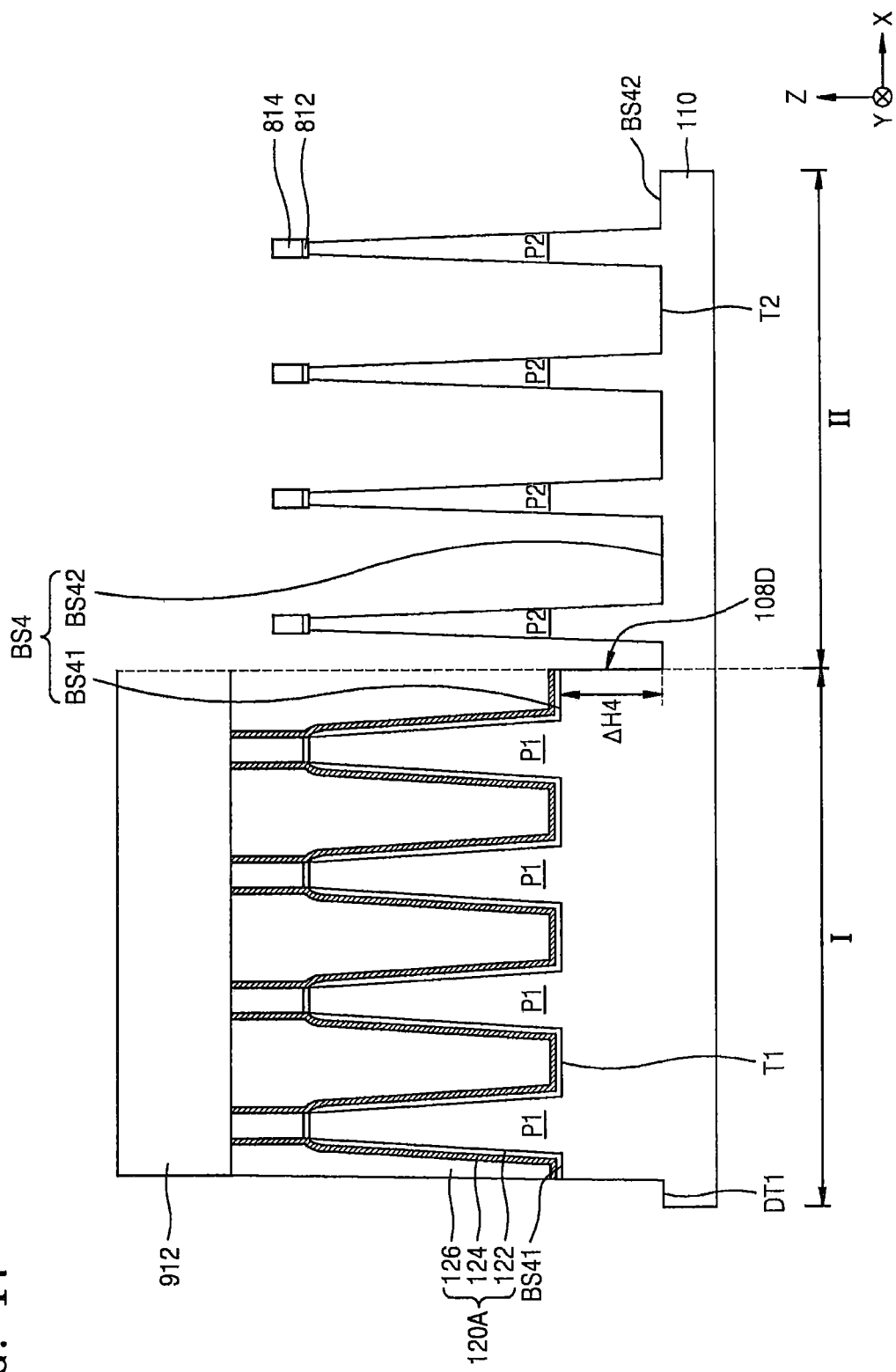
FIG. 17 is a cross-sectional view of a method of manufacturing an IC device according to other example embodiments.

FIG. 17 is a cross-sectional view of a method of manufacturing an IC device according to other example embodiments. A method of manufacturing the IC device 400 shown in FIG. 6, according to an example embodiment, will now be described with reference to FIG. 17. However, the present embodiment describes an example in which the IC device 400 includes the first and second device isolation layers 120A and 130A instead of the first and second device isolation layers 120 and 130 shown in FIG. 6. In FIG. 17, the same reference numerals are used to denote the same elements as in FIGS. 1A to 16K, and detailed descriptions thereof are omitted.

Referring to FIG. 17, after first and second device isolation layers 120A and 130A are formed as described with reference to FIGS. 16A to 16G, a first deep trench DT1 may be formed in a first region I in a similar manner to that described with reference to FIG. 16H.

However, in the present embodiment, a mask pattern 912 used as an etch mask for forming the first deep trench DT1 may be formed only in the first region I so that a partial region of the first region I is covered with the mask pattern 912 and the second region II is not covered with the mask pattern 912. Thus, during the formation of the first deep trench DT1 in the first region I, the second device isolation layer 130A and a portion of the substrate 110 disposed thereunder, which are exposed between the plurality of mask patterns 814, may be etched in the second region II. Thus, a second bottom unit BS42 having a bottom surface disposed at substantially the same level as a bottom surface of the first deep trench DT1 formed in the first region I may be formed.

During the formation of the first deep trench DT1 and the second bottom unit BS42, top surfaces of the plurality of mask patterns 814 may be partially consumed and the height of the plurality of mask patterns 814 may be reduced, and the width of the plurality of second preliminary fin-type active regions P2 may be reduced.

Although not shown in FIG. 17, in some embodiments, a mask pattern 912 covering the second device isolation layer 130A and the plurality of mask patterns 814 may be formed in a partial region of the second region II. Thus, a second deep trench DT2 may be formed as shown in FIG. 16H, and the second bottom unit BS22 (refer to FIG. 16H) and the second device isolation layer 130A formed on the second bottom unit BS22 may remain in the partial region of the second region II.

Thereafter, a second insulating liner 132 and a second stressor liner 134 may be sequentially formed again on the resultant structure of FIG. 17 in the same manner as described with reference to FIG. 16F. Afterwards, the mask pattern 912 may be removed, and the same processes as described with reference to FIGS. 16I to 16K may be performed. Thus, an IC device 400 having an inter-region stepped portion 108D may be manufactured as shown in FIG. 6. The inter-region stepped portion 108D may be formed due to a height difference ΔH4 between a first bottom unit BS41 formed in the first region I and a second bottom unit BS42 formed in the second region II.

Figure 18:
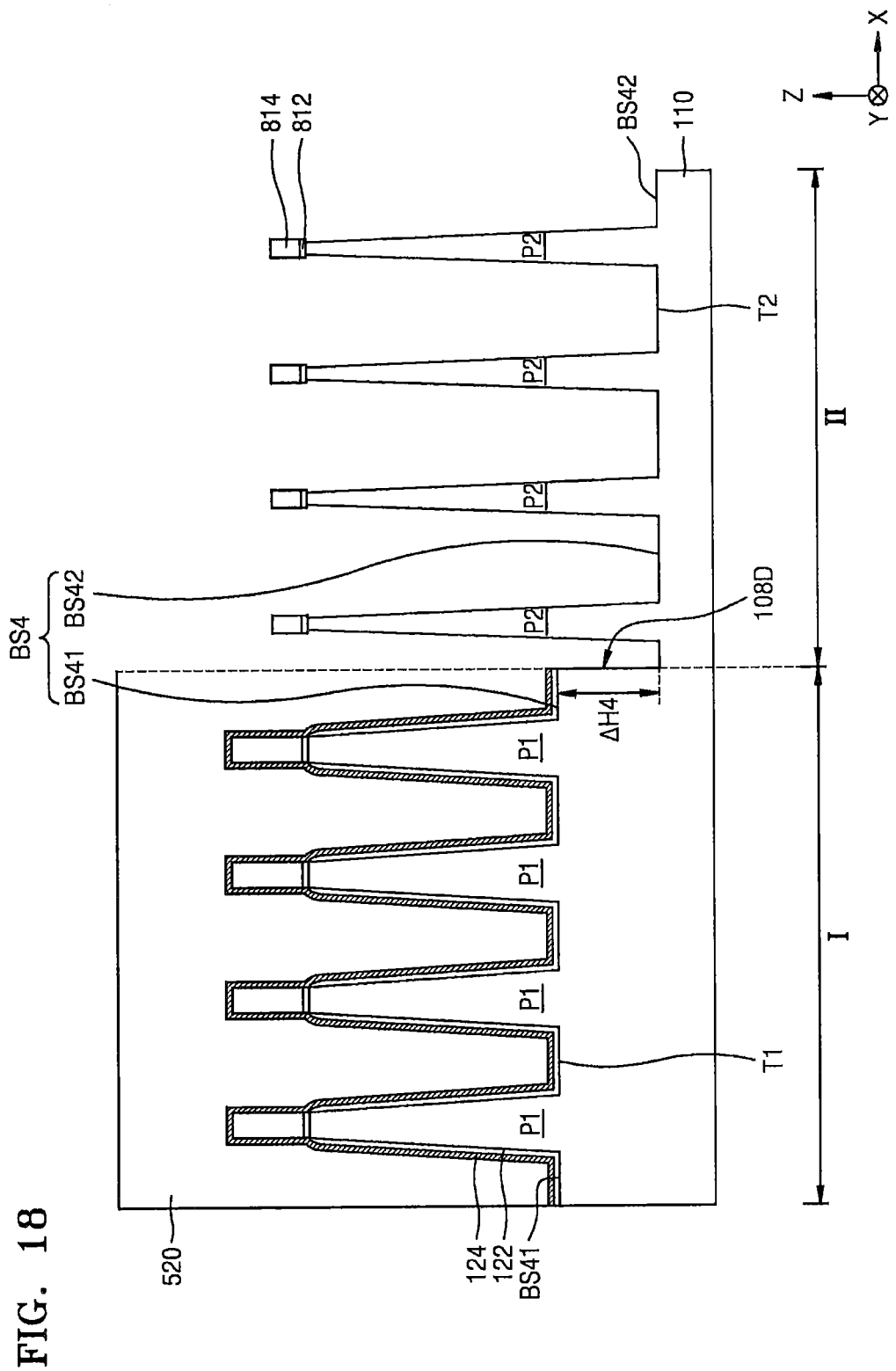
FIG. 18 is a cross-sectional view of a method of manufacturing an IC device according to other example embodiments.

FIG. 18 is a cross-sectional view of a method of manufacturing the IC device 400 shown in FIG. 6, according to another example embodiment. In FIG. 18, the same reference numerals are used to denote the same elements as in FIGS. 1A to 16K, and detailed descriptions thereof are omitted.

Referring to FIG. 18, a first stressor liner 124 may be formed on a first insulating liner 122 in a first region I and a second region II as described with reference to FIGS. 16A to 16D. Thereafter, a plurality of second preliminary fin-type active regions P2, which are exposed in the second region II, and a substrate 110 exposed by a bottom surface of a second trench T2, may be removed by as much as a predetermined thickness by using a mask pattern 520 as an etch mask in a similar manner to that described with reference to FIG. 16E. Thus, a width of the plurality of second preliminary fin-type active regions P2 in an X direction may be reduced, and a level of the bottom surface of the second trench T2 may be reduced. However, as compared with the case shown in FIG. 16E, in the present embodiment, an etched depth of the substrate 110 exposed by the bottom surface of the second trench T2 may be increased. Thus, an inter-region stepped portion 108D may be formed due to a height difference ΔH4 between a first bottom unit BS41 provided by the bottom surface of the first trench T1 and a second bottom unit BS42 provided by the bottom surface of the second trench T2.

Thereafter, the processes described with reference to FIGS. 16F to 16K may be performed. Thus, the IC device 400 having the inter-region stepped portion 108D may be manufactured as shown in FIG. 6. The inter-region stepped portion 108D may be formed due to the height difference ΔH4 between the first bottom unit BS41 disposed in the first region I and the second bottom unit BS42 disposed in the second region II.

Although methods of manufacturing IC devices according to example embodiments have been described, one of ordinary skill in the art will know that the IC devices 100A, 100B, 100C, 100D, 200A, 200B, 200C, 300, 400, 500A, 500B, 500C, 500D, 500E, 500F, 600, 700A, and 700B shown in FIGS. 1A to 15 and IC devices having various structures, which are changed and modified within the scope of the inventive concepts, may be manufactured by making various changes and modifications within the scope of the inventive concepts.

Although IC devices including FinFETs having three-dimensional (3D) channels and methods of manufacturing the IC devices have been described with reference to FIGS. 1A to 18, the inventive concepts are not limited thereto. For example, one of ordinary skill in the art will know that IC devices and methods of manufacturing the same including planar metal-oxide-semiconductor field effect transistors (MOSFETs) having characteristics according to the inventive concepts may be provided by making various changes and modifications within the scope of the inventive concepts.

Figure 19:
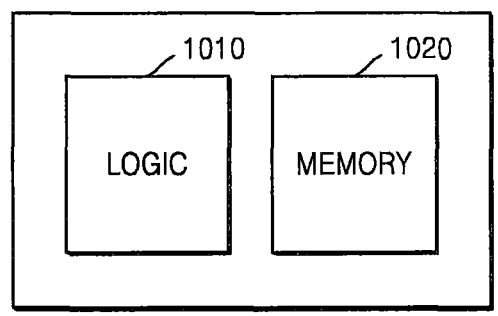
FIG. 19 is a block diagram of an electronic device according to example embodiments.

FIG. 19 is a block diagram of an electronic device 1000 according to example embodiments.

Referring to FIG. 19, the electronic device 1000 may include a logic region 1010 and a memory region 1020.

The logic region 1010 may include various kinds of logic cells including a plurality of circuit elements (e.g., a transistor and a register), which are cells (e.g., a counter and a buffer) configured to perform desired logical functions. The logic cells may define, for example, AND, NAND, OR, NOR, XOR (exclusive OR), XNOR (exclusive NOR), INV (inverter), ADD (adder), BUF (buffer), DLY (delay), FILL (filter), multiplexer (MXT/MXIT), OAI (OR/AND/INVERTER), AO (AND/OR), AOI (AND/OR/INVERTER), D flip-flop, a reset flip-flop, a master-slaver flip-flop, and a latch. However, logic cells according to an example embodiment are not limited to the above-described examples.

The memory region 1020 may include at least one of static random access memory (SRAM), dynamic RAM (DRAM), magnetic RAM (MRAM), resistive RAM (RRAM), and phase-change RAM (PRAM).

At least one region of the logic region 1010 and the memory region 1020 may include at least one of the IC devices 100A, 100B, 100C, 100D, 200A, 200B, 200C, 300, 400, 500A, 500B, 500C, 500D, 500E, 500F, 600, 700A, and 700B shown in FIGS. 1A to 15 and IC devices having various structures, which are changed and modified within the scope of the inventive concepts.

Figure 20:
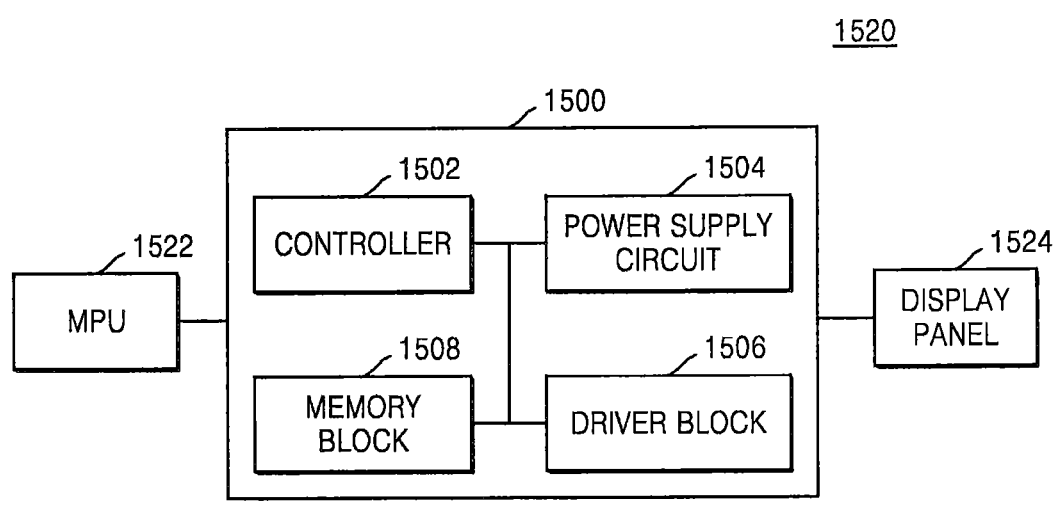
FIG. 20 is a schematic block diagram of a display driver integrated circuit (DDI) and a display device according to example embodiments.

FIG. 20 is a schematic block diagram of a display driver IC (DDI) 1500 and a display device 1520 including the DDI 1500 according to example embodiments.

Referring to FIG. 20, the DDI 1500 may include a controller 1502, a power supply circuit 1504, a driver block 1506, and a memory block 1508. The controller 1502 may receive a command from a main processing unit (MPU) 1522, decode the command, and control respective blocks of the DDI 1500 to embody an operation in response to the command. The power supply circuit 1504 may generate a driving voltage under the control of the controller 1502. The driver block 1506 may drive a display panel 1524 by using a driving voltage generated by the power supply circuit 1504 under the control of the controller 1502. The display panel 1524 may be a liquid crystal display (LCD) panel or a plasma display panel (PDP). The memory block 1508 may be a block configured to temporarily store commands input to the controller 1502 or control signals output by the controller 1502 or store required data. The memory block 1508 may include a memory, such as a random access memory (RAM) or a read-only memory (ROM). At least one of the power supply circuit 1504 and the driver block 1506 may include at least one of the IC devices 100A, 100B, 100C, 100D, 200A, 200B, 200C, 300, 400, 500A, 500B, 500C, 500D, 500E, 500F, 600, 700A, and 700B shown in FIGS. 1A to 15 and IC devices having various structures, which are changed and modified within the scope of the inventive concepts.

Figure 21:
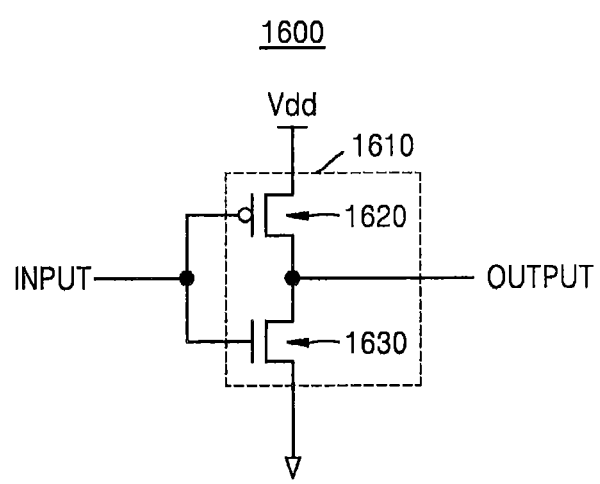
FIG. 21 is a circuit diagram of a complementary metal-oxide-semiconductor (CMOS) inverter according to example embodiments.

FIG. 21 is a circuit diagram of a CMOS inverter 1600 according to example embodiments.

The CMOS inverter 1600 may include a CMOS transistor 1610. The CMOS transistor 1610 may include a PMOS transistor 1620 and an NMOS transistor 1630 connected between a power supply terminal Vdd and a ground terminal. The CMOS transistor 1610 may include at least one of the IC devices 100A, 100B, 100C, 100D, 200A, 200B, 200C, 300, 400, 500A, 500B, 500C, 500D, 500E, 500F, 600, 700A, and 700B shown in FIGS. 1A to 15 and IC devices having various structures, which are changed and modified within the scope of the inventive concepts.

Figure 22:
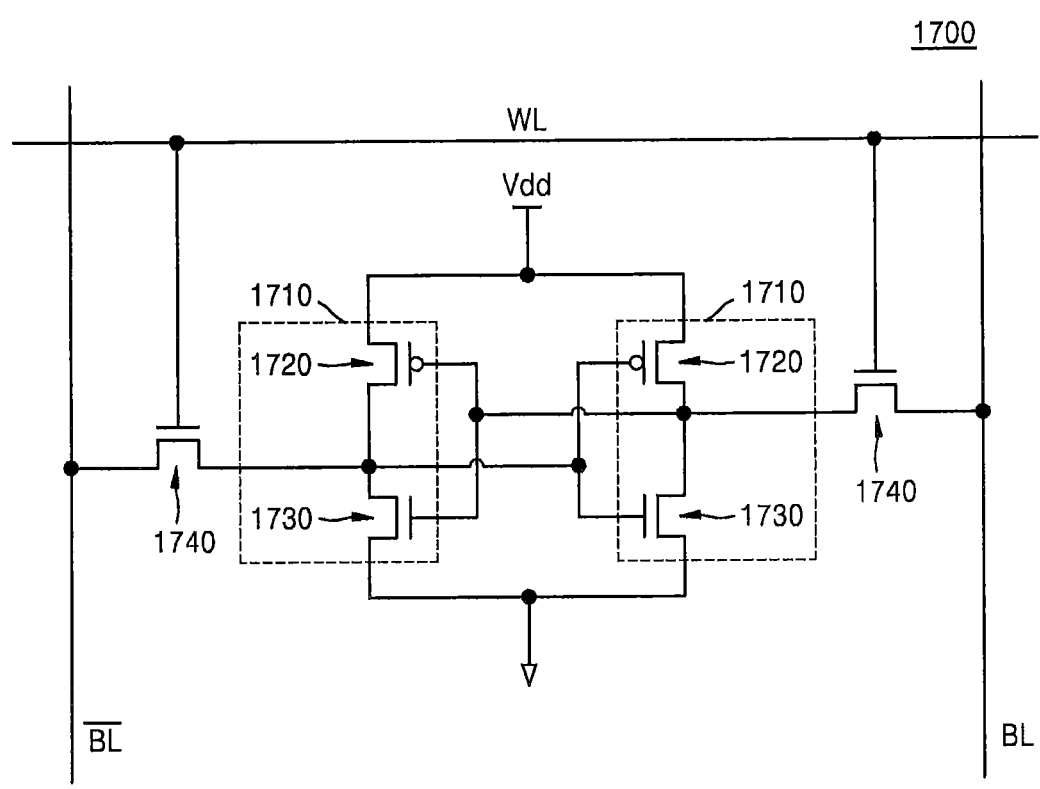
FIG. 22 is a circuit diagram of a CMOS static random access memory (SRAM) device according to example embodiments.

FIG. 22 is a circuit diagram of a CMOS SRAM device 1700 according to example embodiments.

The CMOS SRAM device 1700 may include one pair of driver transistors 1710. Each of the one pair of driver transistors 1710 may include a PMOS transistor 1720 and an NMOS transistor 1730 connected between a power supply terminal Vdd and a ground terminal. The CMOS SRAM device 1700 may further include one pair of transfer transistors 1740. A source of the transfer transistor 1740 may be cross-connected to a common node of the PMOS transistor 1720 and the NMOS transistor 1730, which may define the driver transistor 1710. The power supply terminal Vdd may be connected to a source of the PMOS transistor 1720, and the ground terminal may be connected to a source of the NMOS transistor 1730. A word line WL may be connected to gates of the one pair of transfer transistors 1740, and a bit line BL and an inverted bit line may be respectively connected to drains of the one pair of transfer transistors 1740.

At least one of the driver transistor 1710 and the transfer transistor 1740 of the CMOS SRAM device 1700 may include at least one of the IC devices 100A, 100B, 100C, 100D, 200A, 200B, 200C, 300, 400, 500A, 500B, 500C, 500D, 500E, 500F, 600, 700A, and 700B shown in FIGS. 1A to 15 and IC devices having various structures, which are changed and modified within the scope of the inventive concepts.

Figure 23:
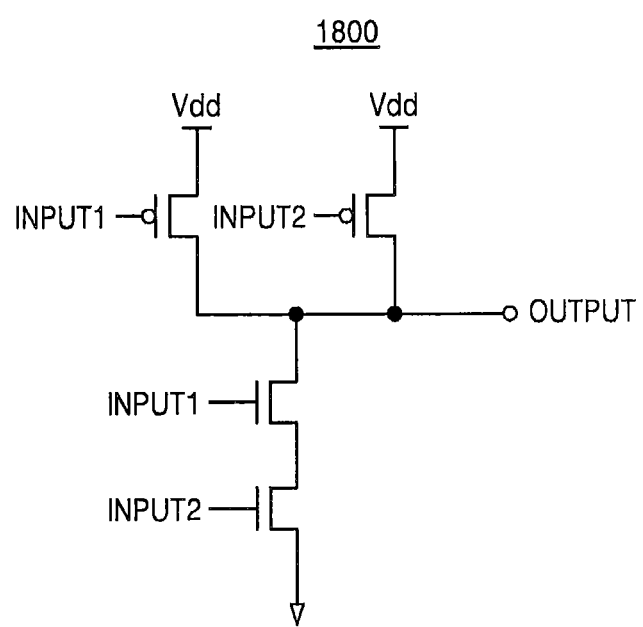
FIG. 23 is a circuit diagram of a CMOS NAND circuit according to example embodiments.

FIG. 23 is a circuit diagram of a CMOS NAND circuit 1800 according to example embodiments.

The CMOS NAND circuit 1800 may include one pair of CMOS transistors to which different input signals are transmitted. The CMOS NAND circuit 1800 may include at least one of the IC devices 100A, 100B, 100C, 100D, 200A, 200B, 200C, 300, 400, 500A, 500B, 500C, 500D, 500E, 500F, 600, 700A, and 700B shown in FIGS. 1A to 15 and IC devices having various structures, which are changed and modified within the scope of the inventive concepts.

Figure 24:
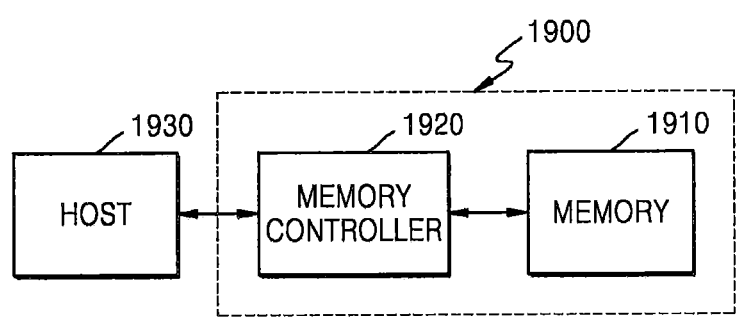
FIG. 24 is a block diagram of an electronic system according to example embodiments.

FIG. 24 is a block diagram of an electronic system 1900 according to example embodiments.

The electronic system 1900 may include a memory 1910 and a memory controller 1920. The memory controller 1920 may control the memory 1910 to read data from the memory 1910 and/or write data to the memory 1910 in response to a request from a host 1930. At least one of the memory 1910 and the memory controller 1920 may include at least one of the IC devices 100A, 100B, 100C, 100D, 200A, 200B, 200C, 300, 400, 500A, 500B, 500C, 500D, 500E, 500F, 600, 700A, and 700B shown in FIGS. 1A to 15 and IC devices having various structures, which are changed and modified within the scope of the inventive concepts.

Figure 25:
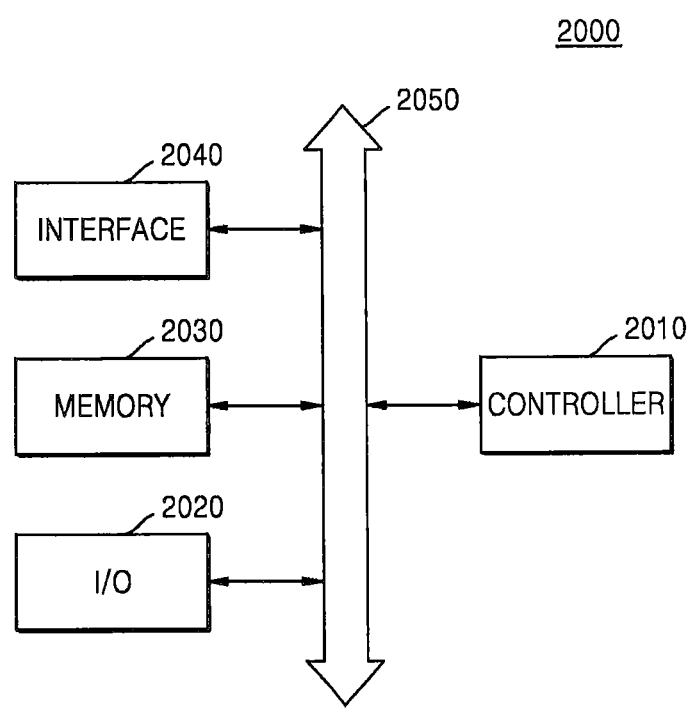
FIG. 25 is a block diagram of an electronic system according to example embodiments.

FIG. 25 is a block diagram of an electronic system 2000 according to example embodiments.

The electronic system 2000 may include a controller 2010, an input/output (I/O) device 2020, a memory 2030, and an interface 2040, which may be connected to one another by a bus 2050.

The controller 2010 may include at least one of a microprocessor (MP), a digital signal processor (DSP), and processors similar thereto. The I/O device 2020 may include at least one of a keypad, a keyboard, or a display. The memory 2030 may be used to store commands executed by the controller 2010. For example, the memory 2030 may be used to store user data.

The electronic system 2000 may be a wireless communication device or a device capable of transmitting and/or receiving information in wireless environments. The interface 2040 may include a wireless interface so that the electronic system 2000 may transmit or receive data through a wireless communication network. The interface 2040 may include an antenna and/or a wireless transceiver. In some example embodiments, the electronic system 2000 may be used for a communication interface protocol of a third-generation communication system, for example, code division multiple access (CDMA), global system for mobile communications (GSM), north American digital cellular (NADC), extended-time division multiple access (E-TDMA), and/or wide band code division multiple access (WCDMA). The electronic system 2000 may include at least one of the IC devices 100A, 100B, 100C, 100D, 200A, 200B, 200C, 300, 400, 500A, 500B, 500C, 500D, 500E, 500F, 600, 700A, and 700B shown in FIGS. 1A to 15 and IC devices having various structures, which are changed and modified within the scope of the inventive concepts.

While the inventive concepts has been particularly shown and described with reference to example embodiments thereof, it will be understood that various changes in form and details may be made therein without departing from the spirit and scope of the following claims.

What is claimed is:

1. An integrated circuit (IC) device comprising:
a first-fin-type active region protruding in a height direction from a substrate in a first region of the substrate, the first-fin-type active region having a first width in a first direction different from the height direction;
a second-fin-type active region protruding in the height direction from the substrate in a second region of the substrate, the second-fin-type active region having a second width in the first direction, wherein the second width is less than the first width; and
an inter-region stepped portion at an interface between the first region and the second region on a bottom surface, which is a portion of the substrate that continuously extends from the first-fin-type active region to the second-fin-type active region.

2. The IC device of claim 1, wherein the first-fin-type active region has a channel region of a different conductivity type from a channel region of the second-fin-type active region.

3. The IC device of claim 1, wherein the first region comprises an NMOS transistor region, and the second region comprises a PMOS transistor region.

4. The IC device of claim 1, wherein the inter-region stepped portion, the first-fin-type active region, and the second-fin-type active region extend parallel to one another.

5. The IC device of claim 1, wherein the bottom surface comprises a first bottom unit at a first level in the first region on the substrate and a second bottom unit at a second level in the second region on the substrate, wherein the second level is different from the first level, and
the inter-region stepped portion extends along an interface between the first bottom unit and the second bottom unit.

6. The IC device of claim 1, wherein a first distance from the inter-region stepped portion to the first-fin-type active region in the first direction is different from a second distance from the inter-region stepped portion to the second-fin-type active region in the first direction.

7. The IC device of claim 1, wherein the first region comprises an NMOS transistor region, and the second region comprises a PMOS transistor region, and
a first distance from the inter-region stepped portion to the first-fin-type active region in the first direction is greater than a second distance from the inter-region stepped portion to the second-fin-type active region.

8. The IC device of claim 1, wherein a lowest portion of the second-fin-type active region is located at a lower level than a lowest portion of the first-fin-type active region on the substrate.

9. An integrated circuit (IC) device comprising:
a substrate having a first region and a second region adjacent to each other;
a plurality of first-fin-type active regions protruding in a height direction from the substrate in the first region and extending parallel to one another;
a plurality of second-fin-type active regions protruding in the height direction from the substrate in the second region and extending parallel to one another, each second-fin-type active region having a smaller width than a width of any one of the plurality of first-fin-type active regions in a first direction that is different from the height direction; and
an inter-region isolation region having an inter-region stepped portion at an interface between the first region and the second region on a bottom surface of the substrate that continuously extends from the plurality of first-fin-type active regions to the plurality of second-fin-type active regions.

10. The IC device of claim 9, wherein the plurality of first-fin-type active regions and the plurality of second-fin-type active regions extend parallel to one another such that the inter-region stepped portion is between the plurality of first-fin-type active regions and the plurality of second-fin-type active regions, and
the plurality of first-fin-type active regions and the plurality of second-fin-type active regions are at a uniform pitch in the first direction.

11. The IC device of claim 9, wherein the plurality of first-fin-type active regions and the plurality of second-fin-type active regions extend parallel to one another such that the inter-region stepped portion is between the plurality of first-fin-type active regions and the plurality of second-fin-type active regions, and
a width of the inter-region isolation region is greater than a first space between adjacent ones of the plurality of first-fin-type active regions and greater than a second space between adjacent ones of the plurality of second-fin-type active regions in the first direction.

12. The IC device of claim 9, wherein a first distance from the inter-region stepped portion to the plurality of first-fin-type active regions is greater than a second distance from the inter-region stepped portion to the plurality of second-fin-type active regions.

13. An integrated circuit (IC) device comprising:
first and second fin-type active regions protruding from adjacent first and second surfaces of a substrate, respectively, wherein the first and second fin-type active regions differ in width;
a first stressor liner on the first fin-type active region that imparts a tensile stress thereon; and
a second stressor liner on the second fin-type active region that imparts a compressive stress thereon,
wherein the first and second surfaces of the substrate are non-coplanar and define an inter-region stepped portion in the substrate at an interface between the first surface and the second surface, and wherein an interface between the first and second stressor liners is aligned with the inter-region stepped portion in the substrate.

14. The device of claim 13, wherein the inter-region stepped portion in the substrate extends between the first and second fin-type active regions, and wherein the second fin-type active region is closer to the inter-region stepped portion than the first fin-type active region.

15. The device of claim 14, wherein the first and second fin-type active regions comprise different conductivity types and/or different materials.

16. The device of claim 15, further comprising first and second buried insulating layers on the first and second stressor liners, respectively, wherein an interface between the first and second buried insulating layers is aligned with the inter-region stepped portion in the substrate.

17. The device of claim 16, wherein the first and second fin-type active regions extend parallel to the inter-region stepped portion, and further comprising:
a first gate line structure on the first fin-type active region; and a second gate line structure different from the first gate line structure on the second fin-type active region, wherein an interface between the first and second gate line structures is aligned with the inter-region stepped portion of the substrate.

18. The device of claim 16, wherein the first and second fin-type active regions extend perpendicular to the inter-region stepped portion and further comprising:

a first gate line structure on the first fin-type active region extending parallel to the inter-region stepped portion; and a second gate line structure different from the first gate line structure on the second fin-type active region extending parallel to the inter-region stepped portion, wherein the inter-region stepped portion extends between the first and second gate line structures.

19. The device of claim 16, wherein:

the first fin-type active region is one of a plurality of first fin-type active regions protruding from and extending in parallel along the first surface of the substrate;

the second fin-type active region is one of a plurality of second fin-type active regions protruding from and extending in parallel along the second surface of the substrate;

and further comprising:

a fin isolation region extending on the first and second surfaces of the substrate across the inter-region stepped portion and intersecting the plurality of first and second fin-type active regions.

* * * * *